United States Patent
Higashi et al.

(10) Patent No.: US 8,900,953 B2
(45) Date of Patent: Dec. 2, 2014

(54) CRYSTAL MANUFACTURING APPARATUS, SEMICONDUCTOR DEVICE MANUFACTURED USING THE SAME, AND METHOD OF MANUFACTURING SEMICONDUCTOR DEVICE USING THE SAME

(75) Inventors: Seiichiro Higashi, Higashihiroshima (JP); Naohiro Koba, Higashihiroshima (JP)

(73) Assignee: Hiroshima University, Hiroshima (JP)

( * ) Notice: Subject to any disclaimer, the term of this patent is extended or adjusted under 35 U.S.C. 154(b) by 587 days.

(21) Appl. No.: 13/061,221

(22) PCT Filed: Aug. 28, 2009

(86) PCT No.: PCT/JP2009/004209
§ 371 (c)(1),
(2), (4) Date: Feb. 28, 2011

(87) PCT Pub. No.: WO2010/023937
PCT Pub. Date: Mar. 4, 2010

(65) Prior Publication Data
US 2011/0156045 A1    Jun. 30, 2011

(30) Foreign Application Priority Data

Sep. 1, 2008 (JP) .................................. 2008-223419
Mar. 3, 2009 (JP) .................................. 2009-049616

(51) Int. Cl.
*H01L 21/336* (2006.01)
(Continued)

(52) U.S. Cl.
CPC ...... *H01L 31/1892* (2013.01); *H01L 21/67248* (2013.01); *H01L 31/1804* (2013.01);
(Continued)

(58) Field of Classification Search
USPC ................. 438/149, 293, 486, 488, 674; 257/E21.09, E21.91, E21.92, E21.93, 257/E21.114
See application file for complete search history.

(56) References Cited

U.S. PATENT DOCUMENTS 6,235,109 B1    5/2001 Okutani et al.
(Continued)

FOREIGN PATENT DOCUMENTS

CN    1890787 A    1/2007
(Continued)

OTHER PUBLICATIONS

Tatsuya Okada et al., "Analysis of Transient Temperature Profile During Thermal Plasma Jet Annealing of Si Films on Quartz Substrate," The Japan Society of Applied Physics, vol. 45, No. 5B, 2006, pp. 4355-4357.

(Continued)

*Primary Examiner* — Matthew E Warren
(74) *Attorney, Agent, or Firm* — Lowe Hauptman & Ham, LLP

(57) ABSTRACT

A crystal manufacturing apparatus capable of manufacturing a crystal in a desired position on a substrate is provided. A spring has one end fixed to a mount and the other end coupled to a magnetic body. The magnetic body has one end coupled to the spring and the other end coupled to a piston. A coil is wound around the magnetic body and electrically connected between a power supply circuit and a ground node (GND). The piston has a linear member inserted in a cylinder. The cylinder has a hollow columnar shape and a small hole at a bottom surface. The cylinder holds a silicon melt. A substrate is supported by an XY stage to be opposed to the small hole of the cylinder. The power supply circuit passes pulse shaped current through the coil to move the piston in an up-down direction (DR1). As a result, a droplet is discharged toward the substrate from the small hole at an initial speed of 1.02 m/s.

2 Claims, 33 Drawing Sheets

(51) Int. Cl.
*H01L 21/67* (2006.01)
*H01L 31/18* (2006.01)
*H01L 29/786* (2006.01)
*C30B 35/00* (2006.01)
*H01L 27/12* (2006.01)
*C30B 28/06* (2006.01)
*C30B 29/06* (2006.01)
*C01B 33/02* (2006.01)
*H01L 21/02* (2006.01)

(52) U.S. Cl.
CPC ......... *H01L 29/78603* (2013.01); *Y02E 10/547* (2013.01); *H01L 21/02422* (2013.01); *C30B 35/00* (2013.01); *H01L 27/1214* (2013.01); *C30B 28/06* (2013.01); *C30B 29/06* (2013.01); *H01L 21/6715* (2013.01); *H01L 29/78636* (2013.01); *H01L 21/02667* (2013.01); *H01L 21/02532* (2013.01); *H01L 21/02625* (2013.01); *C01B 33/02* (2013.01)
USPC ...... 438/293; 438/286; 438/674; 257/E21.09; 257/E21.094

(56) References Cited

U.S. PATENT DOCUMENTS

| | | |
|---|---|---|
| 2007/0019032 A1* | 1/2007 | Maekawa et al. .............. 347/45 |
| 2007/0085112 A1 | 4/2007 | Yamazaki et al. |
| 2009/0179230 A1* | 7/2009 | Yamamoto et al. ........... 257/213 |
| 2010/0086006 A1 | 4/2010 | Higashi |
| 2012/0282717 A1* | 11/2012 | Yamazaki et al. .............. 438/29 |

FOREIGN PATENT DOCUMENTS

| | | |
|---|---|---|
| JP | 02-185022 | 7/1990 |
| JP | 07033584 | 2/1995 |
| JP | 10-060617 | 3/1998 |
| JP | 11-260740 | 9/1999 |
| JP | 2001089292 | 4/2001 |
| JP | 2001179167 | 7/2001 |
| JP | 2002-348194 | 12/2002 |
| JP | 2005-154249 | 6/2005 |
| JP | 2005-179109 | 7/2005 |
| JP | 2006060086 A | 3/2006 |
| JP | 2007-073868 | 3/2007 |
| JP | 2007142451 | 6/2007 |
| JP | 2007-261859 | 10/2007 |
| JP | 2008-050256 | 3/2008 |
| JP | 2008-127248 | 6/2008 |
| WO | 2006123403 A1 | 11/2006 |
| WO | 2007004644 A1 | 1/2007 |

OTHER PUBLICATIONS

ISR for PCT/JP2009/004209 dated Dec. 1, 2009.
Office Action for corresponding Chinese Patent Application No. 200980134165.5 issued on Mar. 19, 2013.

* cited by examiner (a)

(b)

(c)

(d)

(e)

(a)

(b)

(c)

CRYSTAL MANUFACTURING APPARATUS, SEMICONDUCTOR DEVICE MANUFACTURED USING THE SAME, AND METHOD OF MANUFACTURING SEMICONDUCTOR DEVICE USING THE SAME

RELATED APPLICATIONS

The present application is national phase of PCT/JP2009/004209 filed Aug. 28, 2009, and claims priority from Japanese Application Number 2008-223419 filed Sep. 1, 2008 and Japanese Application Number 2009-049616 filed Mar. 3, 2009.

TECHNICAL FIELD

The present invention relates to a crystal manufacturing apparatus, a semiconductor device manufactured using the same, and a method of manufacturing a semiconductor device using the same. The invention relates more specifically to a crystal manufacturing apparatus that manufactures crystalline semiconductor using a melt of a constituent element of the semiconductor, a semiconductor device manufactured using the same, and a method of manufacturing a semiconductor device using the same.

BACKGROUND ART

There is a known method of manufacturing a crystal material by allowing a part of a melt of a metal containing material to fall freely (which refers to a fall from an initial speed of zero) through a small hole provided at a bottom of a container and letting a droplet impinge upon a cooling member, thereby solidifying the crystal material (Patent Document 1).

In this case, examples of the metal containing material include a metal such as titanium and iron, an alloy such as titanium-nickel, copper-aluminum, and copper-indium, a semiconductor such as germanium, silicon, indium-antimony, iron-silicon, and copper-indium-selenium, and a ceramic such as an alumina-garnet composite material.

Examples of the cooling material include a metal such as copper and iron and a ceramic such as glass and aluminum nitride.

The diameter of a droplet is in the range from 0.1 mm to 50 mm, preferably from 2 mm to 10 mm.

The distance for free fall is set to such a distance that a droplet is not solidified until it impinges upon the cooling member and about 1 to 50000 times as large as the length of the droplet (diameter) in the vertical direction.

In a conventional method of manufacturing a crystal material, a quartz glass plate is placed in a position 6.5 m vertically below a small hole used to let a droplet to fall freely and a droplet is allowed to fall freely through the small hole, so that a crystal is produced on the quartz glass plate.

Patent Document 1: JP 2001-89292 A
Non-Patent Document: T. Okada, S. Higashi, H. Kaku, H. Murakami, and S. Miyazaki: "Analysis of Transient Temperature Profile During Thermal Plasma Jet Annealing of Si Films on Quartz Substrate," Jpn. J. Appl. Phys. 45 (2006) pp. 4355-4357.

DISCLOSURE OF THE INVENTION

In the conventional method of manufacturing a crystal material, however, a droplet is allowed to fall freely from an initial speed of zero, which makes it difficult to manufacture a crystal in a desired position on a substrate.

In the conventional method of manufacturing a crystal material, the relation between the amount of a droplet and the temperature of a cooling member when the droplet impinges upon the cooling member is not taken into account, and therefore, the cooling member could melt depending on the amount of a droplet to fall freely.

Therefore, the present invention is directed to a solution to the above-described problems, and it is an object of the present invention to provide a crystal manufacturing apparatus capable of manufacturing a crystal in a desired position on a substrate.

Another object of the present invention is to provide a crystal manufacturing apparatus used to manufacture a crystal on a substrate while preventing the substrate from melting.

Yet another object of the present invention is to provide a method of manufacturing a semiconductor device with a reduced number of steps by producing a crystal in a desired position.

A still further object of the present invention is to provide a semiconductor device manufactured by a crystal manufacturing apparatus that manufactures a crystal on a substrate while preventing the substrate from melting.

According to the present invention, a crystal manufacturing apparatus includes a substrate, a melt holder, and a discharge unit. The melt holder has a discharge outlet provided opposed to the substrate and holds a melt including a constituent element of semiconductor. The discharge unit is arranged to discharge a droplet including the constituent element of semiconductor from the discharge outlet of the melt holder to the substrate at a desired initial speed.

The crystal manufacturing apparatus preferably further includes a temperature detector and a controller. The temperature detector detects the temperature of the substrate when the droplet arrives at the substrate. The controller controls the amount of the droplet and/or the initial speed so that the temperature detected by the temperature detector is lower than the melting point of the substrate.

The temperature detector preferably includes a light intensity measuring unit, an operation unit, and a temperature output unit. The light intensity measuring unit irradiates the substrate with a laser beam and measures a first light intensity characteristics that represents a relation between a light intensity of reflected light attributable to interference of the laser beam and time. The operating unit calculates a second light intensity characteristics that represents a relation between the light intensity and time at a virtual substrate when a thermal load equal to that applied to the substrate is applied and is the closest to the first light intensity characteristics based on externally input data and outputs a reproduced substrate in which temperature change with time in the virtual substrate having the calculated second light intensity characteristics is reproduced. The temperature output unit outputs a temperature of the reproduced substrate output from the operation unit at each time as a temperature of the substrate.

The discharge outlet is preferably arranged along an arbitrary side of the substrate in a square shape and includes a plurality of micropores used to discharge a droplet.

The crystal manufacturing apparatus preferably further includes a moving unit. The moving unit moves the substrate in a direction approximately orthogonal to a direction in which the plurality of micropores are arranged.

The melt and the droplet are each made of one of a silicon melt, a silicon germanium melt, and a germanium melt.

According to the present invention, a method of manufacturing a semiconductor device includes a first step of producing an underlying layer including one of a semiconductor layer formed on a substrate including one of a hetero-substrate of a material different from semiconductor and a semiconductor substrate, an insulating layer formed on the substrate, and a semiconductor layer and an insulating layer formed on the substrate, a second step of producing a crystalline semiconductor layer by discharging a droplet of a constituent element of the semiconductor to a desired position on the substrate at a desired initial speed, and a third step of manufacturing a semiconductor device using the produced crystalline semiconductor layer and/or the underlying layer.

The first step preferably includes a first sub step of producing a gate electrode on the substrate, a second sub step of producing an insulating layer on the gate electrode, and a third sub step of producing first and second semiconductor regions including a dopant on the insulating layer. In the second step, the crystalline semiconductor layer is provided by discharging the droplet to be positioned in contact with the first and second semiconductor regions and on the gate electrode.

The first step preferably includes a first sub step of producing an amorphous layer on the substrate, and a second sub step of producing an insulating layer on the amorphous layer. In the second step, the crystalline semiconductor layer is produced by discharging the droplet on the insulating layer thereby crystallizing the amorphous layer.

The second step preferably includes a first sub step of producing a first crystal grain by discharging the droplet on the underlying layer including a holding substrate and a delamination layer formed on the holding substrate, a second sub step of producing a second crystal grain by discharging the droplet on the underlying layer so that the droplet is in contact with the already produced crystal grain in an in-plane direction of the holding substrate, and a third sub step of repeatedly carrying out the second sub step until the crystalline semiconductor layer having a desired area is produced on the underlying layer.

Furthermore, according to the present invention, a semiconductor device includes a hetero-substrate, a semiconductor layer, an oxide layer, and an electrode. The hetero-substrate includes a material different from semiconductor. The semiconductor layer is formed in contact with the hetero-substrate and in a crystal phase. The oxide film is formed in contact with and on the semiconductor layer. The electrode is formed in contact with and on the oxide film. The semiconductor layer includes a first region, a second region, and a channel region. The first region has first type conductivity. The second region is formed in a position apart from the first region in an in-plane direction of the hetero-substrate and has the first type conductivity. The channel region is provided between the first and second regions in the in-plane direction of the hetero-substrate and in contact with the first and second regions and the oxide film.

The hetero-substrate is preferably made of thermoplastic resin, and the semiconductor layer is embedded in the hetero-substrate.

The semiconductor layer is preferably in a single crystalline phase oriented in one direction.

Furthermore, a semiconductor device includes a hetero-substrate, a semiconductor layer, and first and second electrodes. The hetero-substrate includes a material different from semiconductor. The semiconductor layer is provided on the hetero-substrate and in a crystal phase. The first electrode is formed in contact with a surface of the semiconductor layer on the hetero-substrate side. The second electrode is formed in contact with a surface of the semiconductor layer opposite to the surface on the hetero-substrate side and includes a plurality of linear metals arranged at an arbitrary interval in an in-plane direction of the hetero-substrate. The semiconductor layer has a p-n junction in a direction orthogonal to the hetero-substrate and has a pyramid structure projecting toward the second electrode from the first electrode on the surface of the semiconductor layer opposite to the hetero-substrate side surface.

The semiconductor layer preferably includes one of polysilicon, single crystalline silicon, polysilicon germanium, single crystalline silicon germanium, polycrystalline germanium, and single crystalline germanium.

Furthermore, according to the present invention, a method of manufacturing a semiconductor device includes a first step of terminating a surface of a single crystalline semiconductor substrate with hydrogen, a second step of producing a crystalline semiconductor layer by discharging a droplet of a constituent element of the semiconductor in a desired position on the surface terminated with hydrogen on the semiconductor substrate at a desired initial speed, a third step of removing the crystalline semiconductor layer from the semiconductor substrate, and a fourth step of manufacturing a semiconductor device by fixing the removed crystalline semiconductor layer at a hetero-substrate different from the semiconductor.

The fourth step preferably includes a first sub step of fixing the removed crystalline semiconductor layer to the hetero-substrate, a second sub step of forming first and second semiconductor regions having a different type of conductivity from that of the crystalline semiconductor layer in a first region on one end side of the crystalline semiconductor layer and a second region on another end side of the crystalline semiconductor layer in an in-plane direction of the hetero-substrate, a third sub step of forming an oxide film in contact with a region of the crystalline semiconductor layer other than the first and second semiconductor regions, and a fourth sub step of forming an electrode in contact with the oxide film.

In the first sub step, the crystalline semiconductor layer is preferably embedded in the hetero-substrate including thermoplastic resin.

The first step preferably includes a first sub step of forming a plurality of holes having an approximate pyramid structure that projects in a thickness-wise direction of the semiconductor substrate at one main surface of the semiconductor substrate, and a second sub step of terminating said one main surface of the semiconductor substrate having the plurality of holes with hydrogen. The fourth step includes a sub step of forming a p-n junction in a thickness-wise direction of the removed crystalline semiconductor layer, a sub step of forming a first electrode including a plurality of linear metals arranged at an arbitrary interval in an in-plane direction of the crystalline semiconductor layer on one surface of the crystalline semiconductor layer having the pyramid structure thereon, a sub step of forming a second electrode on the other surface opposite to said one surface of the crystalline semiconductor layer, and a sub step of fixing the crystalline semiconductor layer to the hetero-substrate.

In the sub step of fixing, the crystalline semiconductor layer is adhered to the hetero-substrate.

According to the present invention, a melt of a constituent element of semiconductor is discharged as a droplet toward a substrate at a desired initial speed, the droplet starts to be solidified upon arriving at the substrate, and crystalline semiconductor is produced on the substrate. As a result, the droplet flies more easily toward the substrate than when it is allowed to fall freely. As the droplet is reduced in size, it becomes more difficult to discharge the droplet in a desired direction because of air pressure, so that the precision of the arriving position can be improved if the droplet is given an initial speed. In addition, the thickness of the film after arriving and being solidified can be controlled based on the initial speed. In this case, as the initial speed is faster, the film thickness is reduced, so that the cooling speed can be raised.

Therefore, according to the invention, crystal can be produced in a desired position on the substrate.

Also according to the present invention, the amount of a droplet is controlled so that the temperature of the droplet upon arriving at the substrate is lower than the melting point of the substrate.

Therefore, according to the present invention, crystal can be produced on a substrate while preventing the substrate from melting.

In addition, according to the present invention, a droplet is discharged at a desired initial speed to an underlying layer including one of a semiconductor layer formed on a substrate including one of a hetero-substrate made of a material different from semiconductor and a semiconductor substrate, an insulating layer formed on a substrate, and a semiconductor layer/an insulating layer formed on a substrate, and using the produced crystalline semiconductor layer and/or the underlying layer, a semiconductor device is manufactured. As a result, a crystalline silicon layer that is otherwise produced by a conventional patterning technique can be produced by discharging a droplet, and a semiconductor device is manufactured using the crystalline silicon layer produced by the discharged droplet.

Therefore, according to the present invention, a semiconductor device can be manufactured by a reduced number of steps.

BEST MODE FOR CARRYING OUT THE INVENTION

Figure 1:
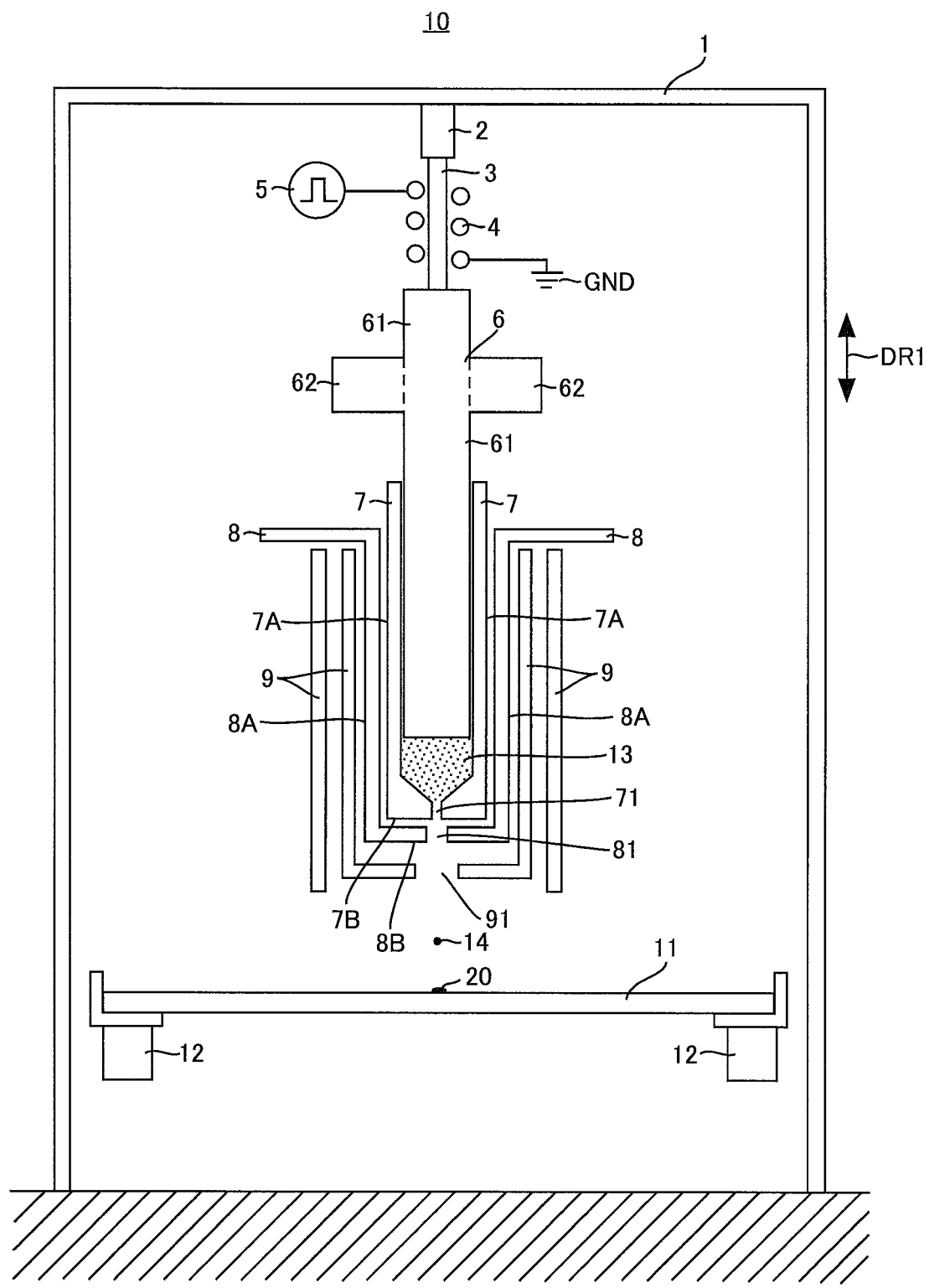
FIG. 1 is a schematic view of a crystal manufacturing apparatus according to an embodiment of the present invention.

An embodiment of the present invention will be described in conjunction with the accompanying drawings in which the same or corresponding portions are designated by the same reference characters and their description will not be repeated.

FIG. 1 is a schematic view of a crystal manufacturing apparatus according to an embodiment of the present invention. Referring to FIG. 1, the crystal manufacturing apparatus 10 according to the embodiment includes a mount 1, a spring 2, a magnetic body 3, a coil 4, a power supply circuit 5, a piston 6, a cylinder 7, a heater 8, reflector 9, a substrate 11, and an XY stage 12.

The spring 2 has one end fixed to the mount 1 and the other end connected to one end of the magnetic body 3.

The magnetic body 3 has one end connected to the spring 2 and the other end coupled to one end of the piston 6. The coil 4 is wound around the magnetic body 3 and electrically connected between the power supply circuit 5 and a ground node GND.

The piston 6 is made of boron nitride (BN) and includes a straight member 61 and a stop member 62. The straight member 61 is columnar shaped and has a diameter of 1.5 mm φ and a length of 145 mm. The stop member 62 is provided at a position 40 mm apart from where the magnetic body 3 and the piston 6 are coupled. The straight member 61 has one end coupled to the magnetic body 3 and the other end side inserted in the cylinder 7.

The cylinder 7 is made of BN and has a hollow columnar shape. The cylinder 7 is fixed to the mount 1 by a support member (not shown). The cylinder 7 has an inner diameter of 1.6 mm and an outer diameter of 6.0 mm. The cylinder 7 has a small hole 71 at its bottom surface 7B. The diameter of the small hole 71 is for example 100 μm φ.

The heater 8 is fixed to the mount 1 by a support member (not shown). The heater 8 has an inner diameter of 7 mm φ and is provided along a side surface 7A and the bottom surface 7B of the cylinder 7. The heater 8 has a gap 81 at a bottom surface 8B.

The reflector 9 is provided along a side surface 8A and the bottom surface 8B of the heater 8. The reflector 9 has a gap 91 at a part opposed to the bottom surface 8B of the heater 8.

The substrate 11 is placed on the XY stage 12 and provided opposed to the reflector 9 in a position 30 mm apart from the reflector 9.

The XY stage 12 is fixed to the mount 1 by a support member (not shown) and supports the substrate 11.

The spring 2 expands/shrinks as the magnetic body 3 moves in the vertical direction DR1. The magnetic body 3 moves in the vertical direction DR1 as current is passed through the coil 4. The coil 4 is used to pass current between the power supply circuit 5 and the ground node GND.

The power supply circuit 5 passes current through the coil 4. The piston 6 moves up and down as the magnetic body 3 moves up and down and applies pressure upon a silicon melt 13 held in the lower part in the cylinder 7. The piston 6 lets a part of the silicon melt 13 to be discharged in the form of droplet 14 at an initial speed $v_0$ through the small hole 71. In this case, the initial speed $v_0$ is for example 1.02 m/s or 1.03 m/s and set in the range from 0.2 m/s to 2 m/s according to the embodiment.

The cylinder 7 holds the silicon melt 13. The heater 8 heats the cylinder 7 to 1580° C. and a small piece of silicon is melted into the silicon melt 13. The reflector 9 reflects heat from the heater 8 toward the cylinder 7.

The XY stage 12 moves the substrate 11 in a plane of the substrate 11.

Note that the region between the reflector 9 and the substrate 11 is filled with an inert gas such as argon (Ar) gas.

Figure 2:
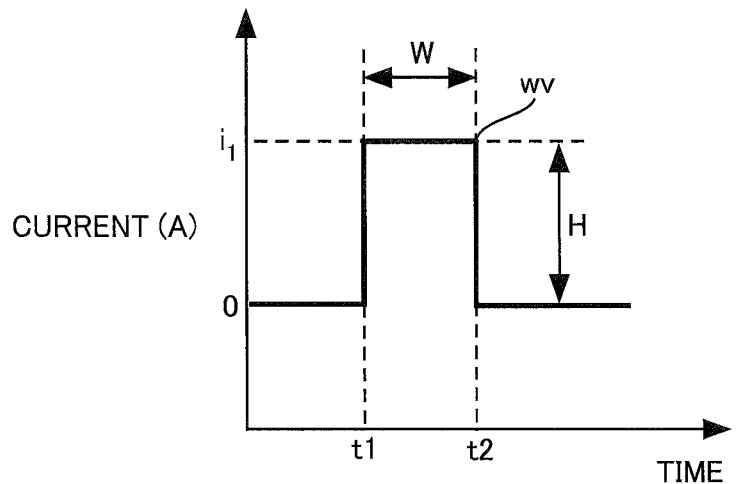
FIG. 2 is a waveform chart of current passed through a coil shown in FIG. 1.

FIG. 2 is a waveform chart of current passed through the coil 4 shown in FIG. 1. Referring to FIG. 2, current i passed through the coil 4 has a pulse waveform wv. The pulse waveform wv has a width W and a height H. The width W is in the order of m seconds. The height H is equal to the current value of the current i1. The current value of the current i1 is for example 1.37 A.

The magnetic body 3 is set to protrude 2 mm above the coil 4 and balances with the spring 2 in the position. When the pulse waveform wv (24V, 1.37 A) is applied to the coil 4 in timing t1, the current i1 is made to flow from the power supply circuit 5 to the ground node GND during the period from timing t1 to t2. As a result, the magnetic body 3 receives downward force (in the direction from the spring 2 to the piston 6) and is drawn downward. Then, the piston 6 moves downward with the movement of the magnetic body 3.

When application of the pulse waveform wv to the coil 4 ends, the regaining force of the spring 2 moves the magnetic body 3 upward (in the direction from the piston 6 to the spring 2) and put the magnetic body 3 back to an equilibrium state.

In this case, the difference between the uppermost position and the lowermost position for the moving piston 6 is several ten μm.

In this way, as the current i in the waveform wv is passed through the coil 4, the piston 6 moves several ten μm downward in timing t1 and then several ten μm upward in timing t2.

Then, since the piston 6 presses the silicon melt 13 by prescribed pressure as it moves downward, a part of the silicon melt 13 is discharged through the small hole 71 in the form of a droplet 14 at the initial speed $v_0$.

As described above, the distance between the reflector 9 and the substrate 11 is 30 mm and therefore when the droplet 14 is discharged at the initial speed $v_0$ (1.02 m/s), it takes about 26 msec for the droplet 14 to arrive at the substrate 11.

On the other hand, when a droplet 14 is allowed to fall freely from the through hole 71, it takes about 78 msec for the droplet 14 to arrive at the substrate 11.

In this way, according to the present invention, since the pressure is applied on the silicon melt 13 by the piston 6 and the droplet 14 is discharged at the initial speed $v_0$, so that time required for the droplet to reach the substrate 11 can be reduced to about one third as compared to the case of letting the droplet to fall freely.

Figure 3:
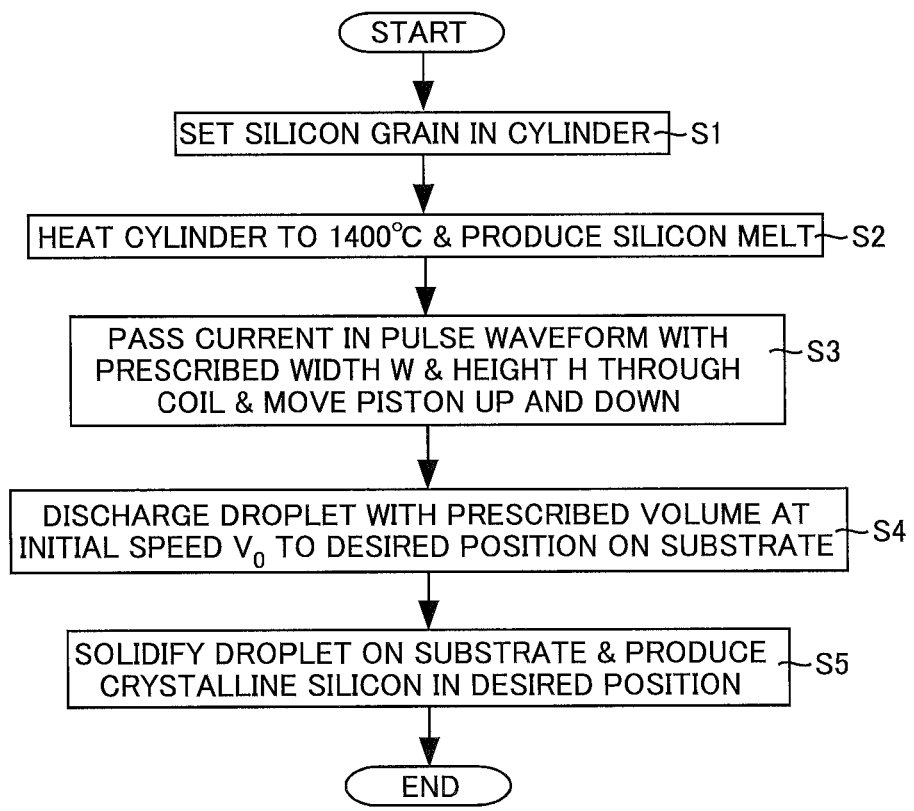
FIG. 3 is a flowchart for illustrating operation in the crystal manufacturing apparatus shown in FIG. 1.

FIG. 3 is a flowchart for illustrating operation in the crystal manufacturing apparatus 10 shown in FIG. 1. Referring to FIG. 3, when operation to manufacture crystalline silicon starts, silicon grains are set in the cylinder 7 (step S1).

Then, the cylinder 7 is heated to 1580° C. by the heater 8 and the silicon melt 13 is produced in the cylinder 7 (step S2). The power supply circuit 5 passes current i in the pulse waveform wv having a prescribed width W and a prescribed height H through the coil 4 to move up and down the piston 6 (step S3).

Then, the piston 6 applies prescribed pressure on the silicon melt 13 as it moves downward, and a droplet 14 having a prescribed volume is discharged to a desired position on the substrate 11 through the small hole 71 of the cylinder 7 at the initial speed $v_0$ (step S4).

The droplet 14 arrives at the substrate 11 and is solidified. As a result, crystalline silicon 20 is produced in the desired position on the substrate 11 as shown in FIG. 1 (step S5). In this way, a series of operation ends.

In this way, in the crystal manufacturing apparatus 10, the droplet 14 is discharged onto the substrate 11 at the initial speed $v_0$ and solidified on the substrate 11 to produce crystalline silicon 20 on the substrate 11. As a result, the droplet 14 is allowed to fly more easily toward the substrate 11 as compared to the case in which they are allowed to fall freely.

Therefore, using the crystal manufacturing apparatus 10, crystalline silicon 20 can be produced in a desired position on the substrate 11.

Figure 4:
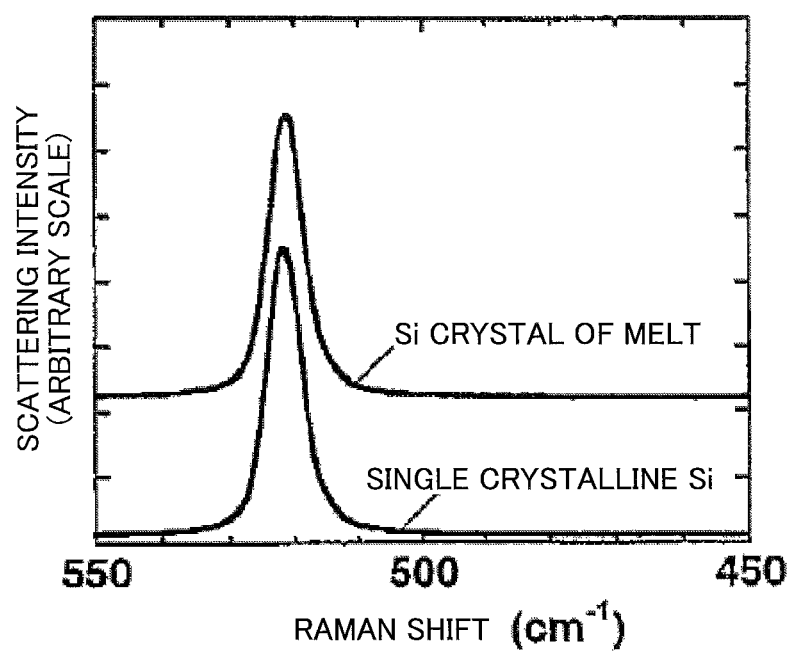
FIG. 4 is a graph showing a Raman spectrum of crystalline silicon produced using the crystal manufacturing apparatus shown in FIG. 1.

FIG. 4 is a graph showing a Raman spectrum of crystalline silicon produced using the crystal manufacturing apparatus 10 shown in FIG. 1. In FIG. 4, the ordinate represents a Raman scattering intensity and the abscissa represents a Raman shift. Note that FIG. 4 shows a Raman spectrum of single crystalline silicon (Si) for comparison.

Referring to FIG. 4, the Raman spectrum of crystalline silicon 20 (crystal of melt Si in FIG. 4) produced using the crystal manufacturing apparatus 10 has the same peak wavenumber as that of the single crystalline silicon and its full width at half maximum is substantially the same as that of the single crystalline silicon Si.

Therefore, it has been found that the crystalline silicon 20 manufactured using the crystal manufacturing apparatus 10 has crystallinity as high as that of single crystalline Si.

Figure 5:
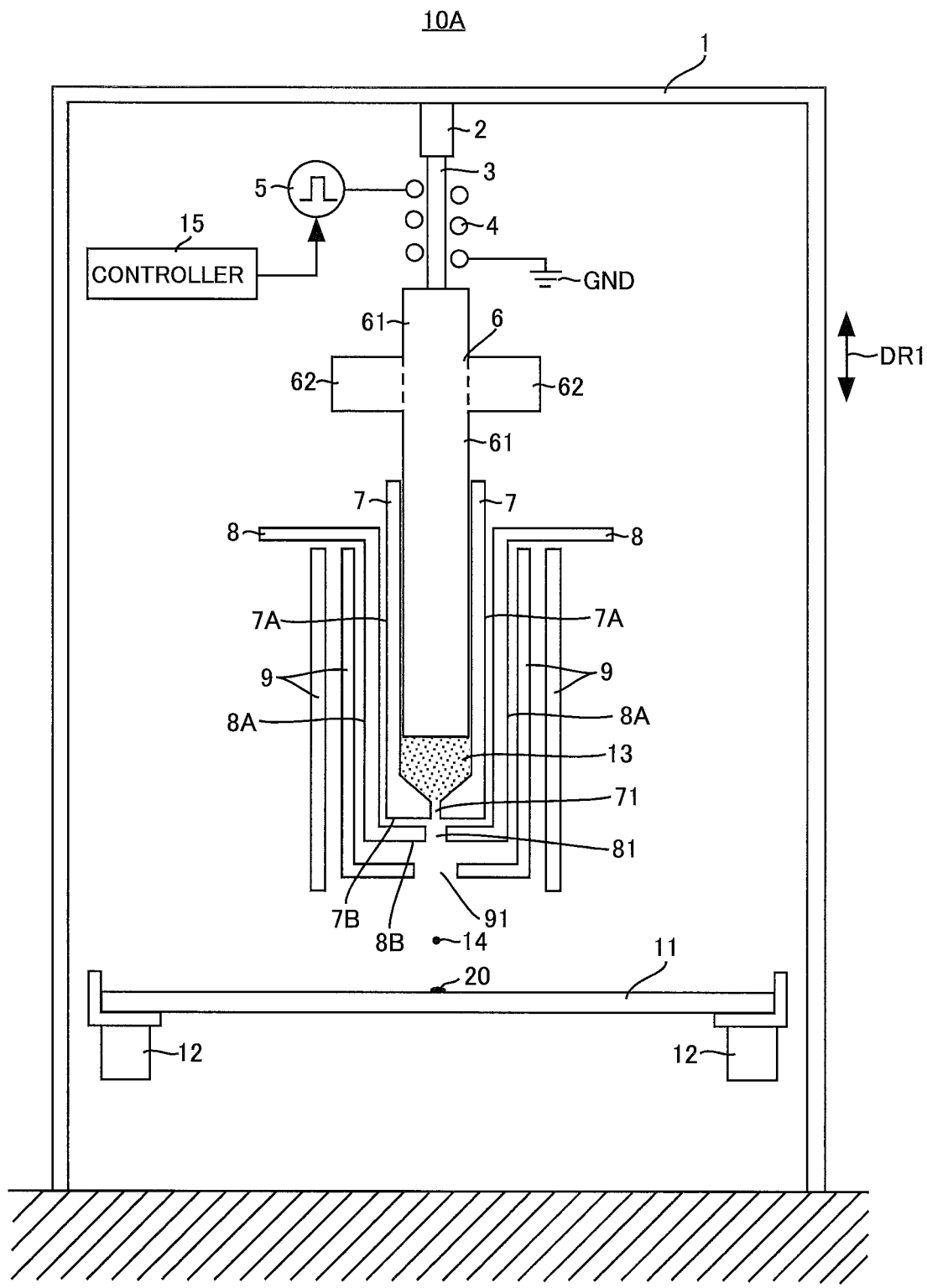
FIG. 5 is a schematic view of another crystal manufacturing apparatus according to an embodiment of the present invention.

FIG. 5 is a schematic view of another crystal manufacturing apparatus according to an embodiment of the present invention. The crystal manufacturing apparatus according to the embodiment may be a crystal manufacturing apparatus 10A shown in FIG. 5. Referring to FIG. 5, the crystal manufacturing apparatus 10A is substantially the same as the crystal manufacturing apparatus 10 shown in FIG. 1 except that it additionally includes a controller 15.

The controller 15 stores information about multiple kinds of substrates having different melting points from one another in association with multiple pulse waveforms having at least different widths W or heights H. The multiple pulse waveforms are pulse waveforms that allow droplets 14 to have such a volume (amount) that the temperature of a corresponding substrate is lower than the melting point of the substrate when the droplets 14 are each discharged toward the substrate.

Upon receiving the kind of the substrate 11 from the outside, the controller 15 selects a pulse waveform corresponding to the received kind of the substrate and outputs the selected pulse waveform to the power supply circuit 5.

Note that in the crystal manufacturing apparatus 10A, the power supply circuit 5 passes current i in the pulse waveform received from the controller 15 through the coil 4.

Figure 6:
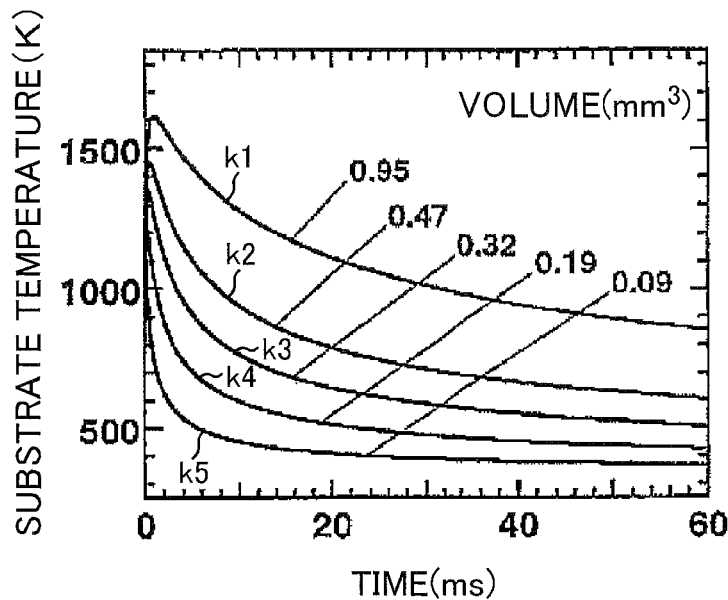
FIG. 6 is a timing chart for illustrating a substrate temperature when a droplet is discharged onto the substrate.

FIG. 6 is a timing chart for illustrating substrate temperature when droplets are discharged onto the substrate. In FIG. 6, the ordinate represents the absolute temperature of the substrate temperature and the abscissa represents time. The curves k1 to k5 are timing charts for the substrate temperature when the volume of a droplet 14 is 0.95 mm$^3$, 0.47 mm$^3$, 0.32 mm$^3$, 0.19 mm$^3$, and 0.09 mm$^3$, respectively.

Referring to FIG. 6, when the volume of the droplet 14 is 0.95 m$^3$ and the droplet 14 reaches the substrate 11, the substrate temperature is raised to about 1600 K and then gradually lowered. When the volume of the droplet 14 is other than 0.95 mm$^3$, the substrate temperature is also raised once the droplet 14 reaches the substrate 11 and then gradually lowered. The substrate temperature rises as the volume of the droplet 14 increases.

Figure 7:
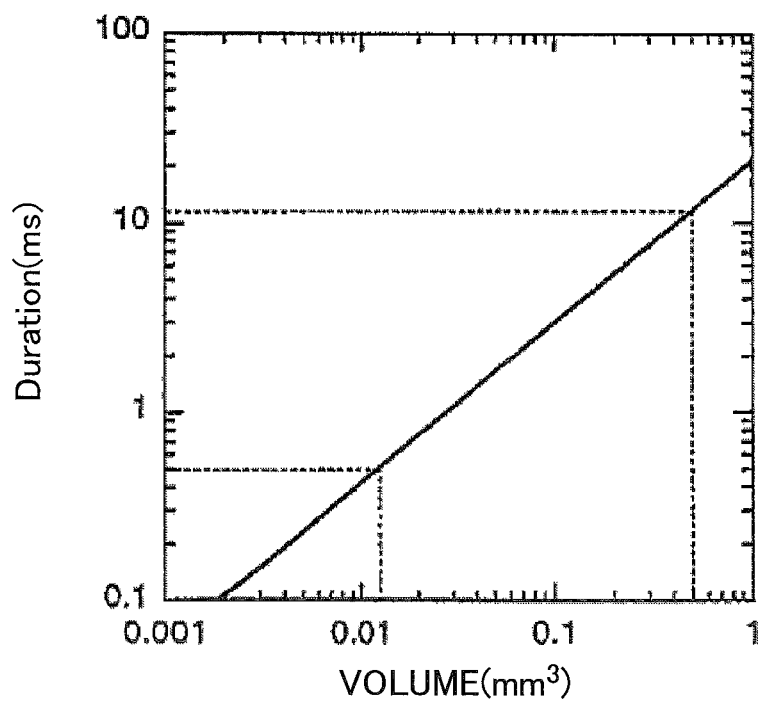
FIG. 7 is a graph showing a relation between duration and volume.

FIG. 7 is a graph showing a relation between Duration and volume. In FIG. 7, the ordinate represents Duration (ms) and the abscissa represents the volume of the droplet 14. Note that Duration refers to the period between the timing in which the temperature of the substrate 11 reaches the maximum temperature and the timing in which the temperature of the substrate is lowered to 90% of the maximum temperature when the droplet 14 reaches the substrate 11.

Referring to FIG. 7, Duration increases in proportion to the volume of the droplet 14. More specifically, the cooling speed of the substrate 11 is lower as the volume of the droplet 14 is larger and the speed is higher as the volume of the droplet 14 is smaller. Therefore, after a droplet 14 arrives at the substrate, the temperature of the substrate 11 is maintained at higher temperatures as the volume of the droplet 14 is greater and at lower temperatures as the volume of the droplet 14 is smaller.

As a result, when the volume of the droplet 14 is not more than 0.5 mm$^3$, a glass substrate can be used as the substrate 11, and when the volume of the droplet 14 is not more than 0.02 mm$^3$, a plastic substrate can be used as the substrate 11.

Figure 8:
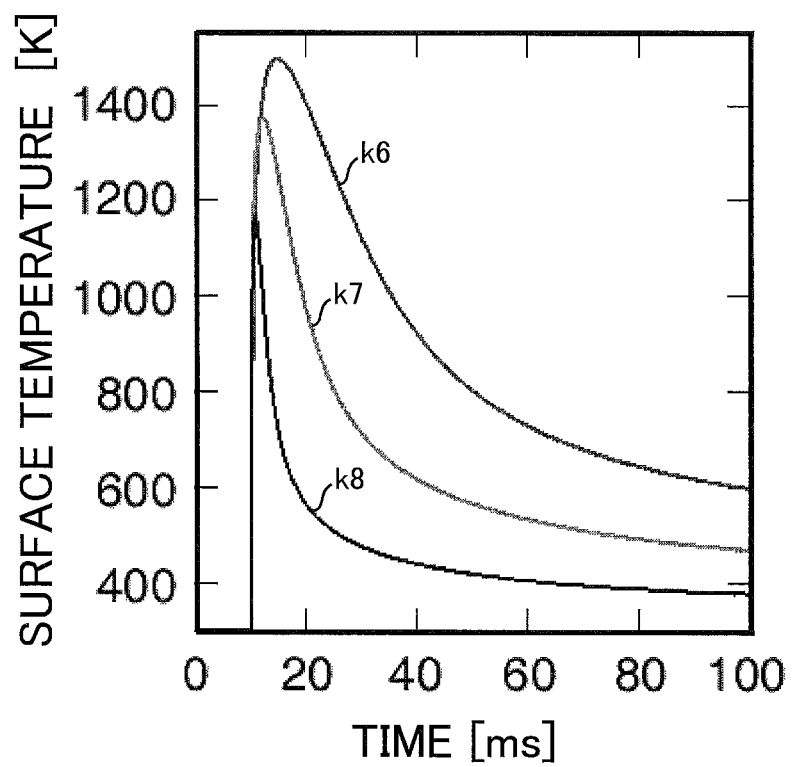
FIG. 8 is a timing chart showing the surface temperature of the substrate when a droplet is discharged onto the substrate.

FIG. 8 is a timing chart showing the substrate temperature of a substrate when a droplet is discharged onto the substrate. In FIG. 8, the ordinate represents the surface temperature of the substrate in absolute temperature, and the abscissa represents time. The curves k6 to k8 show a relation between the surface temperature of the substrate and time when the discharge pressure of the droplet 14 is gradually raised.

Referring to FIG. 8, the surface temperature of the substrate is more easily lowered as the discharge pressure of the droplet 14 increases (see change in the surface temperature caused by the change from curve k6 to curve k8).

This is because as the discharge pressure of the droplet 14 is higher, the expansion of the droplet 14 after arriving at the substrate is wider and a resulting film thickness is reduced.

The initial speed $v_0$ of the droplet 14 increases as the discharge pressure of the droplet 14 is higher and decreases as the discharge pressure of the droplet 14 is lower. Therefore, if the discharge pressure of the droplet 14, in other words, the initial speed $v_0$ of the droplet 14 is controlled, the temperature of the substrate can be controlled to be lower than the melting point of the substrate.

As in the foregoing, the temperature of the substrate 11 largely depends on the volume and the initial speed $v_0$ of the droplet 14. When the droplet 14 arrives at the substrate 11 and the substrate 11 melts, a constituent element of the substrate 11 is mixed into the droplet 14 as an impurity while the droplet 14 is solidified, which lowers the quality of the crystalline silicon produced by solidifying the droplet 14. It is naturally advantageous that the substrate does not melt.

Therefore, according to the embodiment, the volume (amount) of the droplet 14 discharged from the small hole 71 of the cylinder 7 is controlled so that the temperature of the substrate 11 is lower than the melting point of the substrate 11.

In the embodiment, the initial speed $v_0$ of the droplet 14 discharged from the small hole 71 of the cylinder 7 is controlled so that the temperature of the substrate 11 is lower than the melting point of the substrate 11.

Furthermore, in the embodiment, the volume (amount) and the initial speed $v_0$ of the droplet 14 discharged from the small hole 71 of the cylinder 7 is controlled so that the temperature of the substrate 11 is lower than the melting point of the substrate 11.

More specifically, in the embodiment, at least one of the volume (amount) and the initial speed $v_0$ of the droplet 14 discharged from the small hole 71 of the cylinder is controlled so that the temperature of the substrate 11 is lower than the melting point of the substrate 11.

Now, a method of controlling the volume (amount) and/or the initial speed $v_0$ of the droplet 14 will be described. As the width W of the pulse waveform wv shown in FIG. 2 increases, the magnetic body 3 is subjected to force for a longer period, and therefore the piston 6 applies pressure on the silicon melt 13 for a longer period. As a result, the volume (amount) of the droplet 14 discharged from the small hole 71 increases.

As the rising or falling of the pulse waveform wv becomes sharper, the moving speed of the magnetic body 3 increases, which also increases the moving speed of the piston 6. The piston 6 then applies greater pressure on the silicon melt 13.

Furthermore, as the height of the pulse wv (i.e., the current value of current i) increases, the moving speed of the magnetic body 3 increases, which increases the moving speed of the piston 6. As a result, the piston 6 applies greater pressure on the silicon melt 13.

Therefore, according to the present invention, the volume (amount) of the droplet 14 is controlled based on the width W of the pulse waveform wv and the initial speed $v_0$ of the droplet 14 is controlled based on the steepness of the rising or falling of the pulse waveform wv (the inclination of the rising or falling of the pulse waveform wv) and on the current value.

As a result, when only the volume (amount) of the droplet 14 is controlled, it is only necessary to change only the width W of the pulse waveform wv, while when only the initial speed $v_0$ of droplet 14 is controlled, it is only necessary to change the steepness of rising or falling or the current value of the pulse waveform wv and the current value. When the volume (amount) and the initial speed $v_0$ of the droplet 14 are both controlled, the width W of the pulse waveform wv, the steepness of the rising or falling of the pulse waveform wv, and the current value should be controlled.

In this way, the volume of the droplet 14 can be controlled based on the width W of the pulse waveform wv and the initial speed $v_0$ of the droplet 14 can be controlled based on the height H and the steepness of rising and falling of the pulse waveform wv.

As described above, when the volume (amount) of the droplet 14 is not more than 0.5 mm$^3$, a glass substrate can be used, and when the volume (amount) of the droplet 14 is not more than 0.02 mm$^3$, a plastic substrate can be used. Therefore, when the substrate 11 is a glass substrate, current i in a pulse waveform wv1 that allows the volume (amount) of the droplet 14 to be not more than 0.5 mm$^3$ must be applied through the coil 4. When the substrate 11 is a plastic substrate, current i in a pulse waveform wv2 that allows the volume (amount) of the droplet 14 to be not more than 0.02 mm$^3$ must be applied through the coil 4.

When the substrate 11 used in the crystal manufacturing apparatus 10A is a glass or plastic substrate, the controller 15 stores correspondence between the glass substrate and the pulse waveform wv1 and correspondence between the plastic substrate and the pulse waveform wv2. When the substrate 11 is a glass substrate, the controller 15 receives the kind of the substrate as a glass substrate from the outside and selects the pulse waveform wv1 corresponding to a glass substrate specified by the received kind of the substrate and outputs the selected pulse waveform to the power supply circuit 5. When the substrate 11 is a plastic substrate, the controller 15 receives the kind of the substrate as a plastic substrate from the outside and selects the pulse waveform wv2 corresponding to the plastic substrate specified by the received kind of the substrate and outputs the selected pulse waveform to the power supply circuit 5.

Then, the power supply circuit 5 passes current i in the pulse waveform wv1 through the coil 4 upon receiving the pulse waveform wv1 from the controller 15. In this way, the piston 6 moves up and down and discharges a droplet 14 having a volume (amount) of 0.5 mm$^3$ or less toward the glass substrate through the small hole 71 of the cylinder 7. The droplet 14 arrives on the glass substrate and is solidified. In this case, the glass substrate is kept at a temperature lower than its melting point.

The power supply circuit 5 passes current i in the pulse waveform wv2 through the coil 4 upon receiving the pulse waveform wv2 from the controller 15. In this way, the piston 6 moves up and down and a droplet 14 having a volume (amount) of 0.02 mm$^3$ or less is discharged toward the plastic substrate through the small hole 71 of the cylinder 7. The droplet 14 arrives on the plastic substrate and is solidified. In this case, the plastic substrate is kept at a temperature lower than its melting point.

Figure 9:
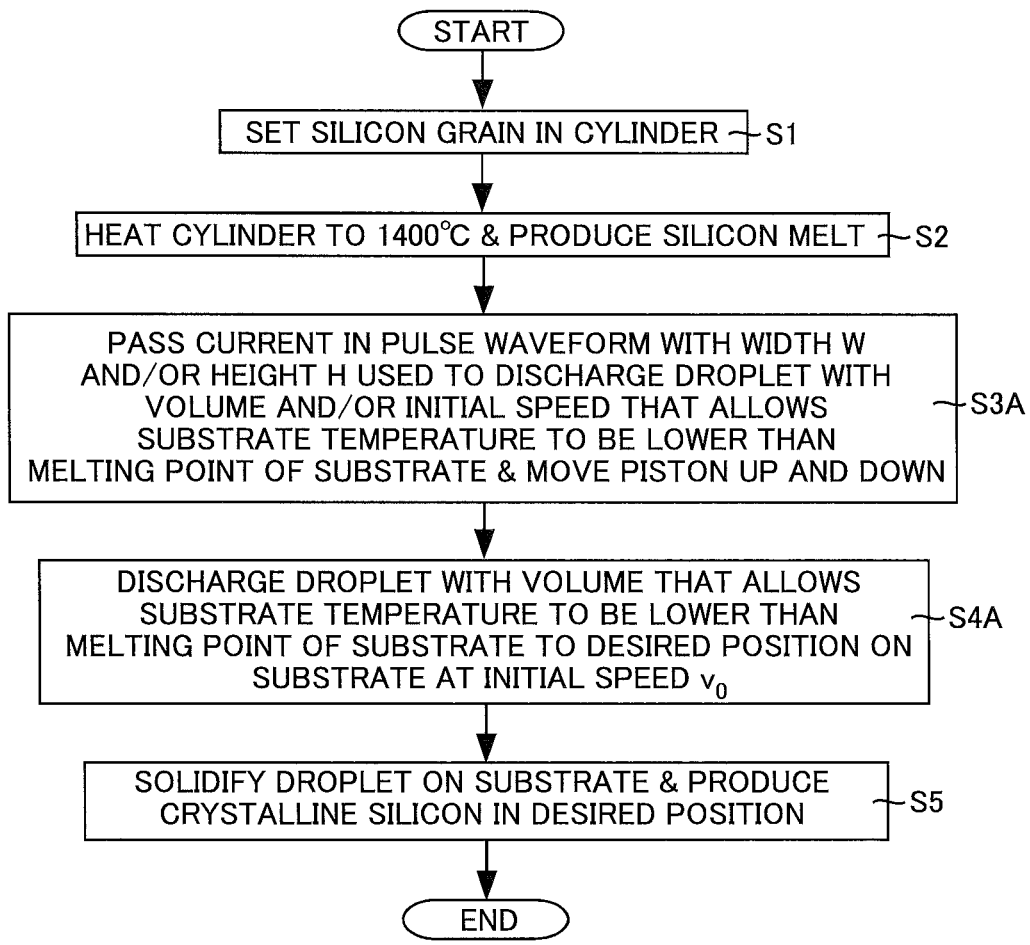
FIG. 9 is a flowchart for illustrating operation in the crystal manufacturing apparatus shown in FIG. 5.

FIG. 9 is a flowchart for illustrating operation in the crystal manufacturing apparatus 10A shown in FIG. 5. The flowchart in FIG. 9 is substantially the same as the flowchart in FIG. 3 except that steps S3 and S4 in the flowchart in FIG. 3 are replaced by steps S3A and S4A.

Referring to FIG. 9, when the operation to produce crystalline silicon 20 is started in the crystal manufacturing apparatus 10A, steps S1 and S2 described above are sequentially carried out.

Then, the controller 15 receives the kind of the substrate 11 as information from the outside and selects a pulse waveform corresponding to a substrate specified by the received kind of the substrate 11 and then outputs the selected pulse waveform to the power supply circuit 5. The power supply circuit 5 passes current in the pulse waveform received from the controller 15 through the coil 4. Then, the piston 6 moves up and down by the above-described mechanism. More specifically, the circuit passes current in a waveform with a width W and/or a height H used to discharge a droplet 14 with a volume (amount) and/or an initial speed that allows the temperature of the substrate to be lower than the melting point of the substrate, so that the piston 6 is moved up and down (step S3A).

As a result, a droplet 14 with the volume that allows the temperature of the substrate 11 to be lower than the melting point of the substrate 11 is discharged to a desired position on the substrate 11 at the initial speed $v_0$ (step S4A).

Thereafter, step S5 described above is carried out and a series of operation ends.

In this way, in the crystal manufacturing apparatus 10A, a droplet 14 with a volume (amount) and/or at an initial speed that allow the temperature of the substrate 11 to be lower than the melting point of the substrate 11 is discharged onto the substrate 11 in order to produce crystalline silicon 20. Therefore, when the droplet 14 arrives on the substrate 11, the temperature of the substrate 11 is kept at temperatures lower than the melting point of the substrate 11.

Therefore, the crystalline silicon 20 can be produced while the substrate 11 is prevented from melting.

Figure 10:
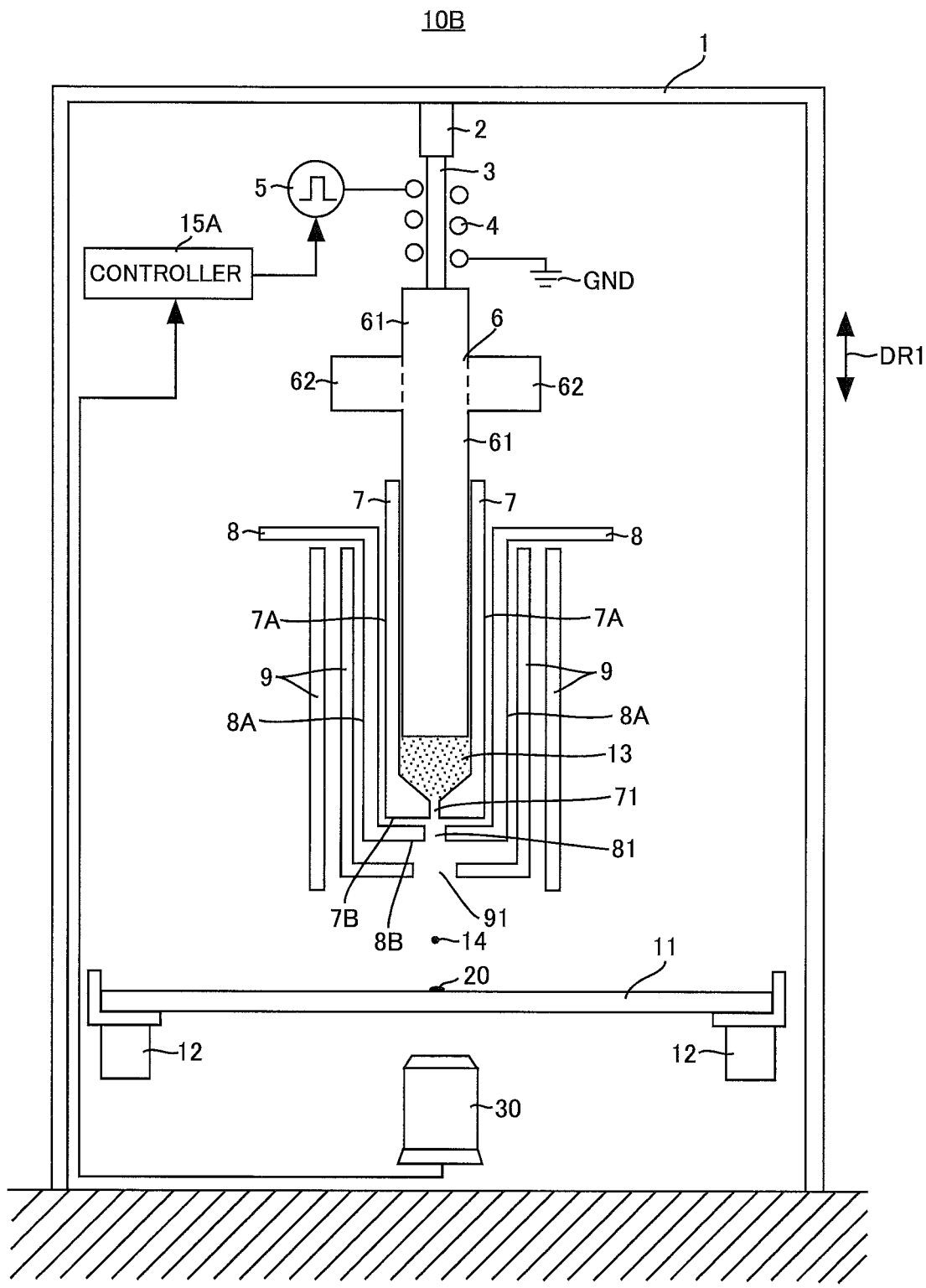
FIG. 10 is a schematic view of another crystal manufacturing apparatus according to an embodiment of the present invention.

FIG. 10 is a schematic view of another crystal manufacturing apparatus according to an embodiment of the present invention. The crystal manufacturing apparatus according to the embodiment may be the crystal manufacturing apparatus 10B shown in FIG. 10. Referring to FIG. 10, the crystal manufacturing apparatus 10B is substantially identical to the crystal manufacturing apparatus 10A shown in FIG. 5 except that the controller 15 is replaced by a controller 15A and a temperature detector 30 is additionally provided.

The controller 15A receives a temperature Tsub of the substrate 11 when a droplet 14 arrives at the substrate 11 from the temperature detector 30, selects a pulse waveform used to discharge a droplet 14 with a volume (amount) and/or an initial speed that allows the received temperature Tsub to be lower than the melting point of the substrate 11 and outputs the selected pulse waveform to the power supply circuit 5.

The temperature detector 30 detects the temperature Tsub of the substrate 11 when the droplet 14 arrives at the substrate 11 according to a method that will be described and outputs the detected temperature Tsub to the controller 15A.

Figure 11:
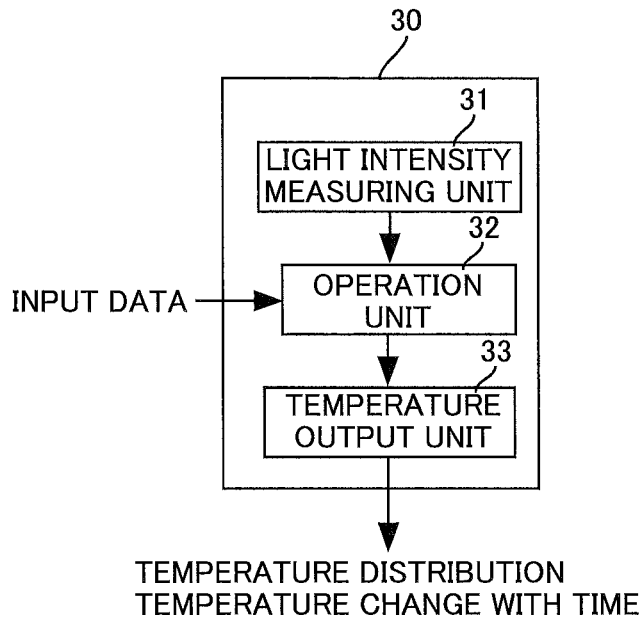
FIG. 11 is a schematic block diagram showing a structure of a temperature detector shown in FIG. 10.

FIG. 11 is a schematic block diagram of structure of the temperature detector 30 shown in FIG. 10. Referring to FIG. 11, the temperature detector 30 includes a light intensity measuring unit 31, an operation unit 32, and a temperature output unit 33. The temperature detector 30 is a detector that detects the temperature of the substrate 11 having a unique relation between its temperature and refractive index.

The light intensity measuring unit 31 radiates a laser beam on the substrate 11 and measures a light intensity characteristics X that represents a relation between time and the light intensity of reflected light attributable to interference of the laser beams multi-reflected at the substrate 11 for various locations of the substrate 11. The light intensity measuring unit 31 outputs a plurality of light intensity characteristics X at the measured various locations to the operation unit 32.

The operation unit 32 receives the plurality of light intensity characteristics X from the light intensity measuring unit 31 and input data from the outside. The input data includes initial values for operation and correction values thereof. The initial values include a shape condition for the substrate 11, thermal and optical conditions of the substrate 11, thermal transfer from a silicon melt 13 and the size of a region of a virtual substrate (substrate having a shape and thermal and optical conditions identical to those of the substrate 11) that receives the thermal transfer from the silicon melt 13.

The shape condition of the substrate 11 includes for example the thickness, area, and parallel degree of the substrate. The thermal and optical conditions of the substrate 11 include an initial temperature, an initial reflectance, thermal conductivity, a density, a specific heat, a temperature dependence of a refractive index and the like.

The operation unit 32 receives a plurality of light intensity characteristics X and input data and calculates the light intensity characteristics Y of the virtual substrate provided with the same thermal load as that applied on the substrate 11 based on the received input data for various locations of the virtual substrate according to a method that will be described. The operation unit 32 selects, for the same location in each of the virtual substrate and the substrate 11, one light intensity characteristics X and one light intensity characteristics Y among the plurality of light intensity characteristics X and the plurality of light intensity characteristics Y, detects the difference between the selected light intensity characteristics Y and X and calculates a light intensity characteristics Y by correcting the input data until the difference is minimized (or until the light intensity characteristics Y is the most approximated to the light intensity characteristics X). In this way, the operation unit 32 obtains the light intensity characteristics Yopt that is the closest to the light intensity characteristics X as a light intensity characteristic Z among the calculated plurality of light intensity characteristics Y.

The operation unit 32 carries out the processing for various locations in the virtual substrate and the substrate 11. As a result, the operation unit 32 obtains the light intensity characteristics Z for each of the locations of the virtual substrate, produces a reproduced substrate in which the temperature distribution and temperature change with time of the virtual substrate that has the obtained plurality of light intensity characteristics z are implemented and outputs the reproduced substrate to the temperature output unit 33.

The temperature output unit 33 extracts a temperature distribution of the substrate 11 or temperature change with time in various locations of the substrate 11 and outputs the extracted temperature distribution or the temperature change with time to the controller 15A.

Figure 12:
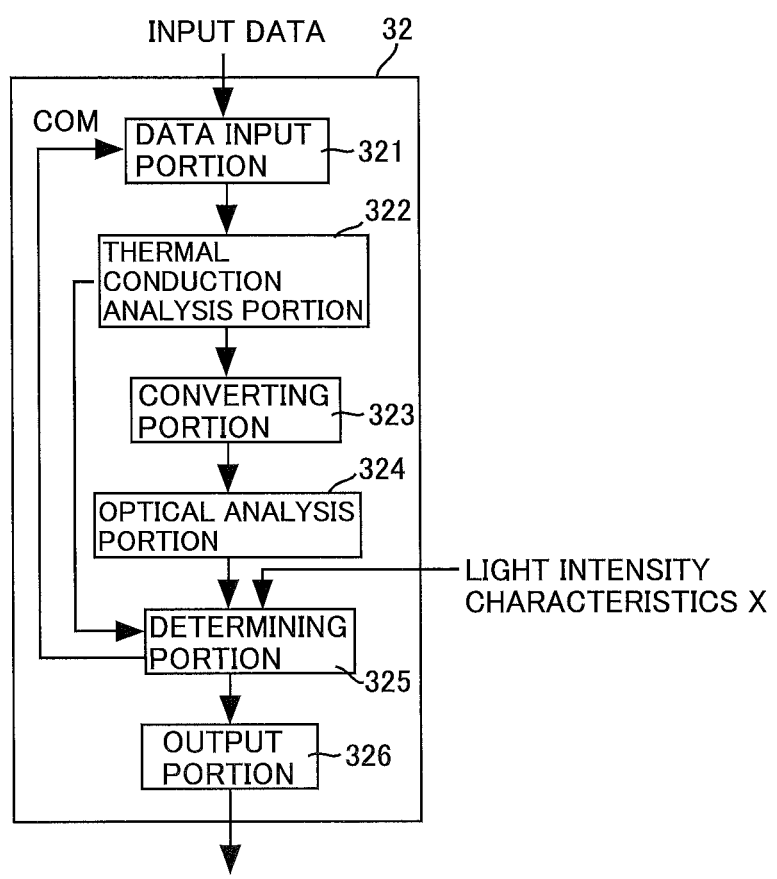
FIG. 12 is a schematic block diagram showing a structure of an operation unit shown in FIG. 11.

FIG. 12 is a schematic block diagram of structure of the operation unit 32 shown in FIG. 11. Referring to FIG. 12, the operation unit 32 includes a data input portion 321, a thermal conduction analysis portion 322, a converting portion 323, an optical analysis portion 324, a determining portion 325, and an output portion 326.

The data input portion 321 receives the above-described input data from the outside. The data input portion 321 outputs initial values in the input data to the thermal conduction analysis portion 322 unless a command signal COM that instructs re-calculation is received from the determining portion 325. The data input portion outputs corrected initial values to the thermal conduction analysis portion 322 when the command signal COM is received from the determining portion 325.

The thermal conduction analysis portion 322 receives the initial values in the input data or the corrected initial values from the data input portion 321 and obtains the temperature distribution characteristics of the virtual substrate using a known thermal conduction analysis method based on the received initial values or corrected initial values. One such known method is a thermal conduction analysis method disclosed by Non-Patent Document 1. The temperature distribution characteristic of the virtual substrate includes temperature change with time in various locations in the virtual substrate. The thermal conduction analysis portion 322 outputs the obtained temperature distribution characteristics of the virtual substrate to the converting portion 323 and the determining portion 325.

The converting portion 323 receives the temperature distribution characteristics of the virtual substrate from the thermal conduction analysis portion 322 and converts the received temperature distribution characteristics of the virtual substrate into a refractive index distribution characteristic. For example, when a laser beam having a wavelength of 633 nm is radiated upon a quartz substrate, the following relation is established between the refractive index n and the temperature T (° C.): $n=1.457+1.2\times10^{-5}T$. When a laser beam having a wavelength of 633 nm is radiated upon a Si substrate, the following relation is established between the refractive index n and the temperature T (° C.): $n=4.04+2.105\times10^{-4}T$. Therefore, the converting portion 323 converts the temperature distribution characteristics of the virtual substrate into the refractive distribution characteristics of the virtual substrate using these relation formulas between the refractive index n and the temperature T. As described above, the temperature distribution characteristics of the virtual substrate includes temperature change with time in various locations of the virtual substrate and the refractive index distribution characteristics includes chronological changes in the refractive index in the various locations of the virtual substrate. The converting portion 323 outputs a resulting refractive index distribution characteristics of the virtual substrate to the optical analysis portion 324.

The optical analysis portion 324 receives the refractive index distribution characteristics of the virtual substrate from the converting portion 323 and obtains the light intensity characteristics Y of the virtual substrate for each of the locations of the virtual substrate using a known optical analysis method based on the received refractive index distribution characteristics of the virtual substrate. The optical analysis portion 324 outputs the obtained plurality of light intensity characteristics Y of the virtual substrate to the determining portion 325.

The determining portion 325 receives the plurality of light intensity characteristics X of the substrate 11 from the light intensity measuring unit 31, the plurality of light intensity characteristics Y of the virtual substrate from the optical analysis portion 324, and the temperature distribution characteristics of the virtual substrate from the thermal conduction analysis portion 322. The determining portion 325 selects one light intensity characteristics X and one light intensity characteristics Y for the same location in each of the virtual substrate and the substrate 11 and extracts the difference in vibration number and phase between the selected light intensity characteristics X and the selected light intensity characteristics Y by a pattern matching method. The determining portion 325 repeatedly extracts the difference until the difference in the vibration number and phase is minimized. Therefore, the determining portion 325 produces a command signal COM and outputs the signal to the data input portion 321 until at least three differences are extracted. This is because when at least three differences can be extracted, the minimum difference can be detected. More specifically, as can be understood, when the difference extracted for the second time is smaller than the difference extracted for the first time and the difference extracted for the third time is greater than the difference extracted for the second time, the difference extracted for the second time is the smallest.

The determining portion 325 carries out the process of detecting the smallest difference in various locations in the virtual substrate. Upon determining the smallest difference for each of the locations in the virtual substrate, the determining portion 325 determines the plurality of light intensity characteristics Y when the smallest difference is obtained as the light intensity characteristics Z of the reproduced substrate. The determining portion 325 also determines a temperature distribution characteristics received from the thermal conduction analysis portion 322 when the light intensity characteristics Z are detected (the temperature distribution characteristics includes temperature change with time in various locations in the reproduced substrate) as the temperature distribution characteristics of the reproduced substrate. Then, the determining portion 325 outputs the temperature distribution characteristics of the reproduced substrate to the output portion 326.

Upon receiving the temperature distribution characteristics of the reproduced substrate from the determining portion 325, the output portion 326 produces a reproduced substrate in which the temperature distribution and the temperature change with time in the various locations are reproduced based on the received temperature distribution characteristics of the reproduced substrate and outputs the produced reproduced substrate to the temperature output unit 33.

Figure 13:
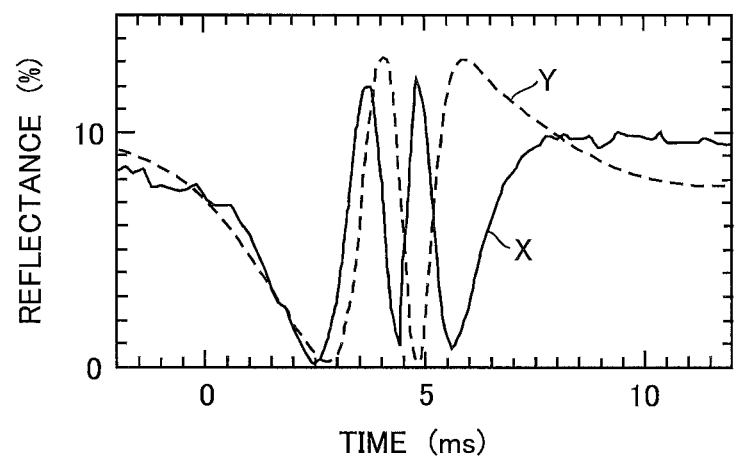
FIG. 13 is a graph showing how reflectance changes with time.
Figure 14:
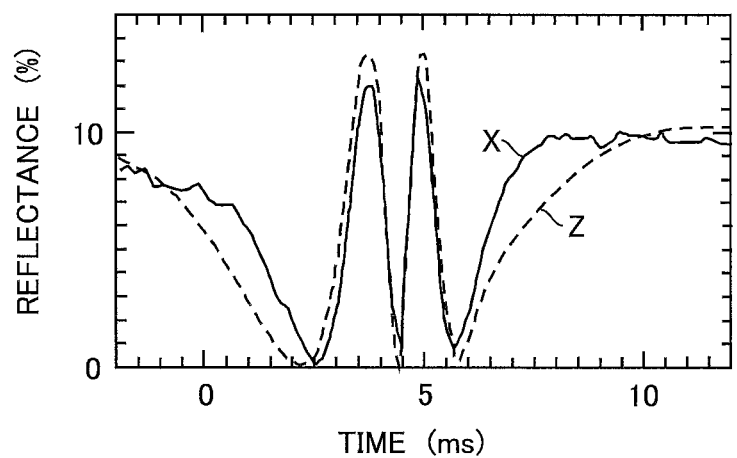
FIG. 14 is a graph showing how reflectance changes with time.

FIGS. 13 and 14 are graphs showing how the reflectance changes with time. In FIGS. 13 and 14, the ordinate represents the reflectance and the abscissa represents time.

Referring to FIG. 13, the determining portion 325 compares a light intensity characteristics X selected for one location in the substrate 11 with a light intensity characteristics Y for one location in the virtual substrate corresponding to the location of the substrate 11 and extracts the difference between the light intensity characteristics X and Y.

As shown in FIG. 13, since the light intensity characteristics X and Y vibrate and the light intensity characteristics X and Y have peaks and hollows in different positions, the determining portion 325 can easily extract the difference in vibration number and phase between the light intensity characteristics X and Y by the pattern matching method.

The determining portion 325 repeatedly extracts the difference between the light intensity characteristics X and the light intensity characteristics Y calculated using corrected initial values and eventually detects a light intensity characteristics Z with the minimum difference, in other words, the closest characteristics Z to the light intensity characteristics X (see FIG. 14).

The determining portion 325 carries out the process of detecting a light intensity characteristics Z for various locations of the virtual substrate and detects a plurality of such light intensity characteristics Z. In this way, the determining portion 325 outputs the temperature distribution characteristics of the virtual substrate received from the thermal conduction analysis portion 322 when the plurality of light intensity characteristics Z are detected as the temperature distribution characteristics of the reproduced substrate to the output portion 326.

Figure 15:
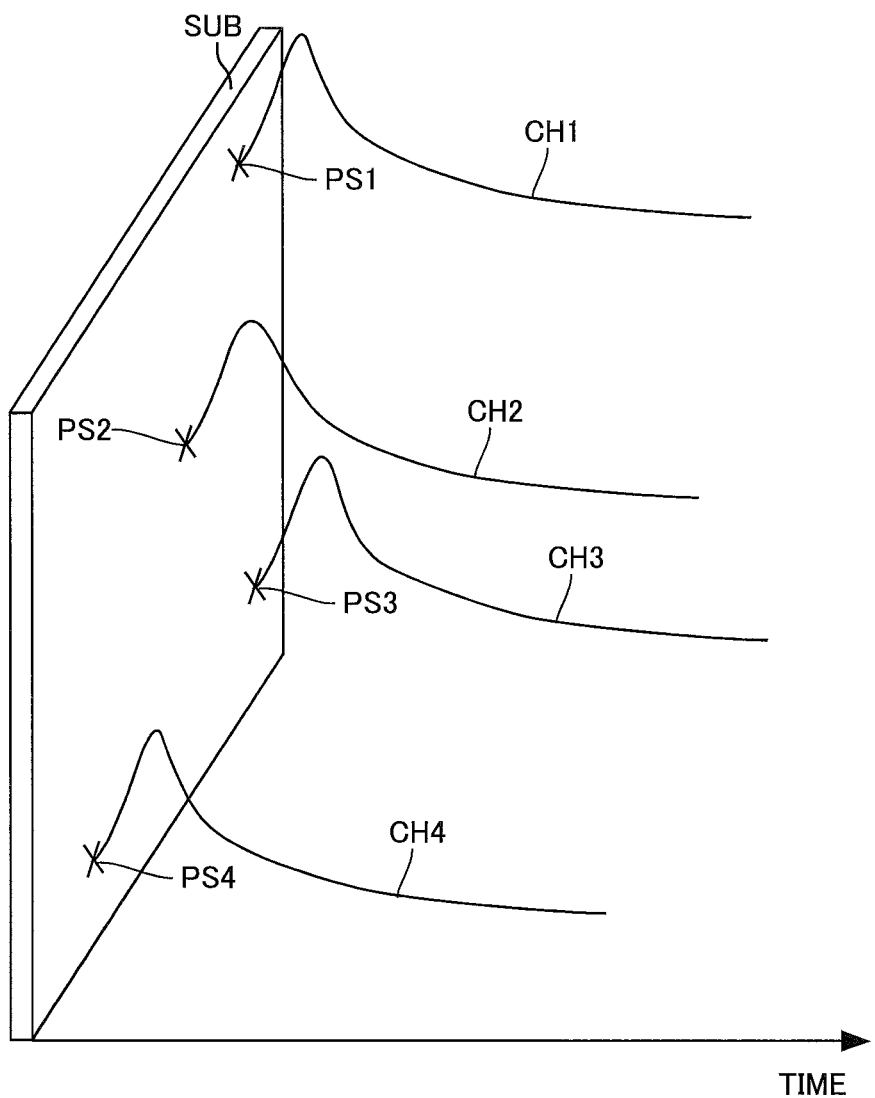
FIG. 15 is a diagram showing a concept of a reproduced substrate.

FIG. 15 is a view showing a concept of the reproduced substrate. Note that FIG. 15 shows a temperature distribution in four locations and temperature change with time in four locations for the ease of illustration.

Referring to FIG. 15, upon receiving the temperature distribution characteristics of the reproduced substrate from the determining portion 325, the output portion 326 reproduces chronological change characteristics CH1 to CH4 in temperature in positions PS1 to PS4 that form the received temperature distribution characteristics at a reproduced substrate SUB. The output portion 326 outputs the reproduced substrate SUB to the temperature output unit 33.

Upon receiving the reproduced substrate SUB, the temperature output unit 33 refers to the reproduced substrate SUB to detect a temperature in each timing in the positions PS1 to PS4 and outputs the results to the controller 15A.

As described above, the temperature detector 30 detects, among the calculated plurality of light intensity characteristics Y, a light intensity characteristics Y that is the closest to the actually measured light intensity characteristics X as a light intensity characteristics Z for each position in the substrate and obtains a temperature distribution characteristics (including temperature change with time in each location of the substrate) when a plurality of light intensity characteristics Z are detected in the locations as the temperature distribution of the substrate 11 and chronological changes in temperature in the locations of the substrate 11.

The temperature detector 30 obtains a temperature Tsub of the substrate 11 when a droplet 14 arrives on the substrate 11 by the above described method and outputs the obtained temperature Tsub to the controller 15A.

Upon receiving the temperature Tsub of the substrate 11 from the temperature detector 30, the controller 15A produces a pulse waveform used to discharge a droplet 14 with a volume (amount) that allows the received temperature Tsub to be lower than the melting point of the substrate 11 and outputs the produced pulse waveform to the power supply circuit 5.

In this case, the controller 15A sequentially produces pulse waveforms having different widths W and/or heights H, outputs the pulse waveforms to the power supply circuit 5 and eventually determines a pulse waveform when the temperature Tsub received from the temperature detector 30 is lower than the melting point of the substrate 11.

Therefore, when crystalline silicon 20 is produced on the substrate 11 using the crystal manufacturing apparatus 10B, a test region is provided at the substrate 11 and a pulse waveform when the temperature Tsub is lower than the melting point of the substrate 11 in the test region is eventually determined. Using the determined pulse waveform, the crystalline silicon 20 is produced in a desired position on the substrate 11.

Figure 16:
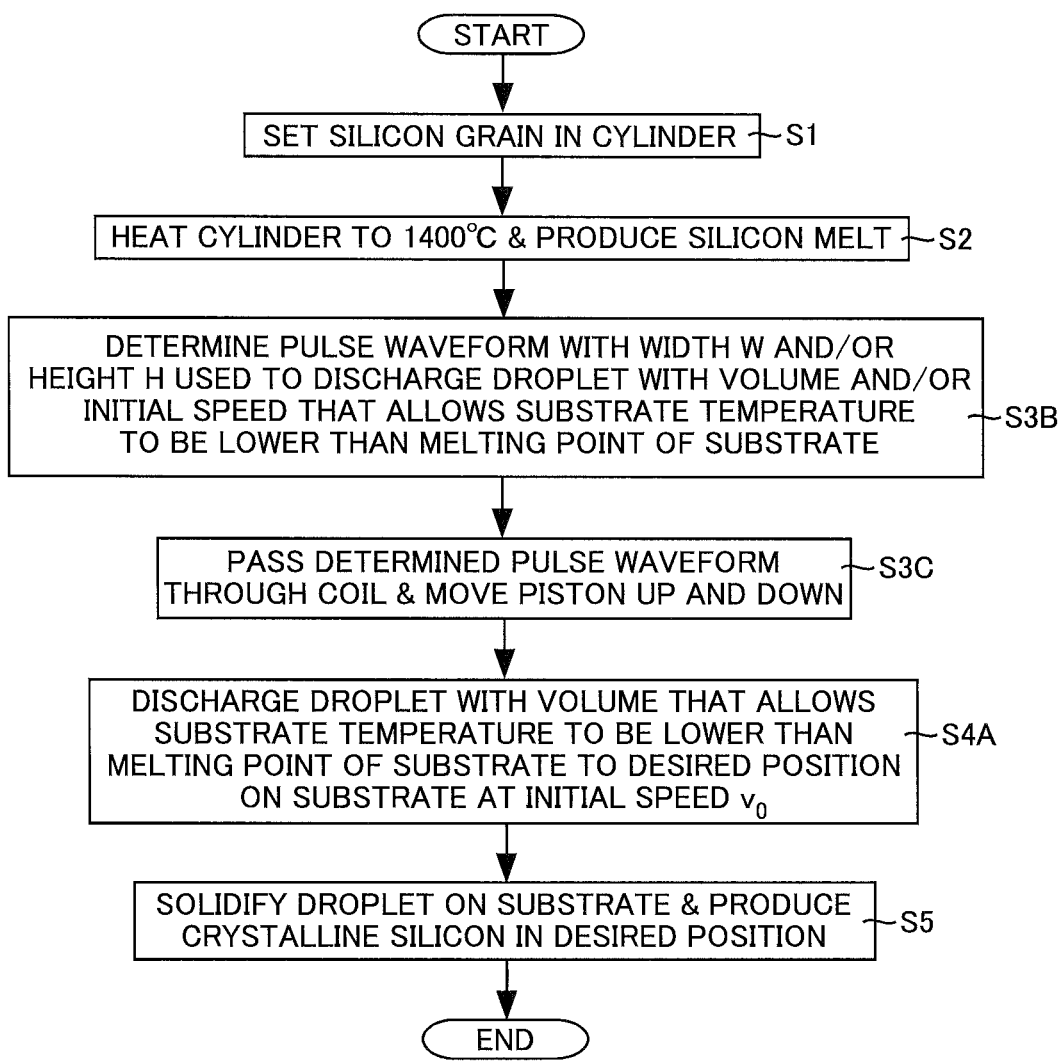
FIG. 16 is a flowchart for illustrating operation in the crystal manufacturing apparatus shown in FIG. 10.

FIG. 16 is a flowchart for illustrating operation in the crystal manufacturing apparatus 10B in FIG. 10. The flowchart in FIG. 16 has steps S3B and S3C instead of step S3A in FIG. 9 and the other part is the same as that of the flowchart in FIG. 9.

Referring to FIG. 16, when operation to produce crystalline silicon 20 using the crystal manufacturing apparatus 10B is started, steps S1 and S2 described above are sequentially carried out.

Thereafter, the substrate 11 is moved by the XY stage 12 so that the test region of the substrate 11 is opposed to the small hole 71 of the cylinder 7. Then, in the test region, while changing the width W and/or height H, a pulse waveform having a width W and/or a height H used to discharge a droplet 14 with a volume (amount) and/or an initial speed that allows the temperature of the substrate 11 to be lower than the melting point of the substrate 11 is determined (step S3B).

In this case, the controller 15A produces a pulse waveform wv01 having a width W1 and a height H1 and outputs the produced pulse waveform wv01 to the power supply circuit 5 and the power supply circuit 5 applies current in the pulse waveform wv01 through the coil 4 to move the piston 6 up and down, so that a droplet 14 is discharged in the test region of the substrate 11. The temperature detector 30 detects a temperature Tsub1 of the substrate 11 when the droplet 14 arrives at the test region of the substrate 11 by the above-described method and outputs the detected Tsub1 to the controller 15A.

When the temperature Tsub1 is lower than the melting point of the substrate 11, the controller 15A determines the pulse waveform wv01 as a pulse waveform used to discharge a droplet 14 with a volume (amount) and/or an initial speed that allows the temperature of the substrate 11 to be lower than the melting point of the substrate 11.

On the other hand, when the temperature Tsub1 is not less than the melting point of the substrate 11, the controller 15A produces a pulse waveform wv02 in which at least one of the width W1 and the height H1 is changed and outputs the produced pulse waveform to the power supply circuit 5 and the power supply circuit 5 passes current in the pulse waveform wv02 through the coil 4 to move the piston 6 up and down, so that a droplet 14 is discharged to the test region of the substrate 11. The temperature detector 30 detects a temperature Tsub2 of the substrate 11 when a droplet 14 arrives at the test region of the substrate 11 by the above-described method and outputs the detected Tsub2 to the controller 15A.

Thereafter, the above-described operation is repeatedly carried out until the temperature Tsub of the substrate 11 is lower than the melting point of the substrate 11 and the controller 15A determines a pulse waveform used to discharge a droplet 14 with a volume (amount) and/or an initial speed that allows the temperature of the substrate 11 to be lower than the melting point of the substrate 11.

After step S3B, the XY stage 12 moves the substrate 11 so that a desired position to produce crystalline silicon 20 is opposed to the small hole 71 of the cylinder 7, the controller 15A outputs a determined pulse waveform to the power supply circuit 5, and the power supply circuit 5 passes current in the pulse waveform received from the controller 15A through the coil 4 to move the piston 6 up and down (step S3C).

Then, steps S4A and S5 are sequentially carried out and the crystalline silicon 20 is produced in the desired position on the substrate 11.

When crystalline silicon 20 is produced using the crystal manufacturing apparatus 10B, a droplet 14 with a volume (amount) and/or an initial speed that allows the measured temperature Tsub of the substrate 11 to be lower than the melting point of the substrate 11 is discharged onto the substrate 11 and the crystalline silicon 20 is produced.

Therefore, the crystalline silicon 20 can be produced in a desired position on the substrate 11 while the substrate 11 is surely prevented from melting. The crystalline silicon 20 can be produced in a desired position on each of substrates 11 having different melting points while the substrate 11 is surely prevented from melting.

When the crystalline silicon 20 is produced using the crystal manufacturing apparatus 10B, a temperature Tsub in each of various locations on the substrate 11 can be detected by the temperature detector 30, and therefore the crystalline silicon 20 can be produced in a desired position on a substrate 11 prone to temperature difference between the periphery and a central part while the substrate 11 is surely prevented from melting.

Furthermore, when the crystalline silicon 20 is produced using the crystal manufacturing apparatus 10B, chronological changes in the temperature Tsub in various locations on the substrate 11 can be detected by the temperature detector 30. Therefore, the controller 15A may receive changes in the temperature Tsub at each location on the substrate 11 from the temperature detector 30, generate a pulse waveform when the temperature of the substrate 11 reaches a temperature at which a droplet 14 arriving at the substrate 11 is easily solidified and produce the crystalline silicon 20 in a desired position on the substrate 11 accordingly.

In this way, high quality crystalline silicon 20 can be produced with high reproducibility.

Figure 17:
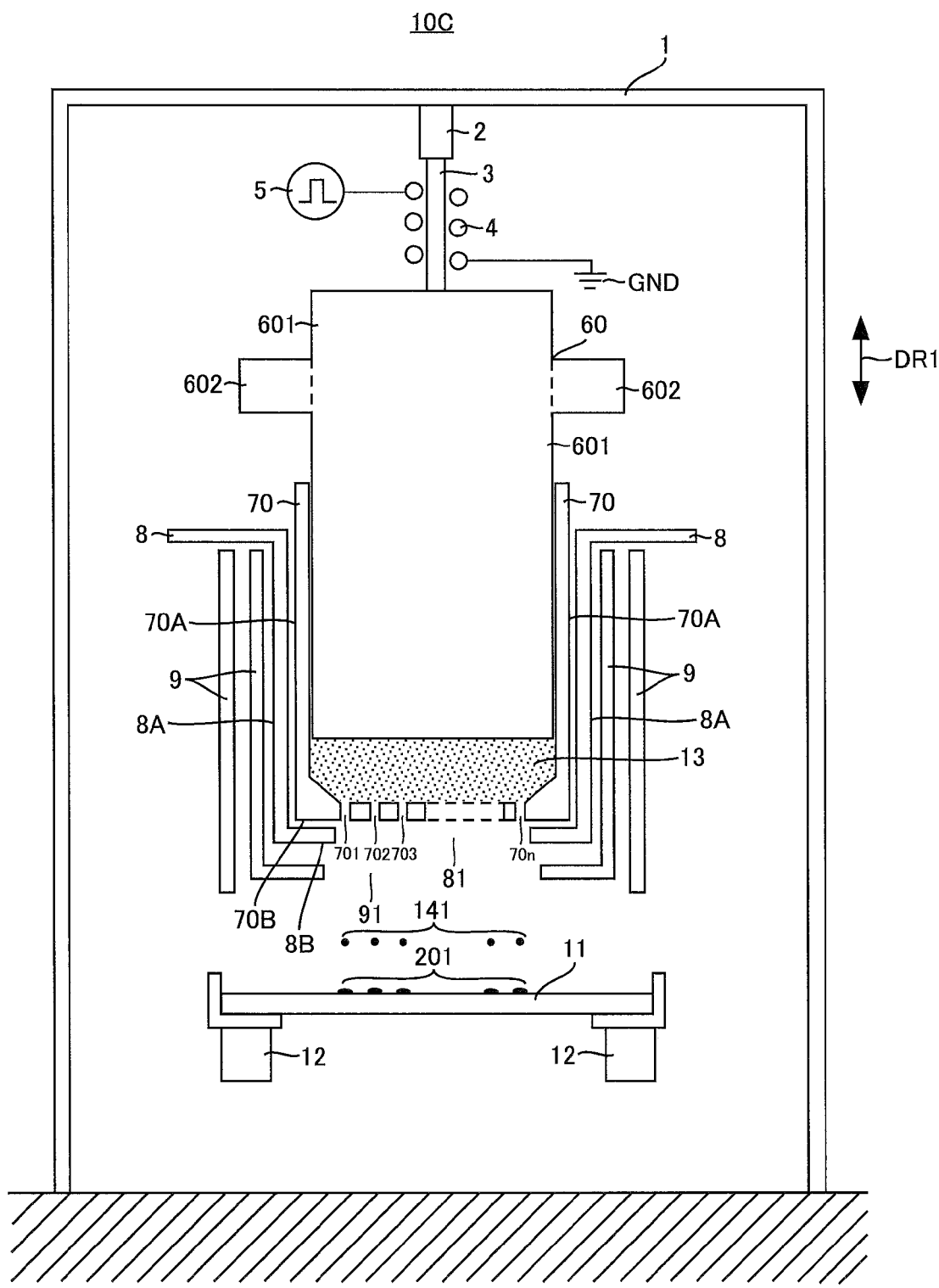
FIG. 17 is a schematic view of another crystal manufacturing apparatus according to an embodiment of the present invention.

FIG. 17 shows a schematic view of another crystal manufacturing apparatus according to an embodiment of the present invention. The crystal manufacturing apparatus according to the embodiment may be a crystal manufacturing apparatus 10C shown in FIG. 17.

Referring to FIG. 17, the crystal manufacturing apparatus 10C has a piston 60 and a cylinder 70 in place of the piston 6 and the cylinder 7, respectively in the crystal manufacturing apparatus 10 shown in FIG. 1 and the other part is the same as that of the crystal manufacturing apparatus 10.

The piston 60 is made of BN and includes a straight member 601 and a stop member 602. The straight member 601 is columnar shaped and has a square section. The area of the bottom is 1.5 mm×50 mm, and the height is 145 mm. The stop member 602 is provided 40 mm apart from the coupling position between a magnetic body 3 and the piston 60. The straight member 601 has one end coupled to the magnetic body 3 and the other end side inserted in the cylinder 70.

The cylinder 70 is made of BN and has a hollow columnar shape having a square section. The cylinder 70 is fixed at a mount 1 by a support member (not shown). The cylinder 70 has an inner size of 1.6 mm×51 mm and an outer size of 6.0 mm×60 mm. The cylinder 70 has n small holes 701 to 70n at its bottom surface 70B (n is an integer not less than 2). The small holes 701 to 70n are arranged in a straight line along one side of the substrate 11. The small holes 701 to 70n each have a diameter of for example 100 μm φ. The interval between two adjacent small holes is set for example to the interval between semiconductor devices to manufacture.

Note that in the crystal manufacturing apparatus 10C, a heater 8 is provided around a side surface 70A and the bottom surface 70B of the cylinder 70 and there is a gap 81 in a position opposed to the n small holes 701 to 70n. A reflector 9 has a gap 91 in a position opposed to the n small holes 701 to 70n.

In the crystal manufacturing apparatus 10C, when the power supply circuit 5 passes current i in a pulse waveform wv (see FIG. 2) through the coil 4, the piston 60 moves up and down by the above-described mechanism to apply prescribed pressure on a silicon melt 13.

Then, n droplets 141 are discharged simultaneously toward the substrate 11 from the n small holes 701 to 70n, so that n pieces of crystalline silicon 201 are produced simultaneously in desired positions on the substrate 11.

In this way, the crystal manufacturing apparatus 10C produces the n pieces of crystalline silicon 201 simultaneously on the substrate 11. Therefore, using the crystal manufacturing apparatus 10C, a plurality of TFTs (Thin Film Transistors) arranged in a matrix may be manufactured readily on the substrate 11. In this case, the XY stage 12 moves the substrate 11 in the direction orthogonal to the direction in which the n small holes 701 to 70n are arranged.

Note that in the crystal manufacturing apparatus 10C, the operation of manufacturing the n pieces of crystalline silicon 201 is carried out according to the flowchart shown in FIG. 3. Therefore, the operation in the crystal manufacturing apparatus 10C is carried out by performing steps in the flowchart shown in FIG. 3 for each position on the substrate 11 in the direction orthogonal to the direction in which the n small holes 701 to 70n are arranged.

The crystal manufacturing apparatus 10C may further include the controller 15 shown in FIG. 5. In this case, in the crystal manufacturing apparatus 10C, the operation of manufacturing n pieces of crystalline silicon 201 is carried out according to the flowchart shown in FIG. 9.

The crystal manufacturing apparatus 10C may further include the controller 15A and the temperature detector 30 shown in FIG. 10. In this case, in the crystal manufacturing apparatus 10C, the operation of manufacturing n pieces of crystalline silicon 201 is carried out according to the flowchart shown in FIG. 16.

When the crystal manufacturing apparatus 10C includes the temperature detector 30, the controller 15A receives a temperature Tsub in each of various locations of the substrate 11 from the temperature detector 30, produces a pulse waveform used to discharge n droplets 141 with a volume (amount) that allows the temperature Tsub of the substrate 11 to be lower the melting point of the substrate 11 and outputs the pulse waveform to the power supply circuit 5. The power supply circuit 5 applies current in the pulse waveform received from the controller 15A through the coil 4. The piston 60 moves up and down, and the n droplets 141 are discharged toward the substrate 11.

Therefore, a plurality of TFTs arranged in a matrix can readily be produced while preventing the substrate 11 from melting.

Furthermore, the crystal manufacturing apparatus 10C may include n set each including the spring 2, the magnetic body 3, the coil 4, the power supply circuit 5, the piston 6 and the cylinder 7 shown in FIG. 1 in place of the spring 2, the magnetic body 3, the coil 4, the power supply circuit 5, the piston 60, and the cylinder 70. In this case, the n pistons 6 may be controlled individually to move up and down, and therefore n droplets 14 can have their amounts controlled individually. As a result, n pieces of crystalline silicon 20 to be produced in n locations on the substrate 11 can be controlled individually.

When the controller 15 or 15A and the temperature detector 30 are further employed in the crystal manufacturing apparatus 10C including n sets (each including a spring 2, a magnetic body 3, a coil 4, a power supply circuit 5, a piston 6, and a cylinder 7), n pieces of crystalline silicon 20 to be produced on the substrate 11 can be controlled further individually.

Furthermore, in the crystal manufacturing apparatus 10C, the small holes 701 to 70n do not have to be arranged in a line, but may be arranged radially, concentrically or in an arbitrary shape.

In the foregoing description, a droplet 14 (or 141) is solidified into crystalline silicon 20, but in the embodiment of the present invention, the droplet 14 (or 141) may be used as a heat source to produce crystalline silicon.

Figure 18:
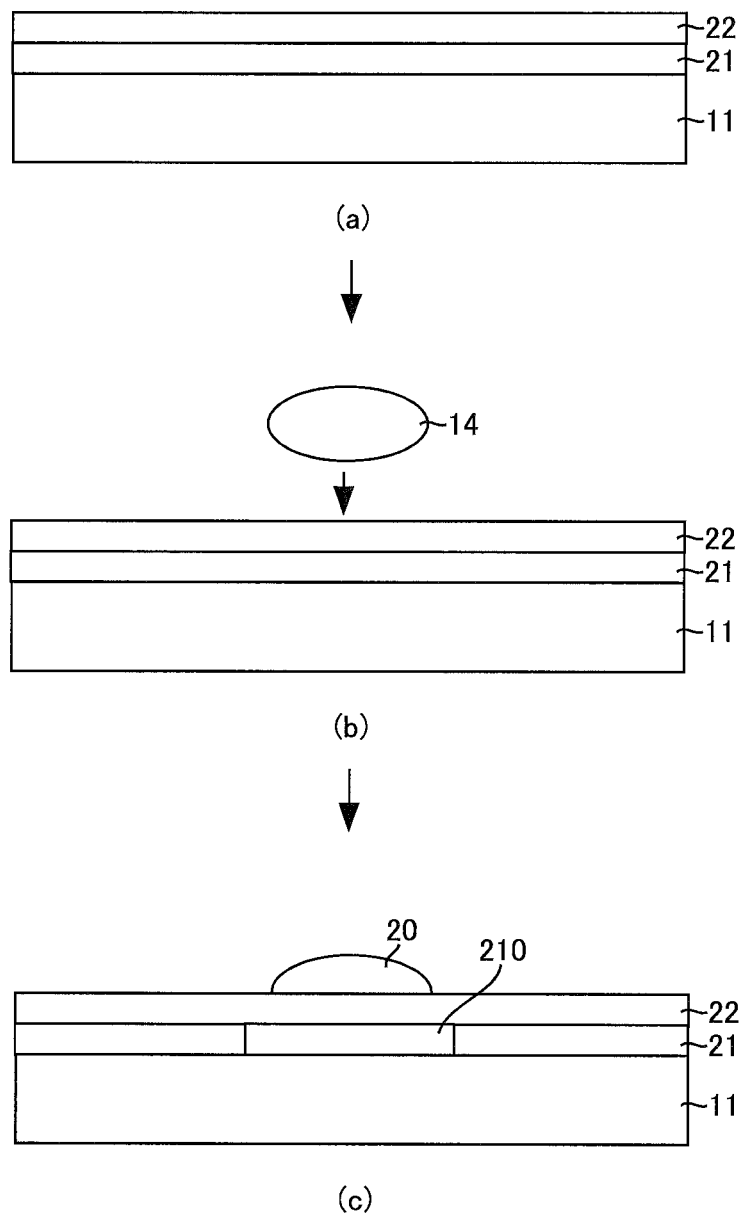
FIG. 18 is a process chart for illustrating a method of manufacturing crystalline silicon using a droplet as a heat source.

FIG. 18 is a process chart showing a process of producing crystalline silicon using a droplet as a heat source. Referring to FIG. 18, an amorphous silicon (a-Si:H) film 21 is deposited on a substrate 11 using a silane ($SiH_4$) gas as a material by plasma CVD (Chemical Vapor Deposition) and then a silicon oxide film 22 is deposited on the a-Si:H film 21 using a $SiH_4$ gas and an oxygen ($O_2$) gas as material gases by plasma CVD (see step (a)).

Thereafter, the substrate 11, the a-Si:H film 21 thereon, and the silicon oxide film 22 thereon are set on the XY stage 12 of the crystal manufacturing apparatus 10 and a droplet 14 is discharged to a desired position on the silicon oxide film 22 by the above-described method (see step (b)).

Then, the droplet 14 arriving on the silicon oxide film 22 is solidified into crystalline silicon 20 and a region of the a-Si:H film 21 under the crystalline silicon 20 is crystallized by heat from the droplet 14, so that crystalline silicon 210 is produced in the a-Si:H film 21 (see step (c)).

In this case, when the droplet 14 is deposited transversely to the crystalline silicon 20 as required, the entire a-Si:H film 21 can be crystallized.

In this way, according to the embodiment, using any of crystal manufacturing apparatuses 10, 10A, 10B, and 10C, the droplet 14 (or 141) can be used as a heat source, so that crystalline silicon can be produced.

Note that in the crystal manufacturing apparatuses 10, 10A, 10B, and 10C, the substrate 11 may be held so that the angle formed between the in-plane direction of the substrate 11 and the discharging direction of a droplet 14 (or 141) is smaller than 90°. In this way, a droplet 14 (or 141) arriving on the substrate 11 spreads in the in-plane direction of the substrate 11 depending on the inclination of the substrate 11, so that thin-film type crystalline silicon can be produced.

Figure 19:
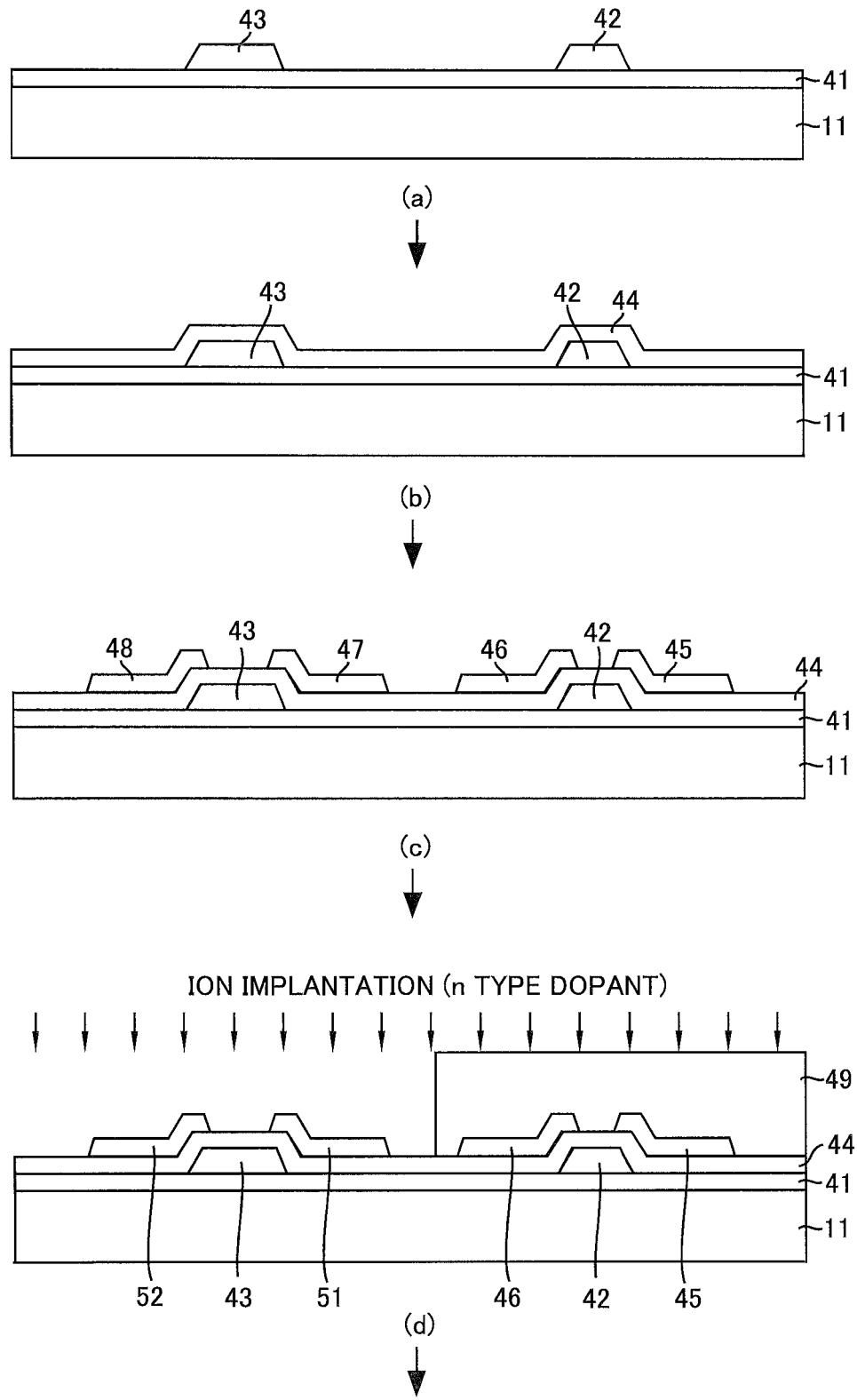
FIG. 19 is a first process chart for illustrating a method of manufacturing a TFT according to an embodiment of the present invention.
Figure 20:
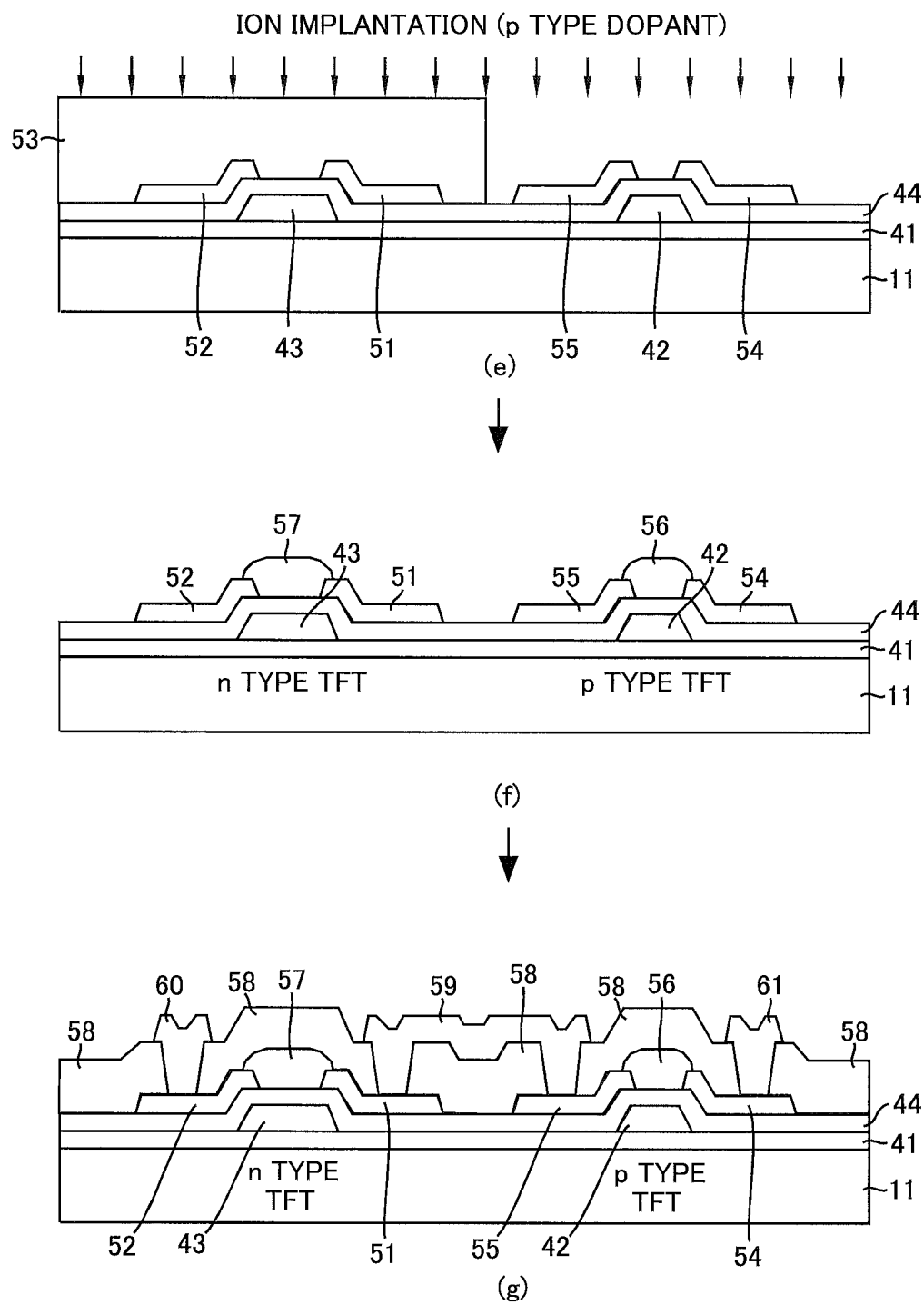
FIG. 20 is a second process chart for illustrating the method of manufacturing a TFT according to the embodiment.

FIGS. 19 and 20 are first and second process charts showing a method of manufacturing a TFT according to an embodiment of the present invention.

Referring to FIG. 19, a buffer layer 41 including $SiO_2$ or $SiO_2/SiN_x$ is formed by plasma CVD on a substrate 11 made of a glass substrate. In this case, the film thickness of the buffer layer 41 is for example about 200 nm. Metal including any of tungsten (W), molybdenum (Mo), chromium (Cr), and tantalum (Ta) is deposited on the buffer layer 41 and the deposited metal is patterned by photolithography to produce gate electrodes 42 and 43 on the buffer layer 41 (see step (a)).

A gate insulating film 44 including a silicon oxide film is then produced to cover the gate electrodes 42 and 43 by plasma CVD (see step (b)). Then, a polysilicon film is formed on the entire surface by plasma CVD, and the thus formed polysilicon film is patterned by photolithography into polysilicon films 45 to 48 (step (c)).

Then, photoresist is coated on the entire surface of the sample, and the coated photoresist is patterned by photolithography, so that a photoresist layer 49 is formed to cover the gate electrode 42 and the polysilicon films 45 and 46. Then, an n-type dopant (such as phosphorus (P)) is implanted by ion implantation. In this way, n-type polysilicon films 51 and 52 are produced from the polysilicon films 47 and 48, respectively (see step (d)).

Referring to FIG. 20, after removal of the photoresist layer 49, photoresist is coated on the entire surface of the sample and the coated photoresist is patterned by photolithography, so that a photoresist layer 53 is formed to cover the gate electrode 43 and the n-type polysilicon films 51 and 52. Then, a p-type dopant (such as boron (B)) is implanted by ion implantation. In this way, p-type polysilicon films 54 and 55 are produced from the polysilicon films 45 and 46, respectively (see step (e)).

Thereafter, the sample is set on the XY stage 12 of the crystal manufacturing apparatus 10 and droplets 14 are sequentially discharged on the gate electrodes 42 and 43 by the above-described method. In this way, crystalline silicon 56 connected to the p-type polysilicon films 54 and 55 is formed on the gate electrode 42 and crystalline silicon 57 connected to the n-type polysilicon films 51 and 52 is formed on the gate electrode 43 (see step (f)).

Note that in step (f), an amorphous silicon film about as thin as 2 nm to 10 nm is formed on the gate insulating film 44 between the p-type polysilicon films 54 and 55 and on the gate insulating film 44 between the n-type polysilicon films 51 and 52, and droplets 14 may be discharged on the amorphous silicon film to produce the crystalline silicon 56 and 57. In this case, the amorphous silicon film is crystallized by arriving droplets 14 and integrated with the crystalline silicon 56 and 57. In this way, an amorphous silicon film about as thin as 2 nm to 10 nm is formed on the gate insulating film 44, so that the adhesion between the gate insulating film 44 and the crystalline silicon 56 and 57 can be improved and the interface state density at the interface between the gate insulating film 44 and the crystalline silicon 56 and 57 can be reduced.

After step (f), a silicon oxide film is formed on the entire surface of the sample by plasma CVD, and photoresist is coated on the produced silicon oxide film. Then, the coated photoresist is patterned by photolithography and the silicon oxide film is etched using the patterned photoresist as a mask to form an interlayer insulating film 58. Then, a drain electrode 59 is formed to be connected to the n-type polysilicon film 51 and the p-type polysilicon film 55, a source electrode 60 is formed to be connected to the n-type polysilicon film 52, and a source electrode 61 is formed to be connected to the p-type polysilicon film 54. In this way, an n-type TFT and a p-type TFT are completed (see step (g)).

In the completed p-type TFT, the crystalline silicon 56 produced by solidifying a droplet 14 using the crystal manufacturing apparatus 10 is used as a channel layer. In the n-type TFT, the crystalline silicon 57 produced by solidifying a droplet 14 using the crystal manufacturing apparatus 10 is used as a channel layer.

Using a conventional process of manufacturing a TFT, a channel layer is produced by steps A to D instead of step (f) described above. In the step A, a polysilicon film is produced to cover the n-type polysilicon films 51 and 52 and the p-type polysilicon films 54 and 55 by plasma CVD, in the step B, photoresist is coated on the produced polysilicon film, in the step C, the coated photoresist is patterned by photolithography and photoresist is formed on the gate electrodes 42 and 43, and in the step D, the polysilicon film is etched using the photoresist as a mask and a channel layer is formed on the gate electrodes 42 and 43.

Therefore, using the crystal manufacturing apparatus 10 according to the embodiment, the four steps A to D can be implemented by a single step and therefore the number of steps can considerably be reduced.

The crystalline silicon 56 (or 57) as a channel layer is produced by a single droplet 14 discharged from a small hole 71 in the cylinder 7 and therefore the materials can be used more effectively as compared to the conventional process of manufacturing a channel layer by etching away an excess polysilicon film.

Furthermore, damages caused by etching can be reduced, so that TFTs with better characteristics can be produced.

Furthermore, the number of times to use photoresist can be reduced, which reduces the cost of materials.

Note that when TFTs are produced using steps (a) to (g) shown in FIGS. 19 and 20, droplets 14 may be solidified using the crystal manufacturing apparatus 10 in step (c) to produce polysilicon films 45 to 48. In this way, when the polysilicon films 45 to 48 are produced, the above-described four steps A to D can be implemented by a single step. As a result, the number of steps can be reduced more greatly. The materials can be used more effectively. In addition, damages caused by etching can further be reduced, so that the characteristics of TFTs can further be improved.

Figure 21:
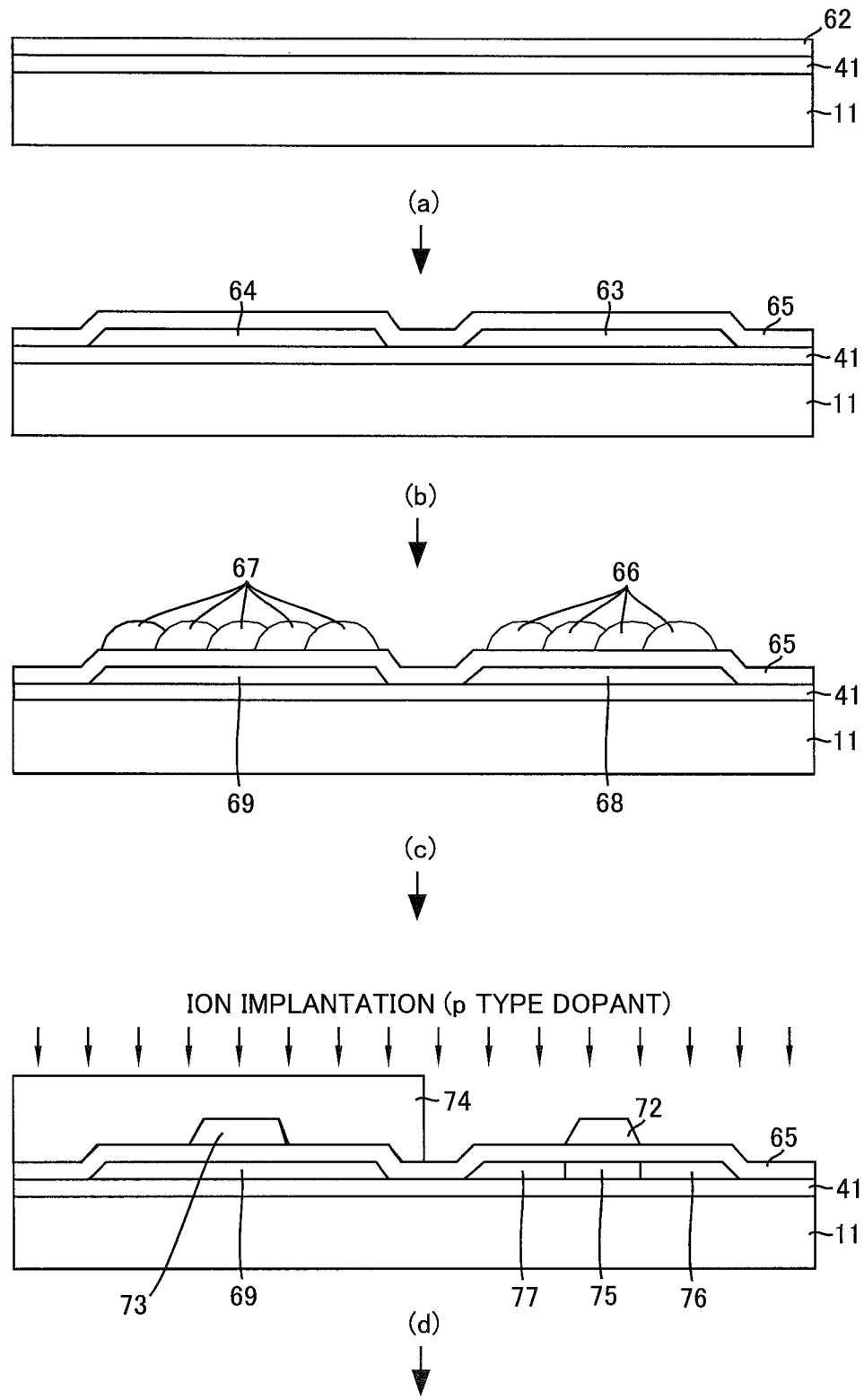
FIG. 21 is a third process chart for illustrating the method of manufacturing a TFT according to the embodiment.
Figure 22:
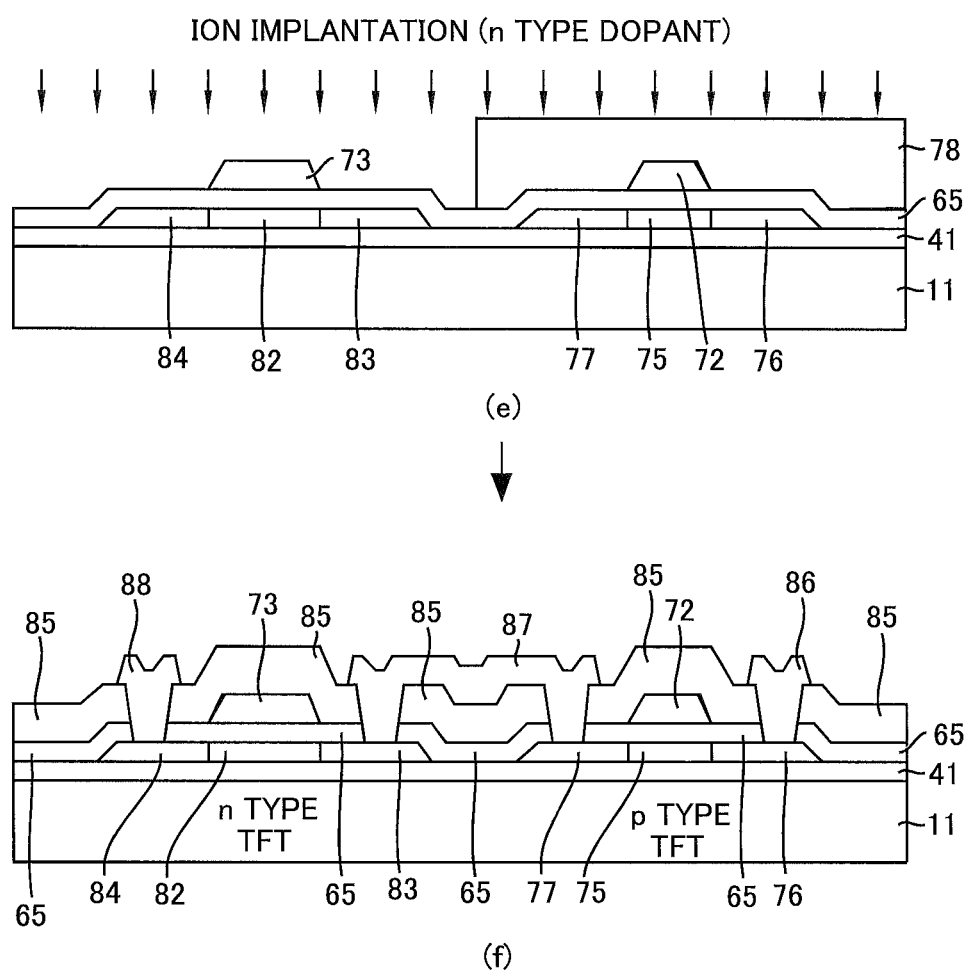
FIG. 22 is a fourth process chart for illustrating the method of manufacturing a TFT according to the embodiment.

FIGS. 21 and 22 show third and fourth process charts showing the method of manufacturing a TFT according to the embodiment.

Referring to FIG. 21, the buffer layer 41 is produced on the substrate 11 by the above-described method, and an amorphous silicon film 62 is produced on the buffer layer 41 by plasma CVD (see step (a)).

Then, the amorphous silicon film 62 is patterned by photolithography into amorphous silicon films 63 and 64. Thereafter, a gate insulating film 65 made of a silicon oxide film is produced to cover the amorphous silicon films 63 and 64 by plasma CVD (see step (b)).

Then, the sample is set on the XY stage 12 of the crystal manufacturing apparatus 10, a plurality of droplets 14 are discharged on the amorphous silicon film 63 and another plurality of droplets 14 are discharged on the amorphous silicon film 64. As a result, a plurality of pieces of crystalline silicon 66 are produced on the gate insulating film 65 and crystalline silicon 68 is produced from the amorphous silicon film 63 under the plurality of pieces of crystalline silicon 66. A plurality of pieces of crystalline silicon 67 are produced on the gate insulating film 65 and crystalline silicon 69 is produced from the amorphous silicon film 64 under the plurality of pieces of crystalline silicon 67 (see step (c)).

Then, the pieces of crystalline silicon 66 and 67 are removed by a liquid mixture of hydrofluoric acid and nitric acid, and Al is provided on the entire surface of the gate insulating film 65 by vapor deposition. The Al is patterned into gate electrodes 72 and 73 by photolithography. Then, photoresist is coated on the entire surface, and the coated photoresist is patterned by photolithography, so that photoresist 74 is produced to cover the crystalline silicon 69 and the gate electrode 73. Then, a p-type dopant is implanted by ion implantation. In this way, crystalline silicon 75 and p-type crystalline silicon 76 and 77 are produced from the crystalline silicon 68. In this case, the crystalline silicon 75 is produced under the gate electrode 72 and the pieces of p-type crystalline silicon 76 and 77 are produced on both sides of the crystalline silicon 75 (see step (d)).

Referring to FIG. 22, after step (d), the photoresist 74 is removed, and photoresist is newly coated on the entire surface of the sample. The coated photoresist is patterned by photolithography and photoresist 78 is provided to cover the gate electrode 72, the crystalline silicon 75, and the p-type crystalline silicon 76 and 77. Thereafter, an n-type dopant is implanted by ion implantation using the photoresist 78 as a mask. In this way, crystalline silicon 82 and n-type crystalline silicon 83 and 84 are produced from the crystalline silicon 69. In this case, the crystalline silicon 82 is produced under the gate electrode 73 and the pieces of n-type crystalline silicon 83 and 84 are produced on both sides of the crystalline silicon 82 (see step (e)).

After step (e), the photoresist 78 is removed, and a silicon oxide film is produced on the entire surface of the sample. Thereafter, photoresist is coated on the silicon oxide film and the coated photoresist is patterned by photolithography and the silicon oxide film and the gate insulating film 65 are etched to form an interlayer insulating film 85 using the patterned photoresist as a mask. A source electrode 86 is produced to be connected to the p-type crystalline silicon 76, a drain electrode 87 is produced to be connected to the p-type crystalline silicon 77 and the n-type crystalline silicon 83, and a source electrode 88 is produced to be connected to the n-type crystalline silicon 84. In this way, an n-type TFT and p-type TFT are completed (see step (f)).

In this way, when TFTs are produced according to steps (a) to (f) shown in FIGS. 21 and 22, the pieces of crystalline silicon 75 and 82 produced indirectly by discharging droplets 14 are used as channel layers.

Similarly to the case of manufacturing TFTs according to steps (a) to (g) shown in FIGS. 19 and 20, when TFTs are produced according to steps (a) to (f) shown in FIGS. 21 and 22, various advantages are provided over the conventional process of manufacturing TFTs.

Figure 23:
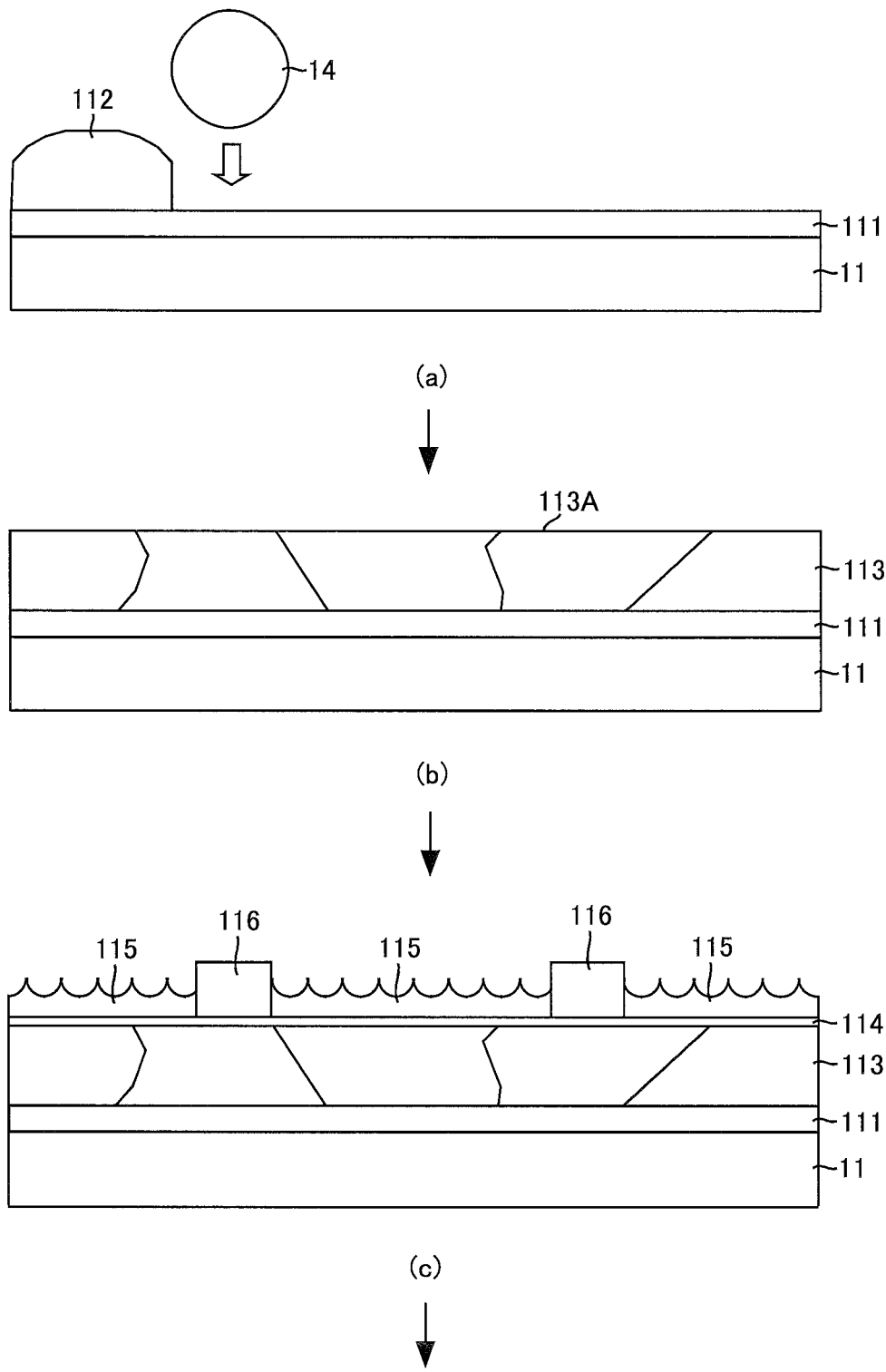
FIG. 23 is a first process chart for illustrating a method of manufacturing a solar cell according to an embodiment of the present invention.
Figure 24:
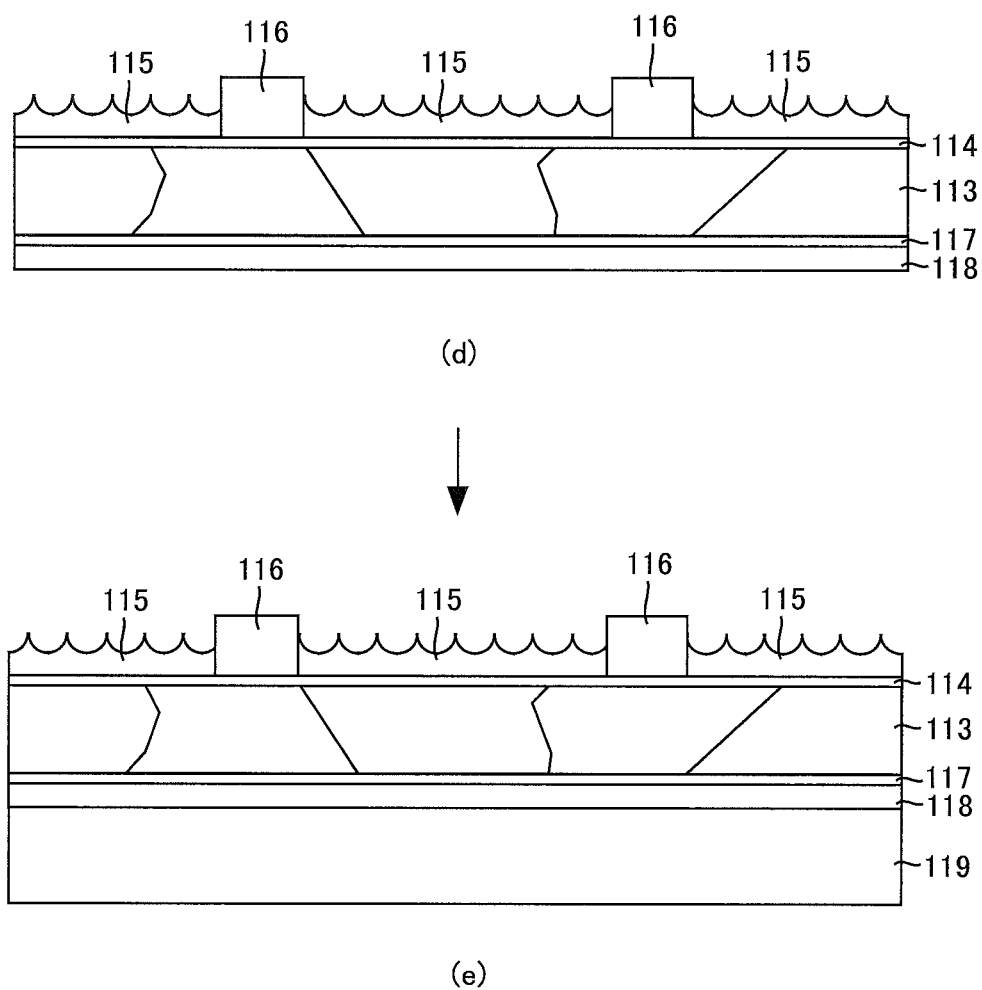
FIG. 24 is a second process chart for illustrating the method of manufacturing a solar cell according to the embodiment.

FIGS. 23 and 24 are first and second process charts showing a method of manufacturing a solar cell according to an embodiment of the present invention.

Referring to FIG. 23, a sacrificing layer 111 is produced on a substrate 11, and the substrate 11 having the sacrificing layer 111 thereon is set on the XY-stage 12 of the crystal manufacturing apparatus 10. In this case, the sacrificing layer 111 is made of a silicon oxide film or a porous Si layer that can easily be separated from the substrate 11.

Using the crystal manufacturing apparatus 10, droplets 14 are discharged to the sacrificing layer 111 to produce crystalline silicon 112. Then, droplets 14 are discharged to a position adjacent to the crystalline silicon 112, so that new crystalline silicon is produced to adhere to the crystalline silicon 112 (see step (a)).

The process is repeatedly carried out, and a power generation layer 113 made of polysilicon is produced on the entire surface of the sacrificing layer 111 (see step (b)).

Thereafter, P is ion-implanted or is diffused as an impurity to the power generation layer 113 on the side of an upper surface 113A, so that an n-layer 114 is produced. Then, a transparent conductive film 115 made of ITO (Indium Tin Oxide) or $SnO_2$ is produced on the entire surface of the n-layer 114. The surface of the transparent conductive film 115 is textured. Subsequently, photoresist is coated on the transparent conductive film 115 and the coated photoresist is patterned by photolithography, the transparent conductive film 115 is etched using the patterned photoresist as a mask, and then Al is provided on the entire surface by vapor deposition. After removal of the photoresist, an n-side electrode 116 connected to the n-layer 114 is produced (see step (c)). Note that in step (c), a junction may be formed by depositing the n-layer 114 by plasma CVD.

Referring to FIG. 24, the sacrificing layer 111 (silicon oxide film) is removed by hydrofluoric acid and the layered structure including the n side electrode 116, the transparent conductive film 115, the n-layer 114, and the power generating layer 113 is separated from the substrate 11. Then, B is ion-implanted or s diffused as an impurity on a surface opposite to the side of the p-layer 114 of the power generating layer 113 to produce a p-layer 117, and Al is vapor-deposited on the p-layer 117, so that a p-side electrode 118 is produced (see step (d)). The sample is adhered to a final substrate 119 to complete a solar cell (see step (e)).

Note that in FIGS. 23 and 24, an insulating film and glass are used as the sacrificing layer 111 and the substrate 11, respectively, but porous Si and a Si wafer may be used in the embodiment. In this case, the Si wafer can be reused, and when a droplet 14 is discharged on the porous Si, crystalline silicon having its orientation controlled can be grown.

When TFTs are produced using steps (a) to (g) shown in FIGS. 19 and 20, steps (a) to (e) constitute a first step of producing an underlying layer including a semiconductor layer (n-type polysilicon films 51 and 52 and p-type polysilicon films 54 and 55) formed on a hetero-substrate 11 (a glass or plastic substrate) including a material different from semiconductor.

Step (a) constitutes a first sub step of producing the gate electrodes 42 and 43 on the hetero-substrate 11, step (b) constitutes a second sub step of producing an insulating layer (gate insulating film 44) on the gate electrodes 42 and 43, steps (c) to (e) constitute a third sub step of producing first and second semiconductor regions (the n-type polysilicon films 51 and 52 and the p-type polysilicon films 54 and 55) including a dopant on an insulating layer (gate insulating film 44).

Step (f) constitutes a second step of manufacturing crystalline semiconductor by discharging a droplet of a constituent element of semiconductor in a desired position on the hetero-substrate 11 at a desired initial speed.

Step (g) constitutes a third step of producing semiconductor devices (TFTs) using the produced crystalline semiconductor and the underlying layer (the n-type polysilicon films 51 and 52 and the p-type polysilicon films 54 and 55).

When TFTs are produced using steps (a) to (f) shown in FIGS. 21 and 22, steps (a) and (b) constitute a first step of producing an underlying layer including a semiconductor layer (the amorphous silicon films 63 and 64)/an insulating layer (the gate insulating film 65) formed on the hetero-substrate 11 (a glass or plastic substrate).

Step (a) constitutes a first sub step of producing an amorphous layer (amorphous silicon films 63 and 64) on a hetero-substrate, and step (b) constitutes a second sub step of producing an insulating layer (gate insulating film 65) on the amorphous layer (amorphous silicon films 63 and 64).

Step (c) constitutes a second step of producing a crystalline semiconductor layer (crystalline silicon 68 and 69) by discharging a droplet of a constituent element of the semiconductor to a desired position on the hetero-substrate 11 at a desired initial speed.

Furthermore, steps (d) to (f) constitute a third step of producing a semiconductor device using the produced crystalline semiconductor layer (crystalline silicon 68 and 69).

When a solar cell is produced using steps (a) to (e) shown in FIGS. 23 and 24, in step (a), the step of producing a sacrificing layer 111 on a substrate 11 constitutes a first step of producing an underlying layer including a semiconductor layer (sacrificing layer 111) formed on a hetero-substrate 11 (glass or plastic substrate) including a different material from the semiconductor.

Steps (a) and (b) constitute a second step of producing a crystalline semiconductor layer (power generating layer 113) by discharging a droplet including a constituent element of semiconductor to a desired position on a hetero-substrate 11 at a desired initial speed.

In step (a), the step of producing crystalline silicon 112 by discharging a droplet 14 on the sacrificing layer 111 on the substrate 11 constitutes a first sub step of producing a first crystalline grain by discharging a droplet on an underlying layer including a holding substrate and a delamination layer formed on the holding substrate, the step of producing crystalline silicon by discharging a droplet 14 in contact with the crystalline silicon 112 constitutes a second sub step of producing a second crystal grain by discharging a droplet on the underlying layer in contact with the crystal grain (crystalline silicon 112) already produced in the in-plane direction of the holding substrate, the step of producing crystalline silicon 112 by discharging a droplet 14 until the crystalline silicon 112 is produced on the entire surface of the substrate 11 constitutes a third sub step of repeatedly carrying out the second sub step until a crystalline semiconductor layer having a desired area is produced on an underlying layer.

Furthermore, steps (c) to (e) constitute a third step of producing a semiconductor device using the produced crystalline semiconductor layer (power generating layer 113).

The substrates used in the step of producing TFTs shown in FIGS. 19 and 20, the step of producing TFTs shown in FIGS. 21 and 22 and the step of producing a solar cell shown in FIGS. 23 and 24 may be a semiconductor substrate, and therefore the above-described underlying layer includes a semiconductor layer formed on a substrate of a hetero-substrate or a semiconductor substrate or a semiconductor layer and an insulating layer formed on the substrate.

In a step of producing a non-volatile memory including a source, a drain, a channel layer, a gate, and a recording layer formed between the channel layer and the gate, when the recording layer is produced using a crystalline semiconductor layer, the underlying layer includes an insulating film formed on the substrate.

Therefore, the underlying layer generally includes any of a semiconductor layer formed on a substrate, an insulating layer formed on a substrate, and a semiconductor layer and an insulating layer formed on a substrate.

An example of using a single crystalline silicon substrate as the substrate 11 will be described. When a single crystalline silicon substrate is used as the substrate 11, the single crystalline silicon substrate is cleaned by RCA cleaning, then immersed in about 0.1% dilute hydrofluoric acid, and then cleaned with pure water for 10 minutes. The single crystalline silicon substrate is treated with dilute hydrofluoric acid, so that the surface of the single crystalline silicon substrate can be terminated with hydrogen.

Note that the surface of the single crystalline silicon substrate may be oxidized at 1000° C., then the surface of the single crystalline silicon substrate may be etched by dilute hydrofluoric acid, then rinsed with pure water and terminated with hydrogen. Using this method, the surface of the single crystalline silicon substrate may be kept flat.

The surface of the single crystalline silicon substrate may be etched using buffered hydrofluoric acid (BHF) whose pH is from 9 to 10 or the single crystalline silicon substrate may be cleaned by boiled pure water and have its surface terminated with hydrogen. If the method is employed, the hydrogen bonding state (monohydride or dihydride) at the surface of the single crystalline silicon substrate can be controlled.

After being cleaned, the single crystalline silicon substrate is placed on the XY stage 12 of the crystal manufacturing apparatus 10.

Note that the single crystalline silicon substrate has any of the following orientations: a just (exact) (100) plane, a just (110) plane, a just (111) plane, a 4 degree off plane from (100), a 4 degree off plane from (110) and a 4 degree off plane from (111).

Figure 25:
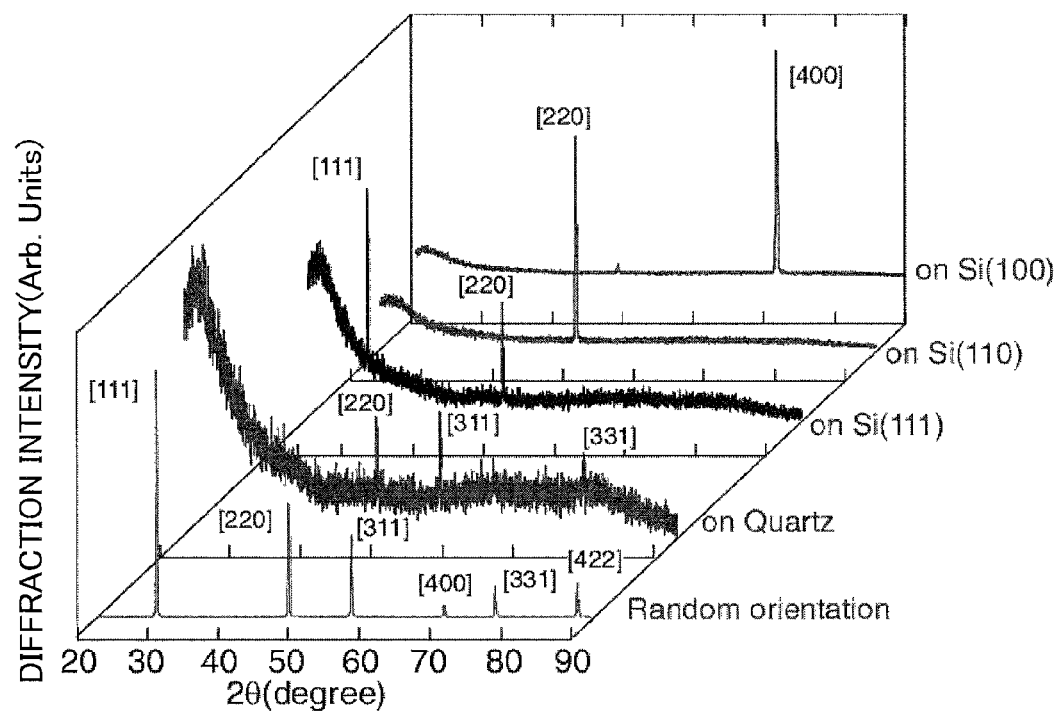
FIG. 25 shows an X-ray diffraction spectrum.

FIG. 25 shows an X-ray diffraction spectrum. In FIG. 25, the abscissa represents a diffraction angle (2θ) and the ordinate represents diffraction intensity. FIG. 25 shows measurement results of X-ray diffraction of crystalline silicon formed on a single crystalline silicon substrate having a (100) plane, crystalline silicon formed on a single crystalline silicon substrate having a (110) plane, crystalline silicon formed on a single crystalline silicon substrate having a (111) plane, and crystalline silicon formed on a quartz substrate. FIG. 25 also includes a measurement result of X-ray diffraction of a randomly oriented material for the purpose of comparison.

Referring to FIG. 25, when crystalline silicon is produced by the crystal manufacturing apparatus 10 using a single crystalline silicon substrate having a (100) plane as a substrate 11, the crystalline silicon has the (400) orientation which is the same orientation as the (100) orientation of the single crystalline silicon substrate.

When the crystalline silicon is produced by the crystal manufacturing apparatus 10 using a single crystalline silicon substrate having a (110) plane as a substrate 11, the crystalline silicon has the (220) orientation that is the same orientation as the (110) orientation of the single crystalline silicon.

Furthermore, when crystalline silicon is produced by the crystal manufacturing apparatus 10 using a single crystalline silicon substrate having a (111) plane as a substrate 11, the crystalline silicon has the (220) orientation and the (111) orientation.

Furthermore, when crystalline silicon is produced by the crystal manufacturing apparatus 10 using a quartz substrate as a substrate 11, the crystalline silicon has the (331) orientation, the (311) orientation, and the (220) orientation that are close to random orientation.

Therefore, it has been demonstrated that when single crystalline silicon having the (100) orientation or the (110) orientation is used as the substrate 11, crystalline silicon having the same orientation as that of the single crystalline silicon substrate can be produced.

Figure 26:
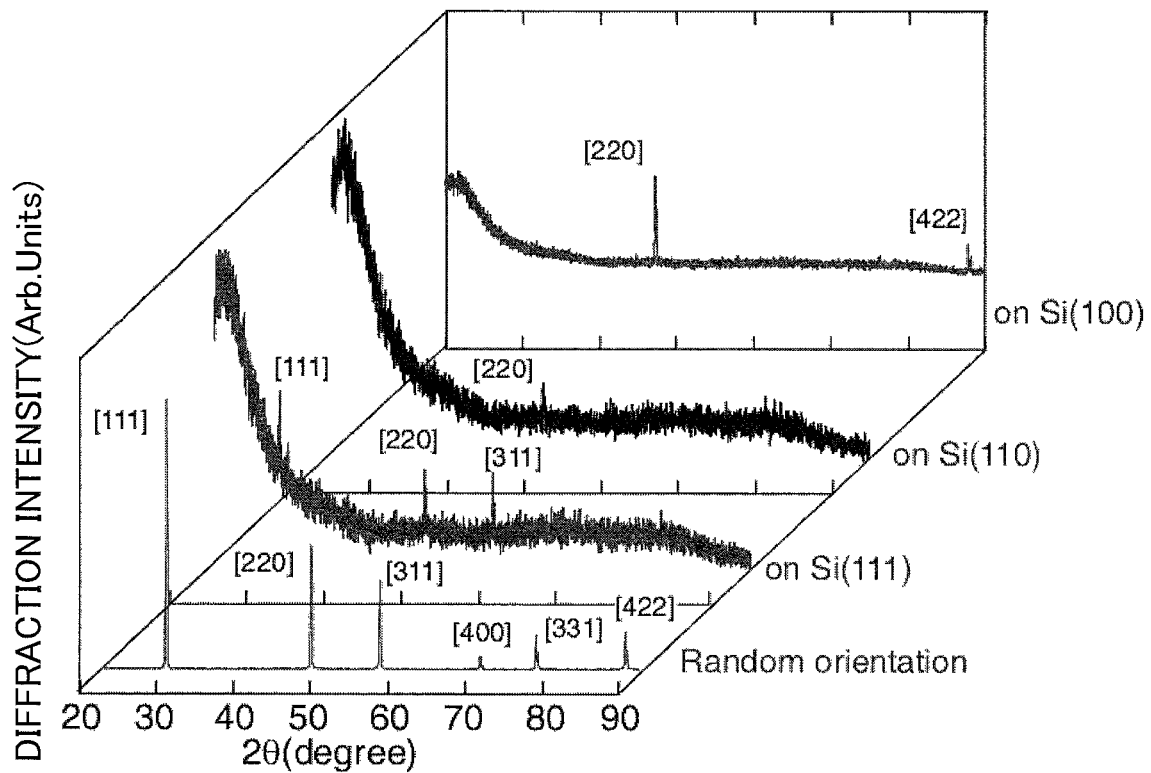
FIG. 26 shows another X-ray diffraction spectrum.

FIG. 26 is a graph showing another X-ray diffraction spectrum. Note that FIG. 26 shows an X-ray diffraction spectrum of crystalline silicon produced by the crystal manufacturing apparatus 10 without terminating the surface of a single crystalline silicon substrate with hydrogen.

In FIG. 26, the abscissa represents a diffraction angle (2θ) and the ordinate represents diffraction intensity. FIG. 26 shows measurement results of X-ray diffraction of crystalline silicon formed on a single crystalline silicon substrate having a (100) plane, crystalline silicon formed on a single crystalline silicon substrate having a (110) plane, and crystalline silicon formed on a single crystalline silicon substrate having a (111) plane. FIG. 26 also includes measurement results of X-ray diffraction of a randomly oriented material for reference.

Referring to FIG. 26, when crystalline silicon is produced by the crystal manufacturing apparatus 10 using a single crystalline silicon substrate having a (100) plane as the substrate 11, crystalline silicon has the (220) orientation and the (442) orientation that are different from the (100) orientation of the single crystalline silicon substrate.

When crystalline silicon is produced by the crystal manufacturing apparatus 10 using a single crystalline silicon substrate having a (110) plane as the substrate 11, crystalline silicon has the (220) orientation but its diffraction intensity is very small.

Furthermore, when crystalline silicon is produced by the crystal manufacturing apparatus 10 using a single crystalline silicon substrate having a (111) plane as the substrate 11, the crystalline silicon has the (111) orientation, the (220) orientation, and the (311) orientation.

Therefore, if the surface of a single crystalline silicon substrate is not terminated with hydrogen, it is difficult to produce crystalline silicon that reflects the orientation of the single crystalline silicon substrate.

As a result, it has been demonstrated that using a single crystalline silicon substrate having its surface terminated with hydrogen, crystalline silicon having the same orientation as that of the single crystalline silicon substrate can be produced.

Crystalline silicon produced using a single crystalline silicon substrate having its surface terminated with hydrogen is readily removed off from the single crystalline silicon substrate.

On the other hand, crystalline silicon produced using a single crystalline silicon substrate whose surface is not terminated with hydrogen is hardly removed off from the single crystalline silicon substrate. An experiment to determine if such crystalline silicon can be removed off from a single crystalline silicon substrate whose surface was not terminated with hydrogen was carried out ten times, and the crystalline silicon could not be removed off from the single crystalline silicon substrate in any of the ten cases.

It has therefore been demonstrated that terminating the surface of a single crystalline silicon substrate with hydrogen contributes to peeling off of crystalline silicon from the single crystalline silicon substrate.

Figure 27:
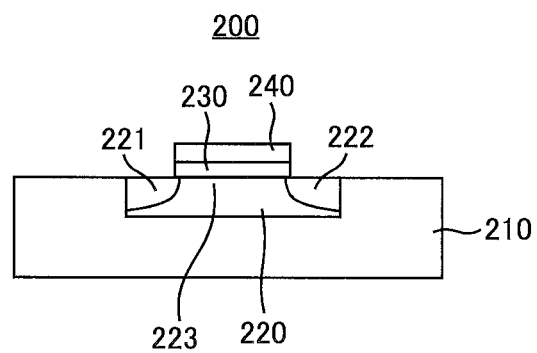
FIG. 27 is a sectional view of a TFT according to an embodiment of the present invention.

FIG. 27 is a sectional view of a TFT according to an embodiment of the present invention. Referring to FIG. 27, the TFT 200 according to the embodiment includes a hetero-substrate 210, crystalline silicon 220, an oxide film 230, and a gate electrode 240.

The hetero-substrate 210 generally includes a material different from semiconductor such as thermoplastic resin, examples of which include polycarbonate (PC), polymethylmethacrylate (PMMA), polyethersulfone (PES) and cyclic olefin type polymer (for example APEL™ available from Mitsui Chemicals, Inc.).

The crystalline silicon 220 is produced by a crystal manufacturing apparatus 10 using a single crystalline silicon substrate having its surface terminated with hydrogen. The crystalline silicon 220 has the same orientation as that of the single crystalline silicon substrate and is embedded within the hetero-substrate 210. In this case, the surface of the crystalline silicon 220 substantially coincides with the surface of the hetero-substrate 210.

The crystalline silicon 220 includes a source region 221, a drain region 222, and a channel region 223. The source region 221 and the drain region 222 each include n-type single crystalline silicon or p type single crystalline silicon. The region of the crystalline silicon 220 other than the source region 221 and the drain region 222 includes i-type single crystalline silicon.

Note that when the size of the single crystalline silicon 220 is large, a plurality of TFTs can be formed in one piece of crystalline silicon 220.

The oxide film 230 includes $SiO_2$ and is on and in contact with the channel region 223 of the crystalline silicon 220. A gate electrode 240 includes for example Al and is formed on and in contact with the oxide film 230.

Figure 28:
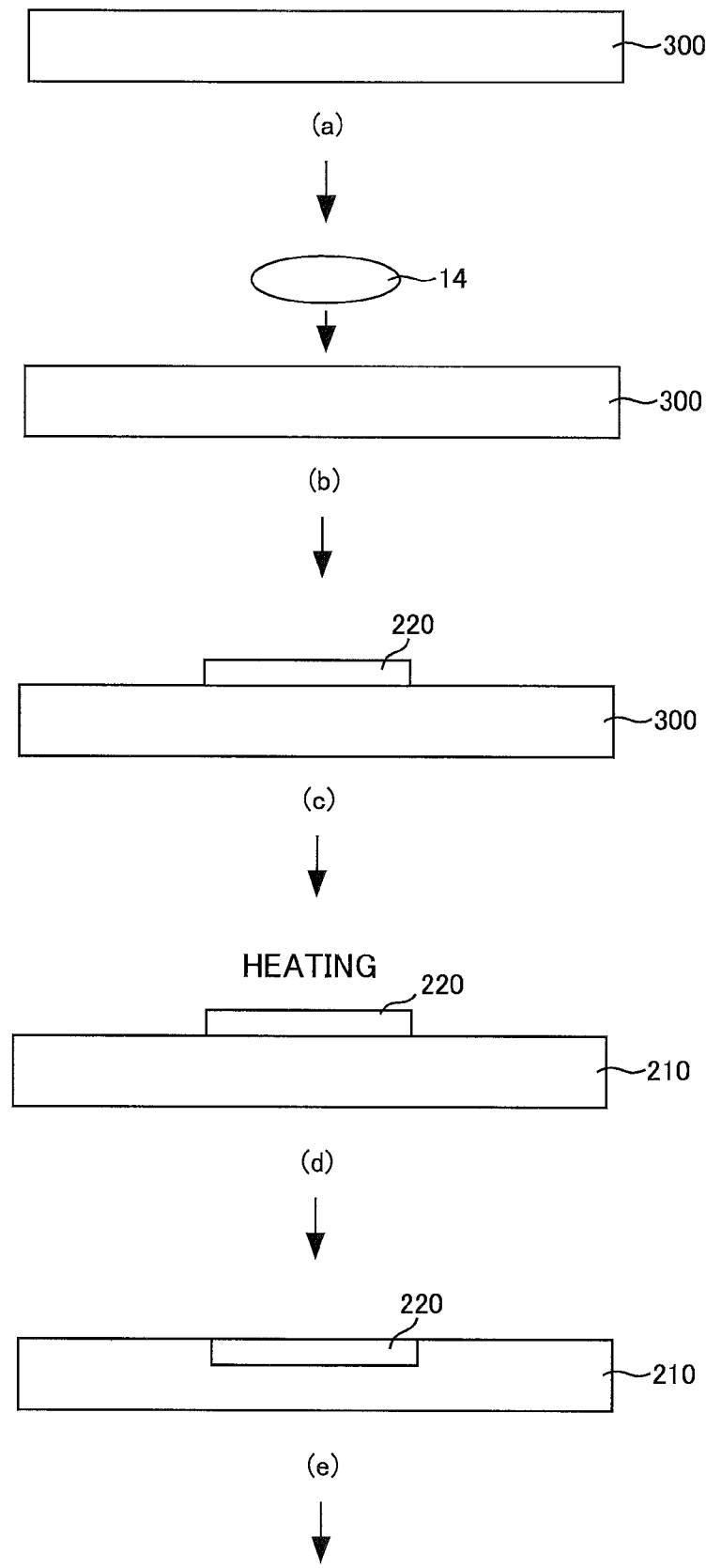
FIG. 28 is a first process chart for illustrating a method of manufacturing the TFT shown in FIG. 27.
Figure 29:
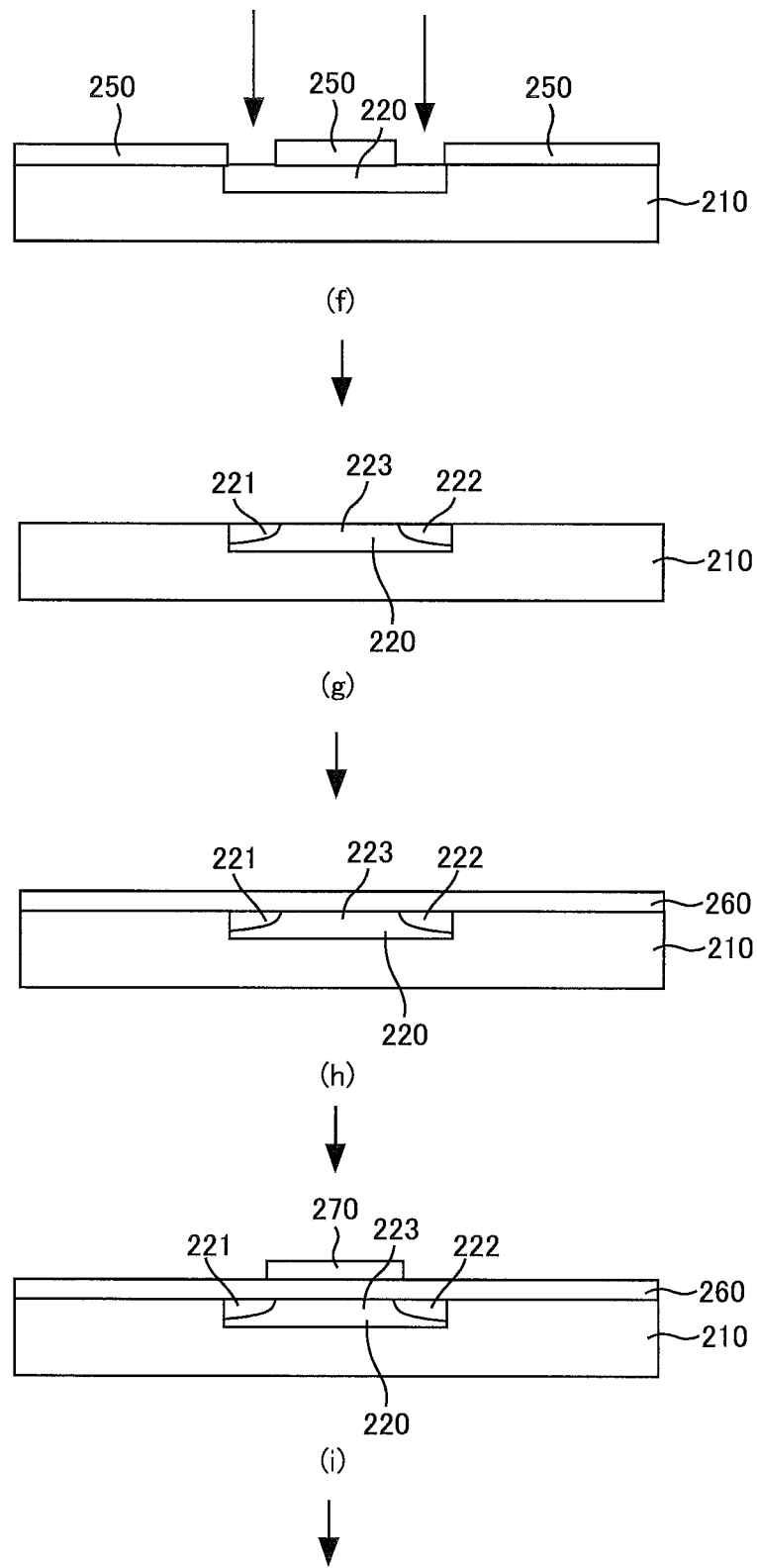
FIG. 29 is a second process chart for illustrating the method of manufacturing the TFT shown in FIG. 27.
Figure 30:
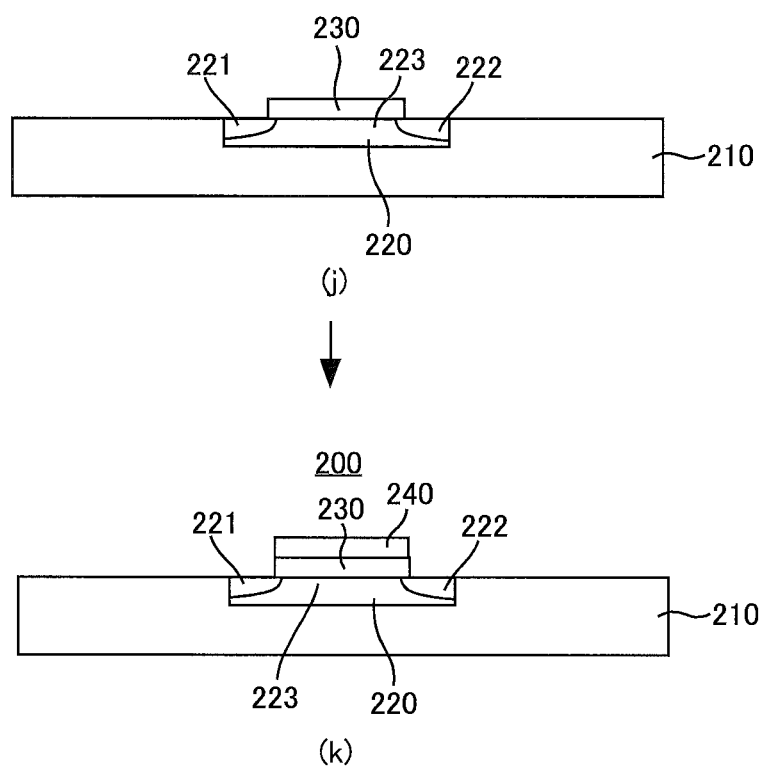
FIG. 30 is a third process chart for illustrating the method of manufacturing the TFT shown in FIG. 27.

FIGS. 28 to 30 are first to third process charts for illustrating a method of manufacturing a TFT 200 shown in FIG. 27.

Referring to FIG. 28, when the production of the TFT 200 starts, a single crystalline silicon substrate having the (100) orientation or the (110) orientation is subjected to RCA cleaning, then immersed in about 0.1% dilute hydrofluoric acid, followed by cleaning for 10 minutes with pure water. In this way, a single crystalline silicon substrate 300 having its surface terminated with hydrogen is obtained (step (a) in FIG. 28).

The single crystalline silicon substrate 300 is provided on the XY stage 12 of the crystal manufacturing apparatus 10.

Then, according to the above-described method, a droplet 14 is discharged to a desired position on the single crystalline silicon substrate 300 at an initial speed $v_0$ (see step (b) in FIG. 28). Upon arriving at the single crystalline silicon substrate 300, the droplet 14 is solidified while reflecting the orientation of the single crystalline silicon substrate 300.

As a result, the crystalline silicon 220 having the same orientation as that of the single crystalline silicon substrate 300 is formed on the single crystalline silicon substrate 300 (see step (c) in FIG. 28).

Then, the crystalline silicon 220 is removed from the single crystalline silicon substrate 300 and the removed crystalline silicon 220 is provided on the hetero-substrate 210 (see step (d) in FIG. 28). In this case, the crystalline silicon 220 is provided on the hetero-substrate 210 so that not only the orientation of the substrate but also the orientation of the direction in which current is passed are aligned. For example, the crystalline silicon 220 is arranged in the direction in which the source region 221 and the drain region 222 are formed so that the channel region 223 is formed along the <100> direction. In this way, the crystalline silicon in tree-axis orientation can be formed on the hetero-substrate.

Then, the hetero-substrate 210 is heated. Then, the hetero-substrate 210 made of thermoplastic resin is softened and the crystalline silicon 220 is gradually embedded into the hetero-substrate 210. When the crystalline silicon 220 is almost entirely embedded in the hetero-substrate 210, the hetero-substrate 210 is cooled. In this way, the hetero-substrate 210 is hardened while the crystalline silicon 220 is embedded therein (see step (e) in FIG. 28).

Referring to FIG. 29, after step (e), resist is coated on the entire surface of the hetero-substrate 210 having the crystalline silicon 220 embedded therein, and the coated resist is patterned by photolithography into a resist pattern 250 on the surfaces of the hetero-substrate 210 and the crystalline silicon 220.

Using the resist pattern 250 as a mask, a p-type dopant (such as B) or an n-type dopant (such as P) is implanted in the crystalline silicon 220 by ion-implantation (see step (f) in FIG. 29).

Thereafter, the resist pattern 250 is removed, and the source region 221, the drain region 222, and the channel region 223 are formed in the crystalline silicon 220 (see step (g) in FIG. 29).

Subsequently, an oxide film 260 including $SiO_2$ is formed on the entire surface of the sample by plasma CVD using a $SiH_4$ gas and a $N_2O$ gas as material gases (see step (h) in FIG. 29).

Resist is then coated on the entire surface of the oxide film 260 and the coated resist is patterned by photolithography into a resist pattern 270 on the surface of the oxide film 260. The oxide film 260 is etched using the resist pattern 270 as a mask, and then the resist pattern 270 is removed (see step (i) in FIG. 29).

As a result, an oxide film 230 is formed in contact with the channel region 223 of the crystalline silicon 220 (see step (j) in FIG. 30).

A gate electrode 240 is formed on the oxide film 230. In this way, the TFT 200 is completed (see step (k) in FIG. 30).

Note that the source region 221 and the drain region 222 may be formed in self-alignment after the gate electrode 240 is formed.

In this way, according to the embodiment, the crystalline silicon 220 having the same orientation as that of the single crystalline silicon substrate 300 can be produced while the produced crystalline silicon 220 can be removed easily from the single crystalline silicon substrate 300, and therefore a TFT using the crystalline silicon 220 can easily be produced on the hetero-substrate 210.

Note that in steps (a) to (k) described above, after the crystalline silicon 220 is embedded in the hetero-substrate 210, the source region 221, the drain region 222, and the channel region 223 are formed in the crystalline silicon 220 by ion-implantation. However, the embodiment is not limited to the arrangement and the source region 221, the drain region 222, and the channel region 223 may be formed in the crystalline silicon 220 after the crystalline silicon 220 is formed on the single crystalline silicon substrate 300, and then the crystalline silicon 220 may be removed from the single crystalline silicon substrate 300 and embedded in the hetero-substrate 210.

Figure 31:
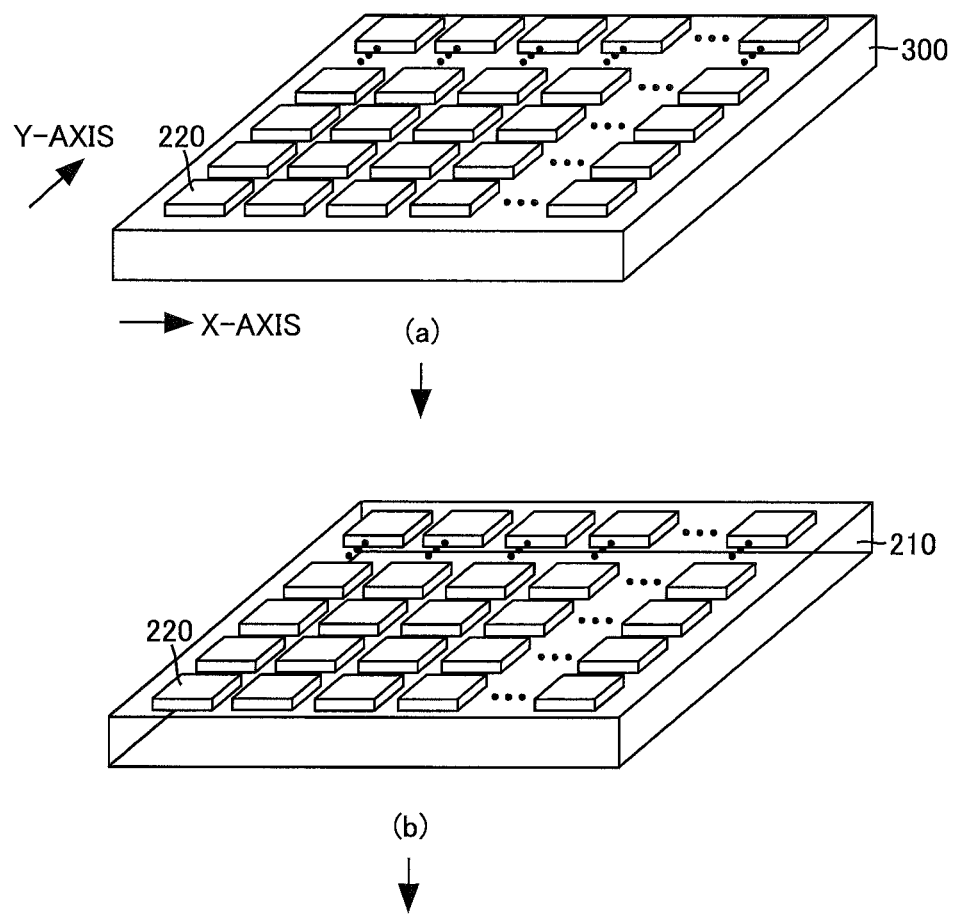
FIG. 31 is a partial process chart for illustrating a method of manufacturing TFTs arranged in a matrix.

FIG. 31 is a partial process chart for illustrating a method of manufacturing TFTs arranged in a matrix.

Referring to FIG. 31, when TFTs 200 are manufactured in a matrix, a single crystalline silicon substrate 300 having its surface terminated with hydrogen is provided at the XY stage 12 of the crystal manufacturing apparatus 10.

Then, while the XY stage 12 is moved in the X- and Y-directions, droplets 14 are discharged onto a desired position on the single crystalline silicon substrate 300 at an initial speed $v_0$, and pieces of crystalline silicon 220 are formed in a matrix on the single crystalline silicon substrate 300 (see step (a) in FIG. 31).

Then, the pieces of crystalline silicon 220 arranged in a matrix are placed on the hetero-substrate 210, and the hetero-substrate 210 is heated so that the plurality of pieces of crystalline silicon 220 are embedded in the hetero-substrate 210 (see step (b) in FIG. 31).

The pieces of crystalline silicon 220 are each subjected to steps (f) to (k) shown in FIGS. 29 and 30, and TFTs arranged in a matrix are produced on the hetero-substrate 210.

Also in this case, the pieces of the crystalline silicon 220 may be embedded in the hetero-substrate 210 after the source region 221, the drain region 222, and the channel region 223 are formed at each pieces of the crystalline silicon 220.

Note that in the foregoing description, in the crystalline silicon 220, the region other than the source region 221 and the drain region 222 is made of i-type single crystalline silicon, but the embodiment is not limited to this arrangement and the region other than the source region 221 and the drain region 222 in the crystalline silicon 220 may be n-type single crystalline silicon or p type single crystalline silicon.

When the region other than the source region 221 and the drain region 222 is made of n-type single crystalline silicon, the source and drain regions 221 and 222 are each made of p type single crystalline silicon. When the region other than the source region 221 and the drain region 222 is made of p type single crystalline silicon, the source and drain regions 221 and 222 are each made of n-type single crystalline silicon.

When TFTs arranged in a matrix are manufactured, the crystal manufacturing apparatus 10C is preferably used. In this way, the plurality of pieces of crystalline silicon 220 arranged in a matrix can be formed on the single crystalline silicon substrate 300 by moving the single crystalline silicon substrate 300 only in one of the X- and Y-directions.

Figure 32:
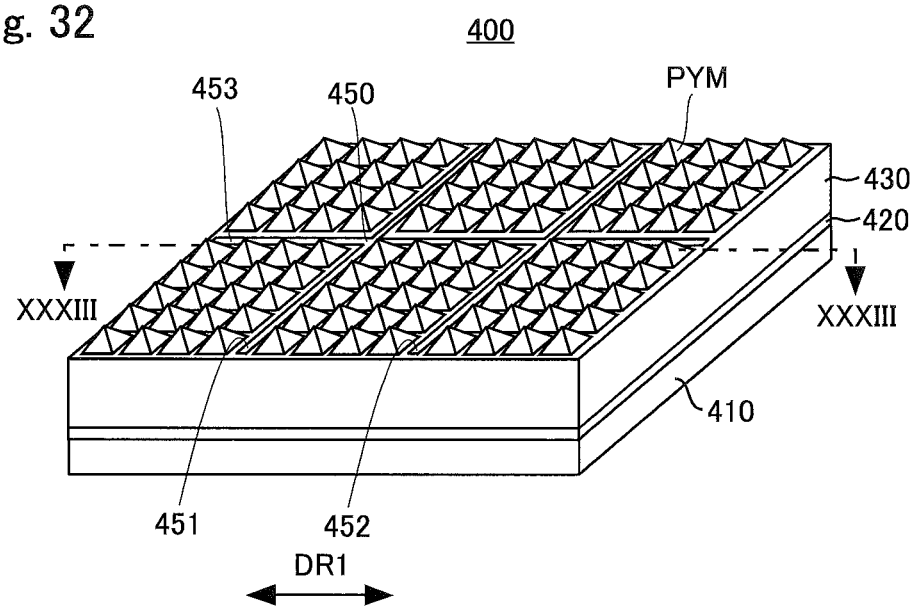
FIG. 32 is a perspective view of a solar cell according to an embodiment of the present invention.
Figure 33:
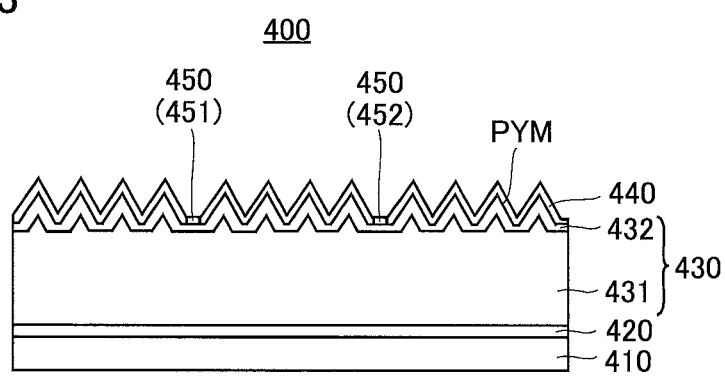
FIG. 33 is a sectional view of the solar cell taken along line XXXIII-XXXIII in FIG. 32.

FIG. 32 is a perspective view of a solar cell according to an embodiment of the present invention. FIG. 33 is a sectional view of the solar cell taken along line XXXIII-XXXIII in FIG. 32.

Referring to FIGS. 32 and 33, the solar cell 400 includes a hetero-substrate 410, a back electrode 420, crystalline silicon 430, an oxide film 440, and a surface electrode 450.

The hetero-substrate 410 is generally made of a material different from semiconductor such as glass and flexible substrates (such as resin). The back electrode 420 is for example made of silver (Ag) and formed between and in contact with the hetero-substrate 410 and the crystalline silicon 430. In this case, the back electrode 420 is in contact with the entire surface of the crystalline silicon 430.

The crystalline silicon 430 is formed on and in contact with the back electrode 420. The oxide film 440 is made of $SiO_2$ and formed on and in contact with the crystalline silicon 430. The oxide film 440 is about as thick as 0.2 µm.

The surface electrode 450 is for example made of Al and formed in a region without the oxide film 440 and on and in contact with the crystalline silicon 430. The surface electrode 450 includes a plurality of linear metals 451 and 452 arranged at a prescribed interval (such as several millimeters) in a direction DR1 and a linear metal 453 arranged along the direction DR1.

The linear metal 453 connects the plurality of linear metals 451 and 452. The plurality of linear metals 451 and 452 each have a width of several hundred µm and a thickness of about 1 mm, and the linear metal 453 has a width of about 2 mm and a thickness of several hundred µm.

The crystalline silicon 430 is made of polycrystalline silicon or single crystalline silicon and has a pyramid structure PYM at a surface on the opposite side to the hetero-substrate 410. The crystalline silicon 430 includes p type crystalline silicon 431 and $n^+$ type crystalline silicon 432.

The p type crystalline silicon 431 has a thickness from 100 µm to 200 µm. The carrier density of the p type crystalline silicon 431 is from $10^{16}$ cm$^{-3}$ to $10^{17}$ cm$^{-3}$.

The $n^+$ type crystalline silicon 432 is formed on the side of the pyramid structure PYM and has a thickness from 0.1 µm to 0.2 µm. The carrier density of the $n^+$ type crystalline silicon 432 is not less than $10^{19}$ cm$^{-3}$.

The pyramid structure PYM is about as large as 1 µm and has an approximately quadrangular pyramid shape.

In this way, the solar cell 400 has a p-n junction in the direction perpendicular to the hetero-substrate 410 and the pyramid structure PYM on the surface.

As a result, the solar cell 400 can reduce reflection at the surface and introduce light inside while it can confine the introduced light inside. Electrons-holes generated in and near the p-n junction are isolated in the thickness-wise direction of the crystalline silicon 430 by an electric field in a depletion layer, and the electrons move to the side of the $n^+$ type crystalline silicon 432 and the holes move to the side of the back electrode 420.

Electrons and holes generated in the p type crystalline silicon 431 apart from the p-n junction move to the side of the $n^+$ type crystalline silicon 432 and the side of the back electrode 420, respectively by diffusion.

The electrons moved to the side of the $n^+$ type crystalline silicon 432 are restrained from recombining at an interface between the $n^+$ type crystalline silicon 432 and the oxide film 440 and move within the $n^+$ type crystalline silicon 432 to reach the surface electrode 450. The holes reach the back electrode 420. In this way, the electrons and holes contribute to power generation.

FIGS. 34 to 37 are first to fourth process charts for illustrating a method of manufacturing the solar cell 400 shown in FIGS. 32 and 33.

Figure 34:
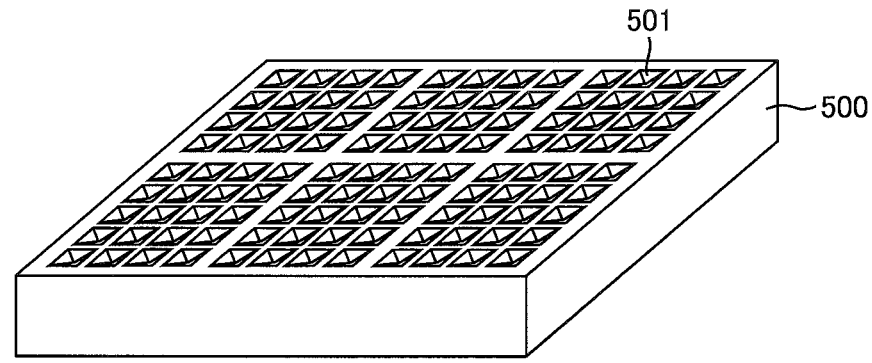
FIG. 34 is a first process chart for illustrating a method of manufacturing the solar cell shown in FIGS. 32 and 33.
Figure 34:
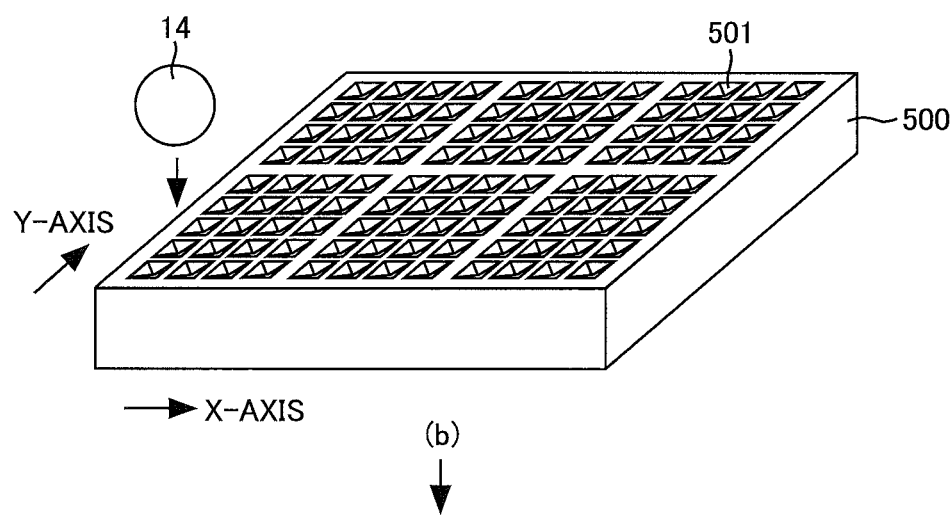
Figure 34:
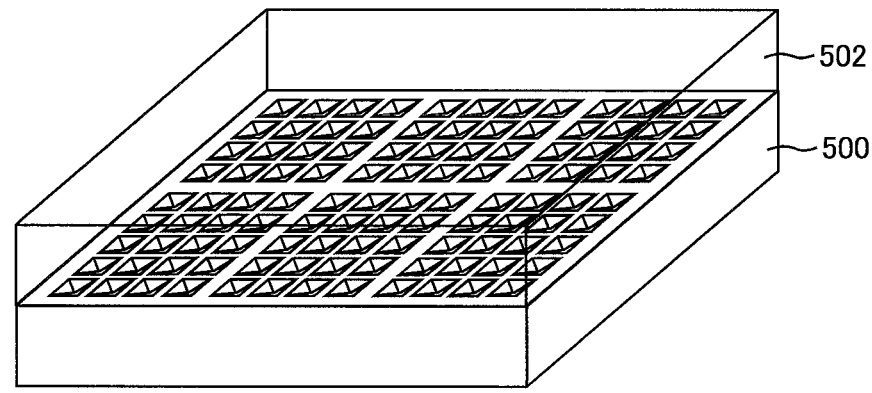

Referring to FIG. 34, when the production of the solar cell 400 starts, a single crystalline silicon substrate 500 having the (100) orientation or the (110) orientation is subjected to RCA cleaning, then the surface of the single crystalline silicon substrate 500 is anisotropically etched and a plurality of recesses 501 arranged in a matrix are formed on the surface of the single crystalline silicon substrate 500. In this case, the plurality of recesses 501 each have a pyramid structure PYM that projects in the thickness-wise direction of the single crystalline silicon substrate 500.

Then, the single crystalline silicon substrate 500 is immersed in about 0.1% dilute hydrofluoric acid, followed by cleaning with pure water for 10 minutes. In this way, the surface of the single crystalline silicon substrate 500 is terminated with hydrogen (see step (a) in FIG. 34).

Thereafter, the single crystalline silicon substrate 500 is placed at the XY stage 12 of the crystal manufacturing apparatus 10, and droplets 14 are discharged onto the entire surface of the single crystalline silicon substrate 500 at an initial speed $v_0$ while the XY stage 12 is moved in the X- and Y-directions (see step (b) in FIG. 34). In this case, the droplets 14 are made of a p type silicon melt.

As a result, crystalline silicon 502 of the p type silicon is formed on the single crystalline silicon substrate 500 (see step (c) in FIG. 34).

Figure 35:
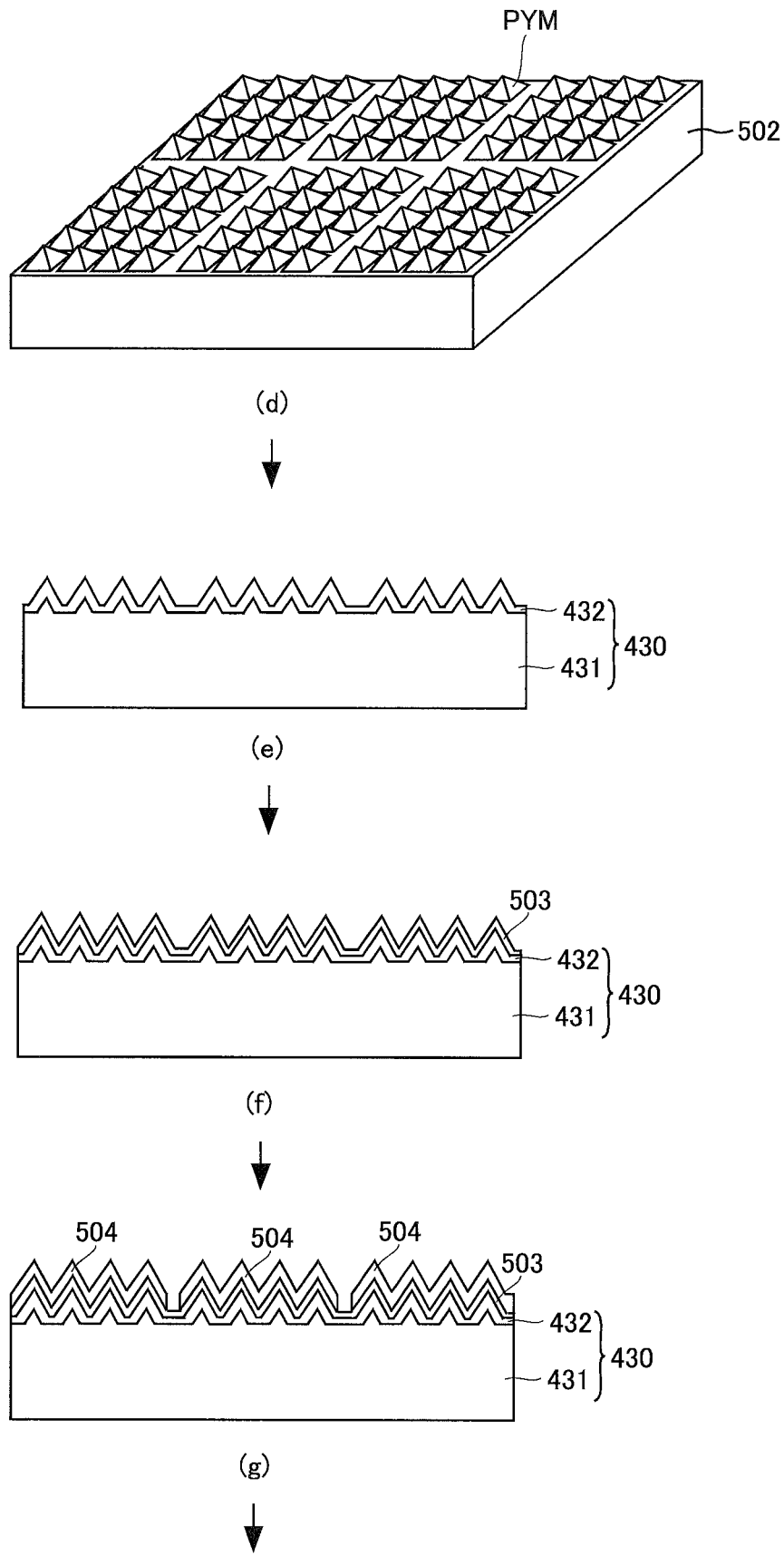
FIG. 35 is a second process chart for illustrating the method of manufacturing the solar cell in FIGS. 32 and 33.

Referring to FIG. 35, when the crystalline silicon 502 is removed from the single crystalline silicon substrate 500 after step (c), crystalline silicon 502 having a pyramid structure PYM on the surface is obtained (see step (d) in FIG. 35).

Then, P atoms are implanted into the crystalline silicon 502 by ion-implantation from the side of the surface having the pyramid structures PYM thereon. In this way, crystalline silicon 430 including the p type crystalline silicon 431 and $n^+$ type crystalline silicon 432 is formed (see step (e) in FIG. 35).

Then, the surface of the crystalline silicon 430 on the side of the $n^+$ type crystalline silicon 432 is entirely oxidized in an oxygen atmosphere and an oxide film 503 is formed (see step (f) in FIG. 35).

Subsequently, resist is coated on the entire surface of the sample, the coated resist is patterned into a resist pattern 504 by photolithography (see step (g) in FIG. 35).

Figure 36:
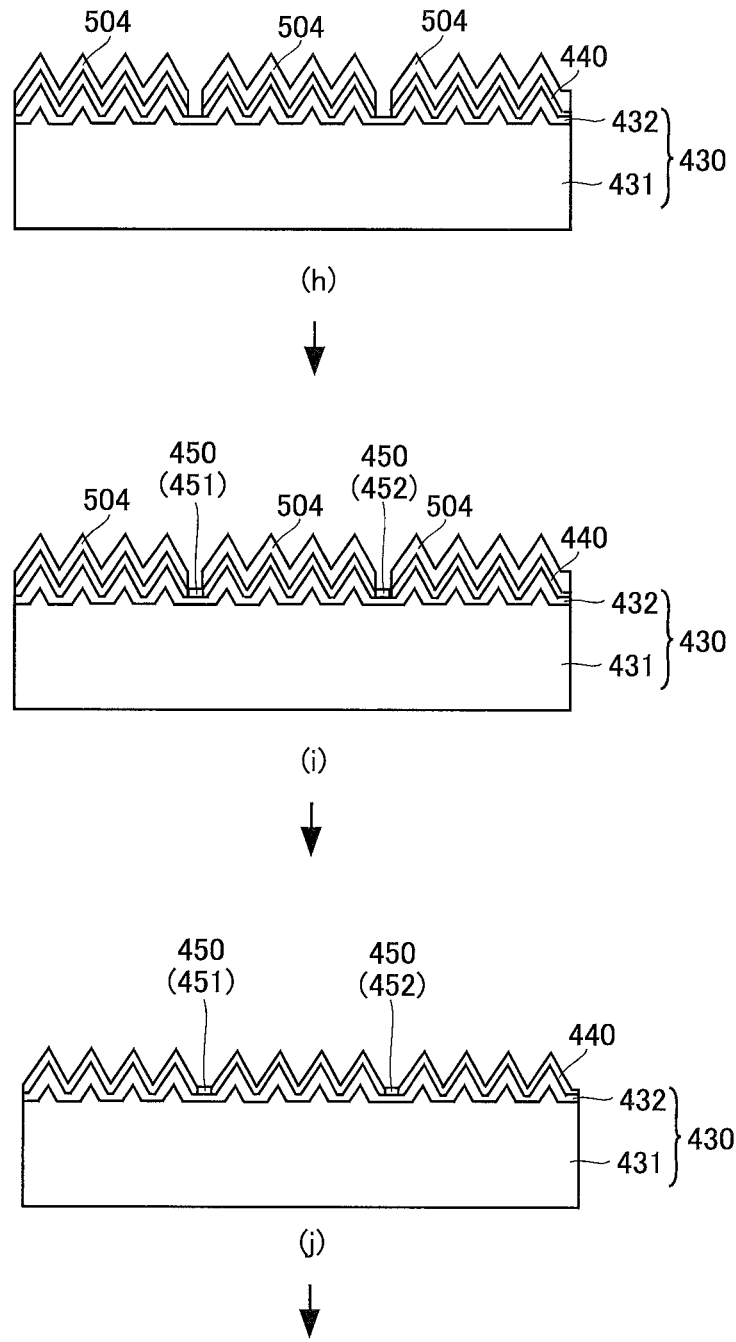
FIG. 36 is a third process chart for illustrating the method of manufacturing the solar cell in FIGS. 32 and 33.

Referring to FIG. 36, after step (g), using the resist pattern 504 as a mask, the oxide film 503 is etched. In this way, an oxide film 440 is formed (see step (h) in FIG. 36).

Thereafter, using the resist pattern 504 as a mask, Al is vapor-deposited (see step (i) in FIG. 36) and the resist pattern 504 is removed. As a result, a surface electrode 450 is formed (see step (j) in FIG. 36).

Figure 37:
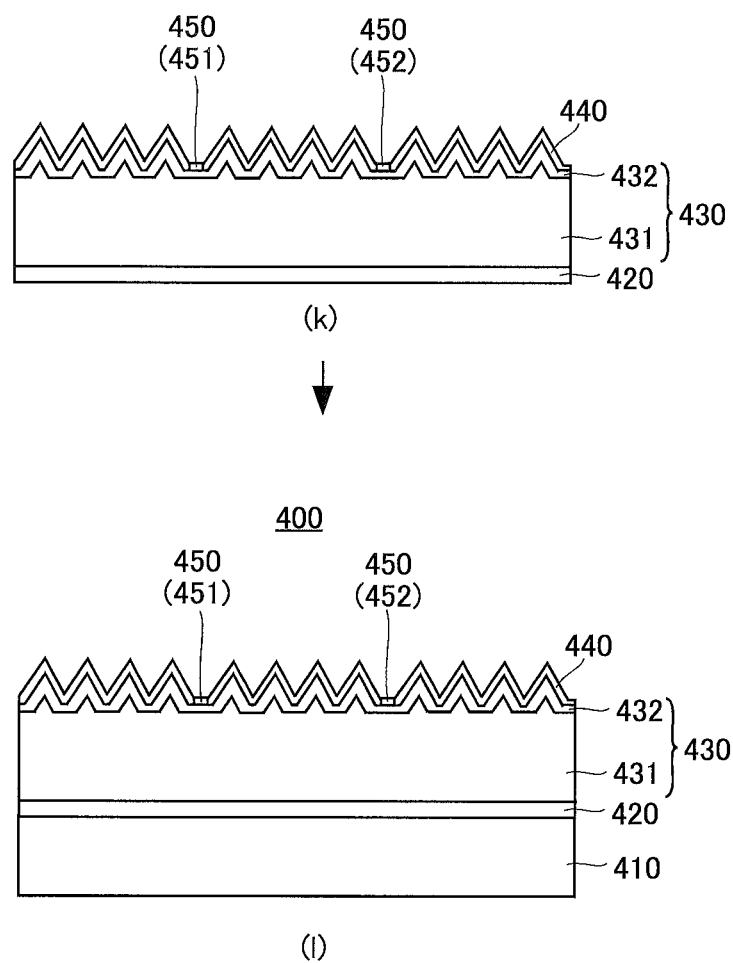
FIG. 37 is a fourth process chart for illustrating the method of manufacturing the solar cell in FIGS. 32 and 33.

Referring to FIG. 37, after step (j), Ag is vapor-deposited at the back surface of the crystalline silicon 430 to form a back electrode 420 (see step (k) in FIG. 37).

The sample is then adhered to the hetero-substrate 410 by an adhesive. In this way, the solar cell 400 is completed (see step (l) in FIG. 37). In this case, a thermosetting type silicone adhesive (available for example from Dow Corning Corporation) and conductive paste (such as sliver paste and copper paste) are used as an adhesive.

When a silicone adhesive is used as the adhesive, the silicone adhesive is coated on the entire surface of the hetero-substrate 410 and the sample is placed on the coated silicone adhesive and heated. In this way, the silicone adhesive is hardened and the sample is adhered to the hetero-substrate 410.

When a conductive paste is used as the adhesive, the conductive paste is printed on the hetero-substrate 410, the sample is adhered to the coated conductive paste, and the conductive paste is dried. In this way, the sample is adhered to the hetero-substrate 410.

The sample may be adhered to the hetero-substrate 410 by transfer using a bonding film (such as HIATTACH available from Hitachi Chemicals Co., Ltd.) or by transfer onto a flexible substrate by heat burning at about 150° C. (using for example REXALPHA available from TOYO INK MFG. CO., LTD).

As described above, using the crystal manufacturing apparatus 10, crystalline silicon 502 having a pyramid structure PYM on the surface can readily be produced.

When a solar cell 400 is manufactured according to steps (a) to (l) shown in FIGS. 34 to 37, a single crystalline silicon substrate 500 once produced can be used a number of times to produce crystalline silicon 502, and therefore anisotropic etching to form a pyramid structure PYM is not necessary every time a solar cell 400 is manufactured.

Furthermore, when a solar cell 400 is manufactured according to steps (a) to (l) shown in FIGS. 34 to 37, a silicon block does not have to be sliced, and therefore the material can be saved. This can lower the cost of solar cells.

Note that in the foregoing description, the back electrode 420 is formed after the crystalline silicon 502 is removed from the single crystalline silicon substrate 500. However, the embodiment is not limited to this arrangement, the back electrode 420 may be formed after step (c) shown in FIG. 34, and then the crystalline silicon 502 may be removed from the single crystalline silicon substrate 500. In other words, step (k) shown in FIG. 37 may be inserted between step (c) shown in FIG. 34 and step (d) shown in FIG. 35.

In the foregoing description, the crystalline silicon 430 includes the p type crystalline silicon 431 and the $n^+$ type crystalline silicon 432, but the embodiment is not limited to this arrangement and the crystalline silicon 430 may include n type crystalline silicon having a thickness from 100 µm to 200 µm and $p^+$ type crystalline silicon having a thickness from 0.1 µm to 0.2 µm.

In this case, droplets 14 of n type silicon are discharged onto the single crystalline silicon substrate 500 at an initial speed $v_0$ in step (b) in FIG. 34 and B is implanted into the crystalline silicon 430 by ion-implantation in step (e) shown in FIG. 35.

Figure 38:
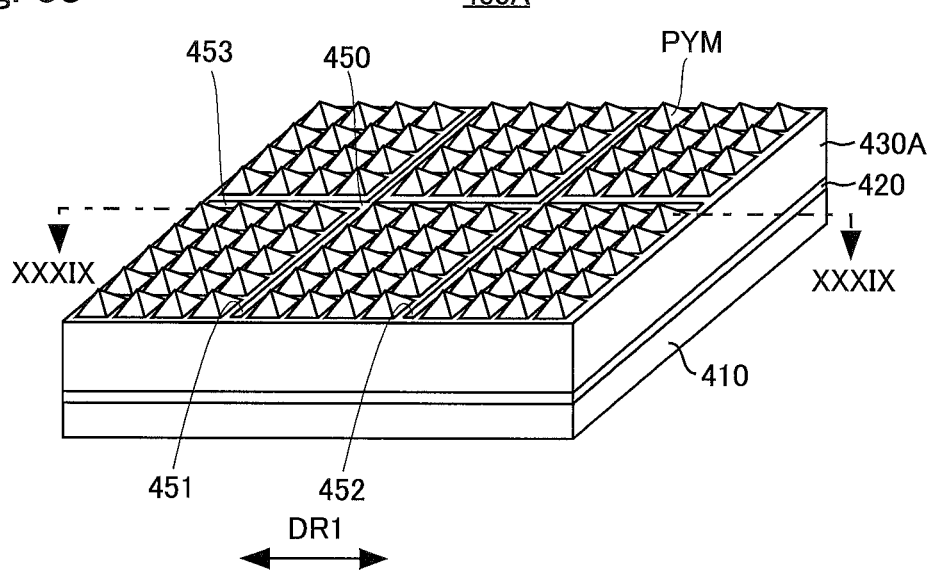
FIG. 38 is a perspective view of another solar cell according to an embodiment of the invention.
Figure 39:
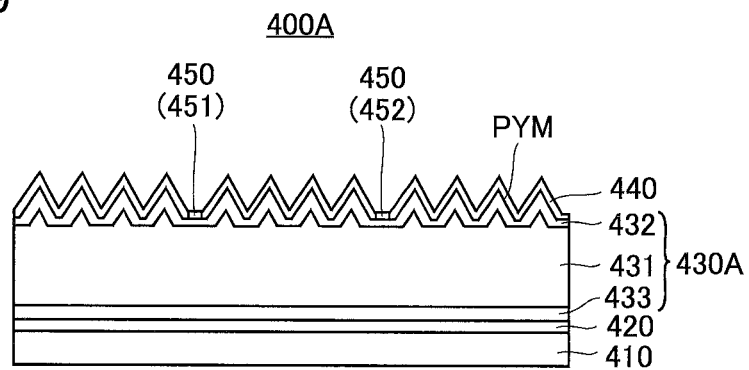
FIG. 39 is a sectional view of the solar cell taken along line XXXIX-XXXIX shown in FIG. 38.

FIG. 38 is a perspective view of another solar cell according to an embodiment of the present invention. FIG. 39 is a sectional view of the solar cell taken along line XXXIX-XXXIX in FIG. 38.

Referring to FIGS. 38 and 39, the solar cell 400A has crystalline silicon 430A in place of the crystalline silicon 430 of the solar cell 400 shown in FIGS. 32 and 33 and the other arrangement is the same as that of the solar cell 400.

The crystalline silicon 430A is obtained by adding $p^+$ type crystalline silicon to the crystalline silicon 430 shown in FIG. 33 and the other arrangement is the same as that of the crystalline silicon 430.

The $p^+$ type crystalline silicon 430A is made of polycrystalline silicon or single crystalline silicon and formed in contact with and between the p type crystalline silicon 431 and the back electrode 420. The $p^+$ type crystalline silicon 433 has a carrier density of $10^{19}$ cm$^{-3}$ or more and a thickness from 0.1 µm to 0.2 µm.

In the solar cell 400A, the crystalline silicon 430A has the $p^+$ type crystalline silicon 433 on the side of the back electrode 420, and therefore electrons diffused to the side of the back electrode 420 are restrained from recombining at the back electrode 420. The crystalline silicon 430A has $n^+$ type crystalline silicon 432 on the side of the surface electrode 450, and therefore holes diffused to the side of the surface electrode 450 are restrained from recombining at the surface electrode 450. As a result, the number of electrons and holes that contribute to power generation can be increased, so that the conversion efficiency of the solar cell 400A can be improved.

The solar cell 400A is manufactured by adding a step of implanting B into the crystalline silicon 430 by ion-implantation between steps (e) and (f) in steps (a) to (l) shown in FIGS. 34 to 37.

When the solar cell 400A is manufactured, B may be implanted in the crystalline silicon 502 by ion-implantation after step (c) in FIG. 34, and then the crystalline silicon 502 may be removed from the single crystalline silicon substrate 500.

Figure 40:
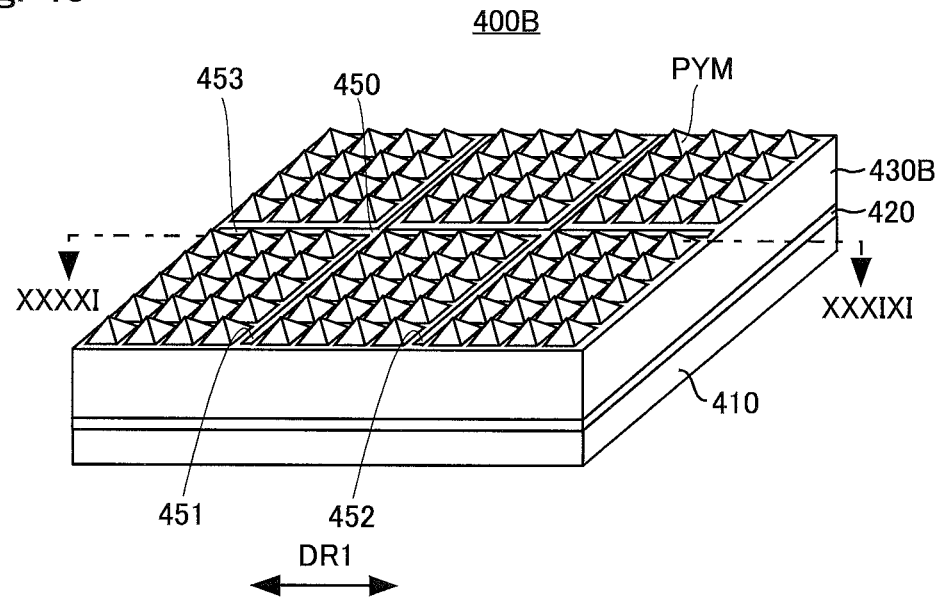
FIG. 40 is a perspective view of yet another solar cell according to an embodiment of the present invention.
Figure 41:
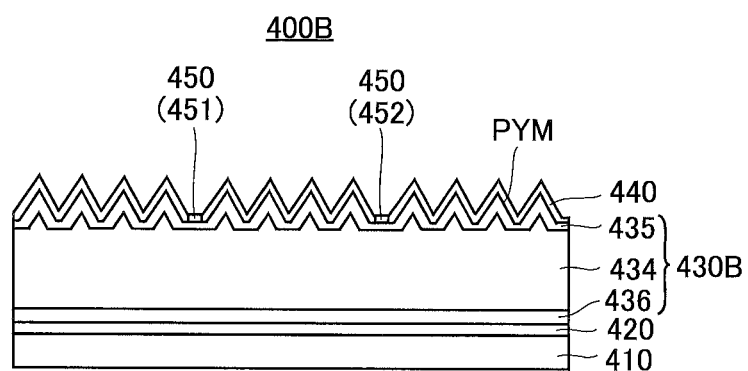
FIG. 41 is a sectional view of the solar cell taken along line XXXXI-XXXXI shown in FIG. 40.

FIG. 40 is a perspective view of another solar cell according to an embodiment of the present invention. FIG. 41 is a sectional view of the solar cell taken along line XXXXI-XXXXI in FIG. 40.

Referring to FIGS. 40 and 41, the solar cell 400B has crystalline silicon 430B in place of the crystalline silicon 430 of the solar cell 400 shown in FIGS. 32 and 33, and the other arrangement is the same as that of the solar cell 400.

The crystalline silicon 430B is made of polycrystalline silicon or single crystalline silicon. The crystalline silicon 430B is formed in contact with and between the back electrode 420 and the oxide film 440 and the surface electrode 450.

The crystalline silicon 430B includes n type crystalline silicon 434, $p^+$ type crystalline silicon 435, and $n^+$ type crystalline silicon 436.

The n type crystalline silicon 434 has a thickness from 100 μm to 200 μm and a carrier density from $10^{16}$ cm$^{-3}$ to $10^{17}$ cm$^{-3}$.

The $p^+$ type crystalline silicon 435 has a thickness from 0.1 μm to 0.2 μm and a carrier density of $10^{19}$ cm$^{-3}$ or more.

The $n^+$ type crystalline silicon 436 has a thickness from 0.1 μm to 0.1 μm and a carrier density of $10^{19}$ cm$^{-3}$ or more.

Similarly to the solar cell 400A, the $p^+$ type crystalline silicon 435 restrains electrons from recombining, and the $n^+$ type crystalline silicon 436 restrains electrons from recombining.

Therefore, the conversion efficiency of the solar cell 400B can be improved.

The solar cell 400B is manufactured by the same method as the method of manufacturing the solar cell 400A.

In the foregoing description, the TFT 200 includes the crystalline silicon 220 of single crystalline silicon but the embodiment is not limited to this arrangement and the TFT 200 may include crystalline germanium made of single crystalline germanium or crystalline silicon germanium made of single crystalline silicon germanium. In this case, the crystalline germanium is produced by the crystal manufacturing apparatus 10 using a single crystalline germanium substrate having a prescribed orientation as the substrate 11. The oxide film 230 is made of $GeO_2$.

The solar cells 400, 400A, and 400B may include crystalline germanium or crystalline silicon germanium in place of the crystalline silicon 430, 430A and 430B. In this case, the crystalline germanium is made of polycrystalline germanium or single crystalline germanium. The crystalline germanium is manufactured by the crystal manufacturing apparatus 10 using a single crystalline germanium substrate having a plurality of recesses 501 (see FIG. 34) on its surface as the substrate 11. The oxide film 440 is made of $GeO_2$. The crystalline silicon germanium is made of polycrystalline silicon germanium or single crystalline silicon germanium. The crystalline silicon germanium is produced by the crystal manufacturing apparatus 10 using a single crystalline silicon substrate or a single crystalline germanium substrate having a plurality of recesses 501 (see FIG. 34) on its surface as the substrate 11. The oxide film 440 is made of $SiO_2$ or $GeO_2$.

Furthermore, according to the embodiment, the TFT 200 and the solar cells 400, 400A, and 400B may be manufactured using any of the crystal manufacturing apparatuses 10A, 10B, and 10C.

When a semiconductor device is manufactured using the crystal manufacturing apparatus 10, the step of producing a semiconductor layer by patterning photoresist using photolithography as described above may be replaced by producing a semiconductor layer by discharging a droplet 14, and therefore the method of manufacturing the semiconductor device needs only include the step of manufacturing a semiconductor layer that can be produced by patterning by discharging a droplet 14 toward the substrate.

Using the crystal manufacturing apparatus 10, semiconductor devices other than the above-described TFTs and solar cells can readily be manufactured. For example, a storage memory including quantum dots can readily be manufactured. A three-dimensional LSI (Large Scale Integrated circuit) can readily be manufactured.

Note that in the foregoing description, the TFTs and the solar cells are manufactured using the crystal manufacturing apparatus 10, but the embodiment is not limited to this arrangement and semiconductor devices such as TFTs and solar cells may be manufactured using the crystal manufacturing apparatuses 10A, 10B, and 10C.

In particular, the crystal manufacturing apparatus 10C can produce n crystalline semiconductor layers arranged in a line by discharging droplets at a time, so that TFTs arranged in a matrix can readily be manufactured by moving the substrate 11 to the direction orthogonal to the arranging direction of the n crystalline semiconductor layers. Therefore, the crystal manufacturing apparatus 10C is suitable for manufacturing TFTs arranged in a matrix.

Furthermore, the silicon melt 13 may be a silicon melt including a n type dopant or a p type dopant. In this case, n type polysilicon films 51 and 52 and p type polysilicon films 54 and 55 can be produced by discharging droplets 14 only once without carrying out ion implantation, and therefore TFTs can be manufactured by the number of steps even more reduced from steps (a) to (g) shown in FIGS. 19 and 20.

Furthermore, the cylinders 7 and 70 may hold a silicon germanium melt or a germanium melt in place of the silicon melt 13.

Furthermore, in the crystal manufacturing apparatuses 10, 10A, 10B, and 10C, droplets 14 (or 141) may be discharged using an elastic wave or an electric field instead of the above-described electromagnetic induction method. According to this method of discharging droplets 14 (or 141) using an elastic wave, an elastic wave is applied to the silicon melt 13 by a transducer, and the applied elastic wave causes the silicon melt 13 to vibrate so that droplets 14 (or 141) are discharged from small holes 71 (701 to 70n). According to the method using an electric field to discharge droplets 14 (or 141), voltage is applied across the region between an electrode and the silicon melt 13, so that droplets 14 (or 141) are discharged by electrostatic induction.

According to the embodiment, the cylinders 7 and 70 each form a "melt holder."

The small holes 71 (701 to 70n) each form a "discharge outlet" and the small holes 701 to 70n form "a plurality of micropores."

Furthermore, the spring 2, the magnetic body 3, the coil 4, and the power supply circuit 5 form a "discharge unit."

Furthermore, the XY stage 12 forms a "moving unit."

Furthermore, the n type polysilicon films 51 and 52 form a "first semiconductor region" and a "second semiconductor region," respectively, while the p type polysilicon films 54 and 55 form a "first semiconductor region" and a "second semiconductor region," respectively.

Crystalline silicon pieces 220, 430, 430A, and 430B each form a "semiconductor layer" and the gate electrode 240 forms an "electrode."

The source region 221 forms a "first region" and the drain region forms a "second region."

The back electrode 420 forms a "first electrode" and the surface electrode 450 forms a "second electrode."

It should be understood that the above-described embodiments are in every aspect by way of illustration and example only and are not to be taken by way of limitation. The scope of the present invention is limited only by the appended claims rather than the above description of the embodiments, and all modifications and variations that fall within the scope of claims and equivalence thereof are intended to be embraced by the claims.

The present invention is applied to a crystal manufacturing apparatus used to manufacture crystal using a melt including a constituent element of semiconductor and a method of manufacturing a semiconductor device using the same.

The invention claimed is:

1. A method of manufacturing a semiconductor device, comprising:
    a first step of producing an underlying layer comprising one of a semiconductor layer formed on a substrate including one of a hetero-substrate of a material different from semiconductor and a semiconductor substrate, an insulating layer formed on said substrate, and a semiconductor layer/an insulating layer formed on said substrate;
    a second step of producing a crystalline semiconductor layer by discharging a droplet of a constituent element of the semiconductor to a desired position on said substrate at a desired initial speed; and
    a third step of manufacturing a semiconductor device using at least one of said produced crystalline semiconductor layer and said underlying layer, wherein
    the first step comprises:
        a first sub step of producing an amorphous layer on said substrate; and
        a second sub step of producing an insulating layer on said amorphous layer, wherein
    in said second step, said crystalline semiconductor layer is produced by discharging said droplet on said insulating layer, thereby crystallizing said amorphous layer; and
    wherein the second step includes discharging the droplet by moving up and down a piston contacting with a melt comprising the constituent element of the semiconductor.

2. The method of manufacturing a semiconductor device according to claim 1, wherein said second step comprises:
    a first sub step of producing a first crystal grain by discharging said droplet on said underlying layer comprising a holding substrate and a delamination layer formed on said holding substrate;
    a second sub step of producing a second crystal grain by discharging said droplet on said underlying layer so that said droplet is in contact with the already produced crystal grain in an in-plane direction of said holding substrate; and
    a third sub step of repeatedly carrying out said second sub step until said crystalline semiconductor layer having a desired area is produced on said underlying layer.

* * * * *